US009619071B2

(12) United States Patent
Perek et al.

(10) Patent No.: US 9,619,071 B2
(45) Date of Patent: Apr. 11, 2017

(54) COMPUTING DEVICE AND AN APPARATUS HAVING SENSORS CONFIGURED FOR MEASURING SPATIAL INFORMATION INDICATIVE OF A POSITION OF THE COMPUTING DEVICES

(71) Applicant: Microsoft Technology Licensing, LLC, Redmond, WA (US)

(72) Inventors: David R. Perek, Redmond, WA (US); Michael A. Schwager, Seattle, WA (US); Sharon Drasnin, Seattle, WA (US); Mark J. Seilstad, Sammamish, CO (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 390 days.

(21) Appl. No.: 14/482,983

(22) Filed: Sep. 10, 2014

(65) Prior Publication Data

US 2014/0379942 A1    Dec. 25, 2014

Related U.S. Application Data

(63) Continuation of application No. 14/018,286, filed on Sep. 4, 2013, now Pat. No. 8,903,517, which is a
(Continued)

(51) Int. Cl.
*G06F 13/10* (2006.01)
*G06F 9/54* (2006.01)
(Continued)

(52) U.S. Cl.
CPC ........ *G06F 3/0414* (2013.01); *E05D 11/1064* (2013.01); *E05F 5/08* (2013.01);
(Continued)

(58) Field of Classification Search
CPC ...... G06F 3/0414; G06F 1/1616; G06F 1/166; G06F 1/1637; G06F 1/1686;
(Continued)

(56) References Cited

U.S. PATENT DOCUMENTS 578,325 A    3/1897 Fleming
3,600,528 A    8/1971 Leposavic
(Continued)

FOREIGN PATENT DOCUMENTS

CA    990023    6/1976
CN    2363007    2/2000
(Continued)

OTHER PUBLICATIONS

"Accessing Device Sensors", retrieved from <https://developer.palm.com/content/api/dev-guide/pdk/accessing-device-sensors.html> on May 25, 2012, 2011, 4 pages.
(Continued)

*Primary Examiner* — Ramesh Patel

(57) ABSTRACT

Sensor fusion algorithm techniques are described. In one or more embodiments, behaviors of a host device and accessory devices are controlled based upon an orientation of the host device and accessory devices, relative to one another. A combined spatial position and/or orientation for the host device may be obtained based on raw measurements that are obtained from at least two different types of sensors. In addition, a spatial position and/or orientation for an accessory device is ascertained using one or more sensors of the accessory device. An orientation (or position) of the accessory device relative to the host computing device may then be computed based on the combined spatial position/orientation for the host computing device and the ascertained spatial position/orientation for the accessory device. The relative orientation that is computed may then be used in
(Continued)

various ways to control behaviors of the host computing device and/or accessory device.

20 Claims, 10 Drawing Sheets

Related U.S. Application Data continuation of application No. 13/651,272, filed on Oct. 12, 2012, now Pat. No. 8,543,227, which is a continuation of application No. 13/471,202, filed on May 14, 2012, now Pat. No. 8,548,608.

(60) Provisional application No. 61/606,301, filed on Mar. 2, 2012, provisional application No. 61/606,313, filed on Mar. 2, 2012, provisional application No. 61/606,333, filed on Mar. 2, 2012, provisional application No. 61/613,745, filed on Mar. 21, 2012, provisional application No. 61/606,336, filed on Mar. 2, 2012, provisional application No. 61/607,451, filed on Mar. 6, 2012, provisional application No. 61/606,321, filed on Mar. 2, 2012.

(51) Int. Cl.

| | |
|---|---|
| *G06F 11/30* | (2006.01) |
| *G06F 3/041* | (2006.01) |
| *H01H 13/79* | (2006.01) |
| *H01H 13/78* | (2006.01) |
| *H01H 13/785* | (2006.01) |
| *G06F 3/02* | (2006.01) |
| *H05K 5/02* | (2006.01) |
| *G06F 1/16* | (2006.01) |
| *H04M 1/02* | (2006.01) |
| *H04M 1/725* | (2006.01) |
| *G05B 11/01* | (2006.01) |
| *H01H 13/704* | (2006.01) |
| *G06F 3/00* | (2006.01) |
| *G06F 3/01* | (2006.01) |
| *H01H 13/702* | (2006.01) |
| *H01H 13/14* | (2006.01) |
| *H01H 13/703* | (2006.01) |
| *G06F 3/023* | (2006.01) |
| *G06F 3/0488* | (2013.01) |
| *G06F 3/0487* | (2013.01) |
| *E05D 11/10* | (2006.01) |
| *E05F 5/08* | (2006.01) |
| *F16M 11/38* | (2006.01) |

(52) U.S. Cl.
CPC ............ *F16M 11/38* (2013.01); *G05B 11/01* (2013.01); *G06F 1/166* (2013.01); *G06F 1/1616* (2013.01); *G06F 1/1618* (2013.01); *G06F 1/1637* (2013.01); *G06F 1/1654* (2013.01); *G06F 1/1656* (2013.01); *G06F 1/1662* (2013.01); *G06F 1/1669* (2013.01); *G06F 1/1681* (2013.01); *G06F 1/1683* (2013.01); *G06F 1/1686* (2013.01); *G06F 3/002* (2013.01); *G06F 3/01* (2013.01); *G06F 3/0202* (2013.01); *G06F 3/023* (2013.01); *G06F 3/0416* (2013.01); *G06F 3/0487* (2013.01); *G06F 3/0488* (2013.01); *G06F 9/541* (2013.01); *G06F 11/3089* (2013.01); *H01H 13/14* (2013.01); *H01H 13/702* (2013.01); *H01H 13/703* (2013.01); *H01H 13/704* (2013.01); *H01H 13/78* (2013.01); *H01H 13/785* (2013.01); *H01H 13/79* (2013.01); *H04M 1/0216* (2013.01); *H04M 1/0254* (2013.01); *H04M 1/72527* (2013.01); *H05K 5/0226* (2013.01); *H05K 5/0234* (2013.01); *H01H 2201/036* (2013.01); *H01H 2203/02* (2013.01); *H01H 2205/006* (2013.01); *H01H 2211/004* (2013.01); *H01H 2211/006* (2013.01); *H01H 2217/01* (2013.01); *H04M 1/0245* (2013.01); *Y10T 16/5401* (2015.01); *Y10T 16/551* (2015.01); *Y10T 29/49826* (2015.01)

(58) Field of Classification Search
CPC ...... G06F 3/0487; G06F 3/0488; G06F 3/023; G06F 1/1662; G06F 9/541; G06F 11/3089; G06F 3/01; G06F 3/002; G06F 3/0416; G06F 1/1683; G06F 1/1654; G06F 1/1681; G06F 1/1669; G06F 1/1618; G06F 3/0202; F16M 11/38; E05D 11/1064; E05F 5/08; H01H 13/79; H01H 13/78; H01H 13/785; H01H 13/14; H01H 13/703; H01H 13/702; H01H 13/704; H01H 2217/01; H01H 2203/02; H01H 2211/004; H01H 2211/006; H01H 2201/036; H01H 2205/006; G05B 11/01; H04M 1/0216; H04M 1/72527; H04M 1/0254; H04M 1/0245; H05K 5/0226; Y10T 16/5401; Y10T 16/551; Y10T 29/49826

See application file for complete search history.

(56) References Cited

U.S. PATENT DOCUMENTS

| | | |
|---|---|---|
| 3,777,082 A | 12/1973 | Hatley |
| 3,879,586 A | 4/1975 | DuRocher et al. |
| 3,968,336 A | 7/1976 | Johnson |
| 4,046,975 A | 9/1977 | Seeger, Jr. |
| 4,065,649 A | 12/1977 | Carter et al. |
| 4,086,451 A | 4/1978 | Boulanger |
| 4,239,338 A | 12/1980 | Borrelli et al. |
| 4,243,861 A | 1/1981 | Strandwitz |
| 4,261,042 A | 4/1981 | Ishiwatari et al. |
| 4,279,021 A | 7/1981 | See et al. |
| 4,302,648 A | 11/1981 | Sado et al. |
| 4,317,011 A | 2/1982 | Mazurk |
| 4,317,013 A | 2/1982 | Larson |
| 4,323,740 A | 4/1982 | Balash |
| 4,326,193 A | 4/1982 | Markley et al. |
| 4,365,130 A | 12/1982 | Christensen |
| 4,375,018 A | 2/1983 | Petersen |
| 4,451,113 A | 5/1984 | Zuniga |
| 4,492,829 A | 1/1985 | Rodrique |
| 4,503,294 A | 3/1985 | Matsumaru |
| 4,527,021 A | 7/1985 | Morikawa et al. |
| 4,559,426 A | 12/1985 | Van Zeeland et al. |
| 4,576,436 A | 3/1986 | Daniel |
| 4,577,822 A | 3/1986 | Wilkerson |
| 4,588,187 A | 5/1986 | Dell |
| 4,607,147 A | 8/1986 | Ono et al. |
| 4,615,579 A | 10/1986 | Whitehead |
| 4,651,133 A | 3/1987 | Ganesan et al. |
| 4,652,704 A | 3/1987 | Franklin |
| 4,724,605 A | 2/1988 | Fiorella |
| 4,735,394 A | 4/1988 | Facco |
| 4,735,495 A | 4/1988 | Henkes |
| 4,795,977 A | 1/1989 | Frost et al. |
| 4,801,771 A | 1/1989 | Mizuguchi et al. |
| 4,824,268 A | 4/1989 | Diernisse |
| 4,864,084 A | 9/1989 | Cardinale |
| 4,983,787 A | 1/1991 | Kunikane |
| 4,990,900 A | 2/1991 | Kikuchi |
| 4,996,511 A | 2/1991 | Ohkawa et al. |
| 5,008,497 A | 4/1991 | Asher |

(56) References Cited

U.S. PATENT DOCUMENTS

| | | | |
|---|---|---|---|
| 5,021,638 A | 6/1991 | Nopper et al. | |
| 5,053,585 A | 10/1991 | Yaniger | |
| 5,107,401 A | 4/1992 | Youn | |
| 5,111,223 A | 5/1992 | Omura | |
| 5,128,829 A * | 7/1992 | Loew | G06F 1/1626 16/225 |
| 5,138,119 A | 8/1992 | Demeo | |
| 5,218,177 A | 6/1993 | Coleman et al. | |
| 5,220,318 A | 6/1993 | Staley | |
| 5,220,521 A | 6/1993 | Kikinis | |
| 5,235,495 A | 8/1993 | Blair et al. | |
| 5,249,978 A | 10/1993 | Gazda et al. | |
| 5,253,362 A | 10/1993 | Nolan et al. | |
| 5,283,559 A | 2/1994 | Kalendra et al. | |
| 5,319,455 A | 6/1994 | Hoarty et al. | |
| 5,331,443 A | 7/1994 | Stanisci | |
| 5,339,382 A | 8/1994 | Whitehead | |
| 5,340,528 A | 8/1994 | Machida et al. | |
| 5,349,403 A | 9/1994 | Lo | |
| 5,363,075 A | 11/1994 | Fanucchi | |
| 5,375,076 A | 12/1994 | Goodrich et al. | |
| 5,404,133 A | 4/1995 | Moriike et al. | |
| 5,406,415 A | 4/1995 | Kelly | |
| 5,480,118 A | 1/1996 | Cross | |
| 5,491,313 A | 2/1996 | Bartley et al. | |
| 5,510,783 A | 4/1996 | Findlater et al. | |
| 5,546,271 A | 8/1996 | Gut et al. | |
| 5,548,477 A | 8/1996 | Kumar et al. | |
| 5,558,577 A | 9/1996 | Kato | |
| 5,576,981 A | 11/1996 | Parker et al. | |
| 5,581,682 A | 12/1996 | Anderson et al. | |
| 5,584,713 A | 12/1996 | Kato et al. | |
| 5,596,700 A | 1/1997 | Darnell et al. | |
| 5,617,343 A | 4/1997 | Danielson et al. | |
| 5,618,232 A | 4/1997 | Martin | |
| 5,621,494 A | 4/1997 | Kazumi et al. | |
| 5,661,279 A | 8/1997 | Kenmochi | |
| 5,666,112 A | 9/1997 | Crowley et al. | |
| 5,681,220 A | 10/1997 | Bertram et al. | |
| 5,737,183 A | 4/1998 | Kobayashi et al. | |
| 5,745,376 A | 4/1998 | Barker et al. | |
| 5,748,114 A | 5/1998 | Koehn | |
| 5,781,406 A | 7/1998 | Hunte | |
| 5,803,748 A | 9/1998 | Maddrell et al. | |
| 5,806,955 A | 9/1998 | Parkyn, Jr. et al. | |
| 5,807,175 A | 9/1998 | Davis et al. | |
| 5,808,713 A | 9/1998 | Broer et al. | |
| 5,818,361 A | 10/1998 | Acevedo | |
| 5,825,982 A * | 10/1998 | Wright | A61B 1/00039 600/112 |
| 5,828,770 A | 10/1998 | Leis et al. | |
| 5,838,403 A | 11/1998 | Jannson et al. | |
| 5,842,027 A | 11/1998 | Oprescu et al. | |
| 5,850,135 A | 12/1998 | Kuki et al. | |
| 5,861,990 A | 1/1999 | Tedesco | |
| 5,874,697 A | 2/1999 | Selker et al. | |
| 5,886,675 A | 3/1999 | Aye et al. | |
| 5,905,485 A | 5/1999 | Podoloff | |
| 5,920,317 A | 7/1999 | McDonald | |
| 5,921,652 A | 7/1999 | Parker et al. | |
| 5,924,555 A | 7/1999 | Sadamori et al. | |
| 5,926,170 A * | 7/1999 | Oba | G06F 3/0219 341/20 |
| 5,929,946 A | 7/1999 | Sharp et al. | |
| 5,948,990 A | 9/1999 | Hashida | |
| 5,957,191 A | 9/1999 | Okada et al. | |
| 5,967,637 A | 10/1999 | Ishikawa et al. | |
| 5,971,635 A | 10/1999 | Wise | |
| 5,995,026 A | 11/1999 | Sellers | |
| 5,995,081 A | 11/1999 | Kato | |
| 5,999,147 A | 12/1999 | Teitel | |
| 6,002,389 A | 12/1999 | Kasser | |
| 6,002,581 A | 12/1999 | Lindsey | |
| 6,005,209 A | 12/1999 | Burleson et al. | |
| 6,012,714 A | 1/2000 | Worley et al. | |
| 6,014,800 A | 1/2000 | Lee | |
| 6,040,823 A * | 3/2000 | Seffernick | G06F 3/0213 341/34 |
| 6,042,075 A | 3/2000 | Burch, Jr. | |
| 6,044,717 A | 4/2000 | Biegelsen et al. | |
| 6,046,857 A | 4/2000 | Morishima et al. | |
| 6,055,705 A | 5/2000 | Komatsu et al. | |
| 6,061,644 A | 5/2000 | Leis | |
| 6,072,551 A | 6/2000 | Jannson et al. | |
| 6,108,200 A | 8/2000 | Fullerton | |
| 6,112,797 A | 9/2000 | Colson et al. | |
| 6,124,906 A | 9/2000 | Kawada et al. | |
| 6,128,007 A | 10/2000 | Seybold | |
| 6,129,444 A | 10/2000 | Tognoni | |
| 6,141,388 A | 10/2000 | Servais et al. | |
| 6,147,859 A | 11/2000 | Abboud | |
| 6,172,807 B1 | 1/2001 | Akamatsu | |
| 6,178,085 B1 | 1/2001 | Leung | |
| 6,178,443 B1 | 1/2001 | Lin | |
| 6,188,391 B1 | 2/2001 | Seely et al. | |
| 6,215,590 B1 | 4/2001 | Okano | |
| 6,228,926 B1 | 5/2001 | Golumbic | |
| 6,232,934 B1 | 5/2001 | Heacock et al. | |
| 6,234,820 B1 | 5/2001 | Perino et al. | |
| 6,254,105 B1 | 7/2001 | Rinde et al. | |
| 6,256,447 B1 | 7/2001 | Laine | |
| 6,278,490 B1 | 8/2001 | Fukuda et al. | |
| 6,279,060 B1 | 8/2001 | Luke et al. | |
| 6,300,986 B1 | 10/2001 | Travis | |
| 6,305,073 B1 | 10/2001 | Badders | |
| 6,329,617 B1 | 12/2001 | Burgess | |
| 6,344,791 B1 | 2/2002 | Armstrong | |
| 6,351,273 B1 | 2/2002 | Lemelson et al. | |
| 6,353,503 B1 | 3/2002 | Spitzer et al. | |
| 6,366,440 B1 | 4/2002 | Kung | |
| 6,380,497 B1 | 4/2002 | Hashimoto et al. | |
| 6,411,266 B1 | 6/2002 | Maguire, Jr. | |
| 6,437,682 B1 | 8/2002 | Vance | |
| 6,441,362 B1 | 8/2002 | Ogawa | |
| 6,450,046 B1 | 9/2002 | Maeda | |
| 6,469,755 B1 | 10/2002 | Adachi et al. | |
| 6,506,983 B1 | 1/2003 | Babb et al. | |
| 6,511,378 B1 | 1/2003 | Bhatt et al. | |
| 6,529,179 B1 | 3/2003 | Hashimoto et al. | |
| 6,532,147 B1 | 3/2003 | Christ, Jr. | |
| 6,543,949 B1 | 4/2003 | Ritchey et al. | |
| 6,555,024 B2 | 4/2003 | Ueda et al. | |
| 6,565,439 B2 | 5/2003 | Shinohara et al. | |
| 6,574,030 B1 | 6/2003 | Mosier | |
| 6,585,435 B2 | 7/2003 | Fang | |
| 6,597,347 B1 | 7/2003 | Yasutake | |
| 6,600,121 B1 | 7/2003 | Olodort et al. | |
| 6,603,408 B1 | 8/2003 | Gaba | |
| 6,603,461 B2 | 8/2003 | Smith, Jr. et al. | |
| 6,608,664 B1 | 8/2003 | Hasegawa | |
| 6,617,536 B2 | 9/2003 | Kawaguchi | |
| 6,648,485 B1 | 11/2003 | Colgan et al. | |
| 6,651,943 B2 | 11/2003 | Cho et al. | |
| 6,675,865 B1 | 1/2004 | Yoshida | |
| 6,684,166 B2 | 1/2004 | Bellwood et al. | |
| 6,685,369 B2 | 2/2004 | Lien | |
| 6,687,614 B2 | 2/2004 | Ihara et al. | |
| 6,695,273 B2 | 2/2004 | Iguchi | |
| 6,700,617 B1 | 3/2004 | Hamamura et al. | |
| 6,704,005 B2 | 3/2004 | Kato et al. | |
| 6,704,864 B1 | 3/2004 | Philyaw | |
| 6,721,019 B2 | 4/2004 | Kono et al. | |
| 6,725,318 B1 | 4/2004 | Sherman et al. | |
| 6,738,049 B2 | 5/2004 | Kiser et al. | |
| 6,774,888 B1 | 8/2004 | Genduso | |
| 6,776,546 B2 | 8/2004 | Kraus et al. | |
| 6,780,019 B1 | 8/2004 | Ghosh et al. | |
| 6,781,819 B2 | 8/2004 | Yang et al. | |
| 6,784,869 B1 | 8/2004 | Clark et al. | |
| 6,790,054 B1 | 9/2004 | Boonsue | |
| 6,795,146 B2 | 9/2004 | Dozov et al. | |
| 6,798,887 B1 | 9/2004 | Andre | |
| 6,813,143 B2 | 11/2004 | Makela | |
| 6,819,082 B2 | 11/2004 | Yang | |

(56) References Cited

U.S. PATENT DOCUMENTS

| | | |
|---|---|---|
| 6,819,316 B2 | 11/2004 | Schulz et al. |
| 6,819,547 B2 | 11/2004 | Minaguchi et al. |
| 6,847,488 B2 | 1/2005 | Travis |
| 6,856,506 B2 | 2/2005 | Doherty et al. |
| 6,856,789 B2 | 2/2005 | Pattabiraman et al. |
| 6,859,565 B2 | 2/2005 | Baron |
| 6,861,961 B2 | 3/2005 | Sandbach et al. |
| 6,864,573 B2 | 3/2005 | Robertson et al. |
| 6,867,828 B2 | 3/2005 | Taira et al. |
| 6,870,671 B2 | 3/2005 | Travis |
| 6,895,164 B2 | 5/2005 | Saccomanno |
| 6,898,315 B2 | 5/2005 | Guha |
| 6,902,214 B2 | 6/2005 | Smith |
| 6,909,354 B2 | 6/2005 | Baker et al. |
| 6,914,197 B2 | 7/2005 | Doherty et al. |
| 6,950,950 B2 | 9/2005 | Sawyers et al. |
| 6,962,454 B1 | 11/2005 | Costello |
| 6,970,957 B1 | 11/2005 | Oshins et al. |
| 6,976,799 B2 | 12/2005 | Kim et al. |
| 6,980,177 B2 | 12/2005 | Struyk |
| 6,981,792 B2 | 1/2006 | Nagakubo et al. |
| 6,981,887 B1 | 1/2006 | Mese et al. |
| 7,002,624 B1 | 2/2006 | Uchino et al. |
| 7,006,080 B2 | 2/2006 | Gettemy |
| 7,007,238 B2 | 2/2006 | Glaser |
| 7,018,678 B2 | 3/2006 | Gronbeck et al. |
| 7,019,491 B2 | 3/2006 | Bozzone et al. |
| 7,025,908 B1 | 4/2006 | Hayashi et al. |
| 7,051,149 B2 | 5/2006 | Wang et al. |
| 7,066,634 B2 | 6/2006 | Kitamura et al. |
| 7,068,496 B2 | 6/2006 | Wong et al. |
| 7,073,933 B2 | 7/2006 | Gotoh et al. |
| 7,083,295 B1 | 8/2006 | Hanna |
| 7,091,436 B2 | 8/2006 | Serban |
| 7,095,404 B2 | 8/2006 | Vincent et al. |
| 7,099,149 B2 | 8/2006 | Krieger et al. |
| 7,101,048 B2 | 9/2006 | Travis |
| 7,102,683 B2 | 9/2006 | Perry et al. |
| 7,104,679 B2 | 9/2006 | Shin et al. |
| 7,106,222 B2 | 9/2006 | Ward et al. |
| 7,116,309 B1 | 10/2006 | Kimura et al. |
| 7,123,292 B1 | 10/2006 | Seeger et al. |
| 7,129,979 B1 | 10/2006 | Lee |
| 7,136,282 B1 | 11/2006 | Rebeske |
| 7,151,635 B2 | 12/2006 | Bidnyk et al. |
| 7,152,985 B2 | 12/2006 | Benitez et al. |
| 7,153,017 B2 | 12/2006 | Yamashita et al. |
| D535,292 S | 1/2007 | Shi et al. |
| 7,159,132 B2 | 1/2007 | Takahashi et al. |
| 7,162,153 B2 | 1/2007 | Harter, Jr. et al. |
| 7,169,460 B1 | 1/2007 | Chen et al. |
| 7,194,662 B2 | 3/2007 | Do et al. |
| 7,199,554 B2 | 4/2007 | Kim et al. |
| 7,199,931 B2 | 4/2007 | Boettiger et al. |
| 7,201,508 B2 | 4/2007 | Misaras |
| 7,202,837 B2 | 4/2007 | Ihara |
| 7,213,323 B2 | 5/2007 | Baker et al. |
| 7,213,991 B2 | 5/2007 | Chapman et al. |
| 7,218,830 B2 | 5/2007 | Iimura |
| 7,224,830 B2 | 5/2007 | Nefian et al. |
| 7,239,505 B2 | 7/2007 | Keely et al. |
| 7,252,512 B2 | 8/2007 | Tai et al. |
| 7,260,221 B1 | 8/2007 | Atsmon |
| 7,260,823 B2 | 8/2007 | Schlack et al. |
| 7,277,087 B2 | 10/2007 | Hill et al. |
| 7,280,348 B2 * | 10/2007 | Ghosh ................. G06F 1/1616 248/225.11 |
| 7,295,720 B2 | 11/2007 | Raskar |
| 7,301,759 B2 | 11/2007 | Hsiung |
| 7,311,526 B2 | 12/2007 | Rohrbach et al. |
| 7,331,793 B2 | 2/2008 | Hernandez et al. |
| 7,348,513 B2 | 3/2008 | Lin |
| 7,364,343 B2 | 4/2008 | Keuper et al. |
| 7,365,967 B2 | 4/2008 | Zheng |
| 7,370,342 B2 | 5/2008 | Ismail et al. |
| 7,374,312 B2 | 5/2008 | Feng et al. |
| 7,375,885 B2 | 5/2008 | Ijzerman et al. |
| 7,379,094 B2 | 5/2008 | Yoshida et al. |
| 7,384,178 B2 | 6/2008 | Sumida et al. |
| 7,400,377 B2 | 7/2008 | Evans et al. |
| 7,400,805 B2 | 7/2008 | Abu-Ageel |
| 7,400,817 B2 | 7/2008 | Lee et al. |
| 7,410,286 B2 | 8/2008 | Travis |
| 7,415,676 B2 | 8/2008 | Fujita |
| 7,423,557 B2 | 9/2008 | Kang |
| 7,431,489 B2 | 10/2008 | Yeo et al. |
| 7,443,443 B2 | 10/2008 | Raskar et al. |
| 7,447,922 B1 | 11/2008 | Asbury et al. |
| 7,447,934 B2 | 11/2008 | Dasari et al. |
| 7,457,108 B2 | 11/2008 | Ghosh |
| 7,467,948 B2 | 12/2008 | Lindberg et al. |
| 7,469,386 B2 | 12/2008 | Bear et al. |
| 7,486,165 B2 | 2/2009 | Ligtenberg et al. |
| 7,499,037 B2 | 3/2009 | Lube |
| 7,499,216 B2 | 3/2009 | Niv et al. |
| 7,502,803 B2 | 3/2009 | Culter et al. |
| 7,503,684 B2 | 3/2009 | Ueno et al. |
| 7,509,042 B2 | 3/2009 | Mori et al. |
| 7,515,143 B2 | 4/2009 | Keam et al. |
| 7,528,337 B2 | 5/2009 | Tanabe et al. |
| 7,528,374 B2 | 5/2009 | Smitt et al. |
| 7,539,882 B2 | 5/2009 | Jessup et al. |
| 7,541,907 B2 * | 6/2009 | Wang ................... G06F 1/1632 335/214 |
| 7,542,052 B2 | 6/2009 | Solomon et al. |
| 7,545,429 B2 | 6/2009 | Travis |
| 7,558,594 B2 | 7/2009 | Wilson |
| 7,559,834 B1 | 7/2009 | York |
| 7,561,131 B2 | 7/2009 | Ijzerman et al. |
| 7,572,045 B2 | 8/2009 | Hoelen et al. |
| RE40,891 E | 9/2009 | Yasutake |
| 7,594,638 B2 | 9/2009 | Chan et al. |
| 7,620,244 B1 | 11/2009 | Collier |
| 7,622,907 B2 | 11/2009 | Vranish |
| 7,629,966 B2 | 12/2009 | Anson |
| 7,631,327 B2 | 12/2009 | Dempski et al. |
| 7,636,921 B2 | 12/2009 | Louie |
| 7,639,329 B2 | 12/2009 | Takeda et al. |
| 7,639,876 B2 | 12/2009 | Clary et al. |
| 7,643,213 B2 | 1/2010 | Boettiger et al. |
| 7,656,392 B2 | 2/2010 | Bolender |
| 7,660,047 B1 | 2/2010 | Travis et al. |
| 7,675,598 B2 | 3/2010 | Hong |
| 7,686,066 B2 | 3/2010 | Hirao |
| 7,686,694 B2 | 3/2010 | Cole |
| 7,693,654 B1 | 4/2010 | Dietsch et al. |
| 7,705,558 B2 | 4/2010 | Silverman |
| 7,715,187 B2 | 5/2010 | Hotelling et al. |
| 7,722,358 B2 | 5/2010 | Chatterjee et al. |
| 7,722,792 B2 | 5/2010 | Uezaki et al. |
| 7,724,952 B2 | 5/2010 | Shum et al. |
| 7,728,923 B2 | 6/2010 | Kim et al. |
| 7,729,493 B2 | 6/2010 | Krieger et al. |
| 7,731,147 B2 | 6/2010 | Rha |
| 7,733,326 B1 | 6/2010 | Adiseshan |
| 7,761,119 B2 | 7/2010 | Patel |
| 7,773,076 B2 | 8/2010 | Pittel et al. |
| 7,773,121 B1 | 8/2010 | Huntsberger et al. |
| 7,774,155 B2 | 8/2010 | Sato et al. |
| 7,777,972 B1 | 8/2010 | Chen et al. |
| 7,782,341 B2 | 8/2010 | Kothandaraman |
| 7,782,342 B2 | 8/2010 | Koh |
| 7,788,474 B2 | 8/2010 | Switzer et al. |
| 7,813,715 B2 | 10/2010 | McKillop et al. |
| 7,815,358 B2 | 10/2010 | Inditsky |
| 7,817,428 B2 | 10/2010 | Greer, Jr. et al. |
| 7,822,338 B2 | 10/2010 | Wernersson |
| 7,844,985 B2 | 11/2010 | Hendricks et al. |
| 7,855,716 B2 | 12/2010 | McCreary et al. |
| 7,865,639 B2 | 1/2011 | McCoy et al. |
| 7,884,807 B2 | 2/2011 | Hovden et al. |
| 7,893,921 B2 | 2/2011 | Sato |
| 7,898,797 B2 | 3/2011 | Fan et al. |
| 7,907,394 B2 | 3/2011 | Richardson et al. |

(56) References Cited

U.S. PATENT DOCUMENTS

| | | | |
|---|---|---|---|
| D636,397 S | 4/2011 | Green | |
| 7,918,559 B2 | 4/2011 | Tesar | |
| 7,927,654 B2 | 4/2011 | Hagood et al. | |
| 7,928,964 B2 | 4/2011 | Kolmykov-Zotov et al. | |
| 7,932,890 B2 | 4/2011 | Onikiri et al. | |
| 7,936,501 B2 | 5/2011 | Smith et al. | |
| 7,944,520 B2 | 5/2011 | Ichioka et al. | |
| 7,945,717 B2 | 5/2011 | Rivalsi | |
| 7,957,082 B2 | 6/2011 | Mi et al. | |
| 7,965,268 B2 | 6/2011 | Gass et al. | |
| 7,967,462 B2 | 6/2011 | Ogiro et al. | |
| 7,970,246 B2 | 6/2011 | Travis et al. | |
| 7,973,771 B2 | 7/2011 | Geaghan | |
| 7,976,393 B2 | 7/2011 | Haga et al. | |
| 7,978,281 B2 | 7/2011 | Vergith et al. | |
| 7,991,257 B1 | 8/2011 | Coleman | |
| 8,007,158 B2 | 8/2011 | Woo et al. | |
| 8,016,255 B2 | 9/2011 | Lin | |
| 8,018,386 B2 | 9/2011 | Qi et al. | |
| 8,018,579 B1 | 9/2011 | Krah | |
| 8,026,904 B2 | 9/2011 | Westerman | |
| 8,035,614 B2 | 10/2011 | Bell et al. | |
| 8,035,624 B2 | 10/2011 | Bell et al. | |
| 8,053,688 B2 | 11/2011 | Conzola et al. | |
| 8,059,384 B2 | 11/2011 | Park et al. | |
| 8,065,624 B2 | 11/2011 | Morin et al. | |
| 8,069,356 B2 | 11/2011 | Rathi et al. | |
| RE42,992 E | 12/2011 | David | |
| 8,077,160 B2 | 12/2011 | Land et al. | |
| 8,090,885 B2 | 1/2012 | Callaghan et al. | |
| 8,098,233 B2 | 1/2012 | Hotelling et al. | |
| 8,102,362 B2 | 1/2012 | Ricks et al. | |
| 8,115,499 B2 | 2/2012 | Osoinach et al. | |
| 8,115,718 B2 | 2/2012 | Chen et al. | |
| 8,117,362 B2 | 2/2012 | Rodriguez et al. | |
| 8,118,274 B2 | 2/2012 | McClure et al. | |
| 8,118,681 B2 | 2/2012 | Mattice et al. | |
| 8,120,166 B2 | 2/2012 | Koizumi et al. | |
| 8,130,203 B2 | 3/2012 | Westerman | |
| 8,149,219 B2 | 4/2012 | Lii et al. | |
| 8,149,272 B2 | 4/2012 | Evans et al. | |
| 8,154,524 B2 | 4/2012 | Wilson et al. | |
| 8,159,372 B2 | 4/2012 | Sherman | |
| 8,162,282 B2 | 4/2012 | Hu et al. | |
| D659,139 S | 5/2012 | Gengler | |
| 8,169,185 B2 | 5/2012 | Partovi et al. | |
| 8,169,421 B2 | 5/2012 | Wright et al. | |
| 8,179,236 B2 | 5/2012 | Weller et al. | |
| 8,184,190 B2 | 5/2012 | Dosluoglu | |
| 8,189,973 B2 | 5/2012 | Travis et al. | |
| 8,216,074 B2 | 7/2012 | Sakuma | |
| 8,229,509 B2 | 7/2012 | Paek et al. | |
| 8,229,522 B2 | 7/2012 | Kim et al. | |
| 8,231,099 B2 | 7/2012 | Chen | |
| 8,243,432 B2 | 8/2012 | Duan et al. | |
| 8,248,791 B2 | 8/2012 | Wang et al. | |
| 8,249,263 B2 | 8/2012 | Cragun | |
| 8,251,563 B2 | 8/2012 | Papakonstantinou et al. | |
| 8,255,708 B1 | 8/2012 | Zhang | |
| 8,263,730 B2 | 9/2012 | Shimizu | |
| 8,264,310 B2 | 9/2012 | Lauder et al. | |
| 8,267,368 B2 | 9/2012 | Torii et al. | |
| 8,269,093 B2 | 9/2012 | Naik et al. | |
| 8,269,731 B2 | 9/2012 | Molne | |
| 8,274,784 B2 | 9/2012 | Franz et al. | |
| 8,279,589 B2 | 10/2012 | Kim | |
| 8,289,115 B2 * | 10/2012 | Cretella, Jr. | G06F 1/1626 206/320 |
| 8,310,508 B2 | 11/2012 | Hekstra et al. | |
| 8,310,768 B2 | 11/2012 | Lin et al. | |
| 8,322,290 B1 | 12/2012 | Mignano | |
| 8,325,416 B2 | 12/2012 | Lesage et al. | |
| 8,342,857 B2 | 1/2013 | Palli et al. | |
| 8,345,920 B2 | 1/2013 | Ferren et al. | |
| 8,346,206 B1 | 1/2013 | Andrus et al. | |
| 8,354,806 B2 | 1/2013 | Travis et al. | |
| 8,362,975 B2 | 1/2013 | Uehara | |
| 8,371,174 B2 | 2/2013 | Chen et al. | |
| 8,373,664 B2 | 2/2013 | Wright | |
| 8,384,566 B2 | 2/2013 | Bocirnea | |
| 8,387,078 B2 | 2/2013 | Memmott | |
| 8,387,938 B2 | 3/2013 | Lin | |
| 8,389,078 B2 | 3/2013 | Lin et al. | |
| 8,403,576 B2 | 3/2013 | Merz | |
| 8,416,206 B2 | 4/2013 | Carpendale et al. | |
| 8,416,559 B2 | 4/2013 | Agata et al. | |
| 8,424,160 B2 | 4/2013 | Chen | |
| 8,446,359 B2 | 5/2013 | Doczy et al. | |
| 8,464,079 B2 | 6/2013 | Chueh et al. | |
| 8,466,902 B2 | 6/2013 | Boer et al. | |
| 8,466,954 B2 | 6/2013 | Ko et al. | |
| 8,467,133 B2 | 6/2013 | Miller | |
| 8,477,100 B2 | 7/2013 | Wang et al. | |
| 8,497,657 B2 | 7/2013 | Franks et al. | |
| 8,498,100 B1 | 7/2013 | Whitt, III et al. | |
| 8,513,547 B2 | 8/2013 | Ooi | |
| 8,514,568 B2 | 8/2013 | Qiao et al. | |
| 8,520,371 B2 | 8/2013 | Peng et al. | |
| 8,543,227 B1 * | 9/2013 | Perek | G06F 1/1618 463/39 |
| 8,548,608 B2 * | 10/2013 | Perek | G06F 1/1618 463/39 |
| 8,560,004 B1 | 10/2013 | Tsvetkov et al. | |
| 8,564,944 B2 | 10/2013 | Whitt, III et al. | |
| 8,565,560 B2 | 10/2013 | Popovich et al. | |
| 8,569,640 B2 | 10/2013 | Yamada et al. | |
| 8,570,725 B2 | 10/2013 | Whitt, III et al. | |
| 8,571,539 B1 | 10/2013 | Ranganathan et al. | |
| 8,576,031 B2 * | 11/2013 | Lauder | G06F 1/1626 206/320 |
| 8,582,206 B2 | 11/2013 | Travis | |
| 8,582,280 B2 | 11/2013 | Ryu | |
| 8,587,701 B2 | 11/2013 | Tatsuzawa | |
| 8,599,542 B1 | 12/2013 | Healey et al. | |
| 8,600,120 B2 | 12/2013 | Gonion et al. | |
| 8,600,526 B2 | 12/2013 | Nielsen et al. | |
| 8,610,015 B2 | 12/2013 | Whitt et al. | |
| 8,614,666 B2 | 12/2013 | Whitman et al. | |
| 8,633,898 B2 | 1/2014 | Westerman et al. | |
| 8,646,999 B2 | 2/2014 | Shaw et al. | |
| 8,654,030 B1 | 2/2014 | Mercer | |
| 8,674,941 B2 | 3/2014 | Casparian et al. | |
| 8,692,212 B1 | 4/2014 | Craft | |
| 8,699,215 B2 | 4/2014 | Whitt, III et al. | |
| 8,700,931 B2 | 4/2014 | Gudlavenkatasiva et al. | |
| 8,719,603 B2 | 5/2014 | Belesiu | |
| 8,724,302 B2 | 5/2014 | Whitt et al. | |
| 8,738,090 B2 | 5/2014 | Kanda | |
| 8,744,070 B2 | 6/2014 | Zhang et al. | |
| 8,744,391 B2 | 6/2014 | Tenbrook et al. | |
| 8,749,529 B2 | 6/2014 | Powell et al. | |
| 8,754,854 B1 | 6/2014 | Hamburgen et al. | |
| 8,757,374 B2 | 6/2014 | Kaiser | |
| 8,762,746 B1 | 6/2014 | Lachwani et al. | |
| 8,767,388 B2 * | 7/2014 | Ahn | F16M 11/10 361/679.27 |
| 8,780,540 B2 | 7/2014 | Whitt, III et al. | |
| 8,780,541 B2 | 7/2014 | Whitt, III et al. | |
| 8,786,767 B2 | 7/2014 | Rihn et al. | |
| 8,791,382 B2 | 7/2014 | Whitt, III et al. | |
| 8,797,765 B2 | 8/2014 | Lin et al. | |
| 8,823,652 B2 | 9/2014 | Linegar et al. | |
| 8,825,187 B1 | 9/2014 | Hamrick et al. | |
| 8,830,668 B2 | 9/2014 | Whitt, III et al. | |
| 8,850,241 B2 | 9/2014 | Oler et al. | |
| 8,854,799 B2 | 10/2014 | Whitt, III et al. | |
| 8,873,227 B2 | 10/2014 | Whitt et al. | |
| 8,891,232 B2 | 11/2014 | Wang | |
| 8,903,517 B2 * | 12/2014 | Perek | G06F 1/1618 463/39 |
| 8,908,858 B2 | 12/2014 | Chiu et al. | |
| 8,934,221 B2 | 1/2015 | Guo | |
| 8,935,774 B2 | 1/2015 | Belesiu et al. | |
| 8,939,422 B2 | 1/2015 | Liu et al. | |

(56) References Cited

U.S. PATENT DOCUMENTS

| | | |
|---|---|---|
| 8,947,353 B2 | 2/2015 | Boulanger et al. |
| 8,947,864 B2 | 2/2015 | Whitt, III et al. |
| 8,949,477 B2 | 2/2015 | Drasnin |
| 8,964,376 B2 | 2/2015 | Chen |
| 8,997,983 B2 | 4/2015 | Sajid |
| 9,001,028 B2 | 4/2015 | Baker |
| 9,047,207 B2 | 6/2015 | Belesiu et al. |
| 9,064,654 B2 | 6/2015 | Whitt, III et al. |
| 9,075,566 B2 | 7/2015 | Whitt, III et al. |
| 9,098,117 B2 | 8/2015 | Lutz, III et al. |
| 9,111,703 B2 | 8/2015 | Whitt, III et al. |
| 9,116,550 B2 | 8/2015 | Siddiqui et al. |
| 9,134,807 B2 | 9/2015 | Shaw et al. |
| 9,134,808 B2 | 9/2015 | Siddiqui et al. |
| 9,146,620 B2 | 9/2015 | Whitt et al. |
| 9,158,383 B2 | 10/2015 | Shaw et al. |
| 9,158,384 B2 | 10/2015 | Whitt, III et al. |
| 9,176,900 B2 | 11/2015 | Whitt, III et al. |
| 9,176,901 B2 | 11/2015 | Whitt, III et al. |
| 9,189,428 B2 | 11/2015 | Pollmann et al. |
| 9,201,185 B2 | 12/2015 | Large |
| 9,256,089 B2 | 2/2016 | Emerton et al. |
| 9,268,373 B2 | 2/2016 | Whitt et al. |
| 9,275,809 B2 | 3/2016 | Panay et al. |
| 9,298,236 B2 | 3/2016 | Oler et al. |
| 9,304,549 B2 | 4/2016 | Siddiqui |
| 9,304,948 B2 | 4/2016 | Whitman et al. |
| 9,304,949 B2 | 4/2016 | Whitman et al. |
| 9,348,605 B2 | 5/2016 | Drasnin |
| 9,354,748 B2 | 5/2016 | Lutian et al. |
| 9,360,893 B2 | 6/2016 | Bathiche et al. |
| 9,411,751 B2 | 8/2016 | Whitt et al. |
| 9,426,905 B2 | 8/2016 | Bathiche et al. |
| 9,447,620 B2 | 9/2016 | Park et al. |
| 9,460,029 B2 | 10/2016 | Shaw et al. |
| 9,465,412 B2 | 10/2016 | Belesiu et al. |
| 2001/0023818 A1 | 9/2001 | Masaru et al. |
| 2001/0035859 A1 | 11/2001 | Kiser |
| 2002/0000977 A1 | 1/2002 | Vranish |
| 2002/0005108 A1 | 1/2002 | Ludwig |
| 2002/0008854 A1 | 1/2002 | Travis et al. |
| 2002/0044216 A1 | 4/2002 | Cha |
| 2002/0070883 A1* | 6/2002 | Dosch ............... G06F 1/1626 341/22 |
| 2002/0113882 A1 | 8/2002 | Pollard et al. |
| 2002/0126445 A1 | 9/2002 | Minaguchi et al. |
| 2002/0126446 A1 | 9/2002 | Miyako et al. |
| 2002/0134828 A1 | 9/2002 | Sandbach et al. |
| 2002/0135457 A1 | 9/2002 | Sandbach et al. |
| 2002/0138772 A1 | 9/2002 | Crawford et al. |
| 2002/0154099 A1 | 10/2002 | Oh |
| 2002/0163510 A1 | 11/2002 | Williams et al. |
| 2002/0195177 A1 | 12/2002 | Hinkley et al. |
| 2003/0000821 A1 | 1/2003 | Takahashi et al. |
| 2003/0007648 A1 | 1/2003 | Currell |
| 2003/0009518 A1 | 1/2003 | Harrow et al. |
| 2003/0011576 A1 | 1/2003 | Sandbach et al. |
| 2003/0016282 A1 | 1/2003 | Koizumi |
| 2003/0028688 A1 | 2/2003 | Tiphane et al. |
| 2003/0036365 A1 | 2/2003 | Kuroda |
| 2003/0044215 A1 | 3/2003 | Monney et al. |
| 2003/0044216 A1 | 3/2003 | Fang |
| 2003/0051983 A1 | 3/2003 | Lahr |
| 2003/0067450 A1 | 4/2003 | Thursfield et al. |
| 2003/0108720 A1 | 6/2003 | Kashino |
| 2003/0128285 A1 | 7/2003 | Itoh |
| 2003/0132916 A1 | 7/2003 | Kramer |
| 2003/0137821 A1 | 7/2003 | Gotoh et al. |
| 2003/0148740 A1 | 8/2003 | Yau et al. |
| 2003/0160712 A1 | 8/2003 | Levy |
| 2003/0163611 A1 | 8/2003 | Nagao |
| 2003/0165017 A1 | 9/2003 | Amitai |
| 2003/0173195 A1 | 9/2003 | Federspiel |
| 2003/0197687 A1 | 10/2003 | Shetter |
| 2003/0197806 A1 | 10/2003 | Perry et al. |
| 2003/0198008 A1 | 10/2003 | Leapman et al. |
| 2003/0231243 A1 | 12/2003 | Shibutani |
| 2004/0005184 A1 | 1/2004 | Kim et al. |
| 2004/0039862 A1 | 2/2004 | Hunt et al. |
| 2004/0046796 A1 | 3/2004 | Fujita |
| 2004/0048941 A1 | 3/2004 | Raffel et al. |
| 2004/0056843 A1 | 3/2004 | Lin et al. |
| 2004/0085716 A1 | 5/2004 | Uke |
| 2004/0095333 A1 | 5/2004 | Morag et al. |
| 2004/0100457 A1 | 5/2004 | Mandle |
| 2004/0113956 A1 | 6/2004 | Bellwood et al. |
| 2004/0115994 A1 | 6/2004 | Wulff et al. |
| 2004/0156168 A1 | 8/2004 | LeVasseur et al. |
| 2004/0160734 A1 | 8/2004 | Yim |
| 2004/0169641 A1 | 9/2004 | Bean et al. |
| 2004/0174709 A1 | 9/2004 | Buelow, II et al. |
| 2004/0189822 A1 | 9/2004 | Shimada |
| 2004/0212553 A1 | 10/2004 | Wang et al. |
| 2004/0212598 A1 | 10/2004 | Kraus et al. |
| 2004/0212601 A1 | 10/2004 | Cake et al. |
| 2004/0231969 A1 | 11/2004 | Kitano et al. |
| 2004/0258924 A1 | 12/2004 | Berger et al. |
| 2004/0268000 A1 | 12/2004 | Barker et al. |
| 2005/0002073 A1 | 1/2005 | Nakamura et al. |
| 2005/0030728 A1 | 2/2005 | Kawashima et al. |
| 2005/0041096 A1 | 2/2005 | Horita |
| 2005/0047773 A1* | 3/2005 | Satake ............... H04M 1/0214 396/301 |
| 2005/0052831 A1 | 3/2005 | Chen |
| 2005/0055498 A1 | 3/2005 | Beckert et al. |
| 2005/0057515 A1 | 3/2005 | Bathiche |
| 2005/0057521 A1 | 3/2005 | Aull et al. |
| 2005/0059489 A1 | 3/2005 | Kim |
| 2005/0062715 A1 | 3/2005 | Tsuji et al. |
| 2005/0064765 A1 | 3/2005 | Simpson et al. |
| 2005/0068460 A1 | 3/2005 | Lin |
| 2005/0094895 A1 | 5/2005 | Baron |
| 2005/0099400 A1 | 5/2005 | Lee |
| 2005/0100690 A1 | 5/2005 | Mayer et al. |
| 2005/0134717 A1 | 6/2005 | Misawa |
| 2005/0146512 A1 | 7/2005 | Hill et al. |
| 2005/0153753 A1 | 7/2005 | Cheng |
| 2005/0206737 A1 | 9/2005 | Gim et al. |
| 2005/0231156 A1 | 10/2005 | Yan |
| 2005/0236848 A1 | 10/2005 | Kim et al. |
| 2005/0240949 A1 | 10/2005 | Liu et al. |
| 2005/0264653 A1 | 12/2005 | Starkweather et al. |
| 2005/0264988 A1 | 12/2005 | Nicolosi |
| 2005/0265035 A1 | 12/2005 | Brass et al. |
| 2005/0283731 A1 | 12/2005 | Saint-Hilaire et al. |
| 2005/0285703 A1 | 12/2005 | Wheeler et al. |
| 2006/0002101 A1 | 1/2006 | Wheatley et al. |
| 2006/0010400 A1 | 1/2006 | Dehlin et al. |
| 2006/0012767 A1 | 1/2006 | Komatsuda et al. |
| 2006/0028400 A1 | 2/2006 | Lapstun et al. |
| 2006/0028476 A1 | 2/2006 | Sobel |
| 2006/0028838 A1 | 2/2006 | Imade |
| 2006/0049920 A1 | 3/2006 | Sadler et al. |
| 2006/0049993 A1 | 3/2006 | Lin et al. |
| 2006/0061555 A1 | 3/2006 | Mullen |
| 2006/0070384 A1 | 4/2006 | Ertel |
| 2006/0082973 A1 | 4/2006 | Egbert et al. |
| 2006/0083004 A1 | 4/2006 | Cok |
| 2006/0085658 A1 | 4/2006 | Allen et al. |
| 2006/0092139 A1 | 5/2006 | Sharma |
| 2006/0092379 A1 | 5/2006 | Cho et al. |
| 2006/0096392 A1 | 5/2006 | Inkster et al. |
| 2006/0102020 A1 | 5/2006 | Takada et al. |
| 2006/0102914 A1 | 5/2006 | Smits et al. |
| 2006/0103633 A1 | 5/2006 | Gioeli |
| 2006/0125799 A1 | 6/2006 | Hillis et al. |
| 2006/0132423 A1 | 6/2006 | Travis |
| 2006/0132456 A1 | 6/2006 | Anson |
| 2006/0146573 A1 | 7/2006 | Iwauchi et al. |
| 2006/0154725 A1 | 7/2006 | Glaser et al. |
| 2006/0155391 A1 | 7/2006 | Pistemaa et al. |
| 2006/0156415 A1 | 7/2006 | Rubinstein et al. |
| 2006/0174143 A1 | 8/2006 | Sawyers et al. |
| 2006/0176377 A1 | 8/2006 | Miyasaka |

(56) References Cited

U.S. PATENT DOCUMENTS

| | | |
|---|---|---|
| 2006/0181514 A1 | 8/2006 | Newman |
| 2006/0181521 A1 | 8/2006 | Perreault et al. |
| 2006/0187216 A1 | 8/2006 | Trent, Jr. et al. |
| 2006/0192763 A1 | 8/2006 | Ziemkowski |
| 2006/0195522 A1 | 8/2006 | Miyazaki |
| 2006/0197755 A1 | 9/2006 | Bawany |
| 2006/0215244 A1 | 9/2006 | Yosha et al. |
| 2006/0220465 A1 | 10/2006 | Kingsmore et al. |
| 2006/0227393 A1 | 10/2006 | Herloski |
| 2006/0238510 A1 | 10/2006 | Panotopoulos et al. |
| 2006/0238550 A1 | 10/2006 | Page |
| 2006/0239006 A1 | 10/2006 | Chaves et al. |
| 2006/0248597 A1 | 11/2006 | Keneman |
| 2006/0250381 A1 | 11/2006 | Geaghan |
| 2006/0254042 A1 | 11/2006 | Chou et al. |
| 2006/0261778 A1 | 11/2006 | Elizalde Rodarte |
| 2006/0262185 A1 | 11/2006 | Cha et al. |
| 2006/0265617 A1 | 11/2006 | Priborsky |
| 2006/0267931 A1 | 11/2006 | Vainio et al. |
| 2006/0272429 A1 | 12/2006 | Ganapathi et al. |
| 2006/0279501 A1 | 12/2006 | Lu et al. |
| 2006/0287982 A1 | 12/2006 | Sheldon et al. |
| 2007/0002587 A1 | 1/2007 | Miyashita |
| 2007/0003267 A1 | 1/2007 | Shibutani |
| 2007/0019181 A1 | 1/2007 | Sinclair et al. |
| 2007/0024742 A1 | 2/2007 | Raskar et al. |
| 2007/0046625 A1 | 3/2007 | Yee |
| 2007/0047221 A1 | 3/2007 | Park |
| 2007/0047260 A1 | 3/2007 | Lee et al. |
| 2007/0051792 A1 | 3/2007 | Wheeler et al. |
| 2007/0056385 A1 | 3/2007 | Lorenz |
| 2007/0062089 A1 | 3/2007 | Homer et al. |
| 2007/0069153 A1 | 3/2007 | Pai-Paranjape et al. |
| 2007/0072474 A1 | 3/2007 | Beasley et al. |
| 2007/0076434 A1 | 4/2007 | Uehara et al. |
| 2007/0080813 A1 | 4/2007 | Melvin |
| 2007/0081091 A1 | 4/2007 | Pan et al. |
| 2007/0091638 A1 | 4/2007 | Ijzerman et al. |
| 2007/0114967 A1 | 5/2007 | Peng |
| 2007/0116929 A1 | 5/2007 | Fujimori et al. |
| 2007/0117600 A1 | 5/2007 | Robertson et al. |
| 2007/0121956 A1 | 5/2007 | Bai et al. |
| 2007/0122027 A1 | 5/2007 | Kunita et al. |
| 2007/0126393 A1 | 6/2007 | Bersenev |
| 2007/0127205 A1 | 6/2007 | Kuo |
| 2007/0145945 A1 | 6/2007 | McGinley et al. |
| 2007/0161262 A1 | 7/2007 | Lloyd |
| 2007/0172229 A1 | 7/2007 | Wernersson |
| 2007/0176902 A1 | 8/2007 | Newman et al. |
| 2007/0178891 A1 | 8/2007 | Louch et al. |
| 2007/0182663 A1 | 8/2007 | Biech |
| 2007/0182722 A1 | 8/2007 | Hotelling et al. |
| 2007/0185590 A1 | 8/2007 | Reindel et al. |
| 2007/0188478 A1 | 8/2007 | Silverstein et al. |
| 2007/0189667 A1 | 8/2007 | Wakita et al. |
| 2007/0194752 A1 | 8/2007 | McBurney |
| 2007/0200830 A1 | 8/2007 | Yamamoto |
| 2007/0201246 A1 | 8/2007 | Yeo et al. |
| 2007/0201859 A1 | 8/2007 | Sarrat |
| 2007/0217224 A1 | 9/2007 | Kao et al. |
| 2007/0220708 A1 | 9/2007 | Lewis |
| 2007/0222766 A1 | 9/2007 | Bolender |
| 2007/0230227 A1 | 10/2007 | Palmer |
| 2007/0234420 A1 | 10/2007 | Novotney et al. |
| 2007/0236408 A1 | 10/2007 | Yamaguchi et al. |
| 2007/0236475 A1 | 10/2007 | Wherry |
| 2007/0236873 A1 | 10/2007 | Yukawa et al. |
| 2007/0247338 A1 | 10/2007 | Marchetto |
| 2007/0247432 A1 | 10/2007 | Oakley |
| 2007/0247800 A1 | 10/2007 | Smith et al. |
| 2007/0252674 A1 | 11/2007 | Nelson et al. |
| 2007/0257821 A1 | 11/2007 | Son et al. |
| 2007/0260892 A1 | 11/2007 | Paul et al. |
| 2007/0263119 A1 | 11/2007 | Shum et al. |
| 2007/0268273 A1 | 11/2007 | Westerman et al. |
| 2007/0271527 A1 | 11/2007 | Paas et al. |
| 2007/0274094 A1 | 11/2007 | Schultz et al. |
| 2007/0274095 A1 | 11/2007 | Destain |
| 2007/0274099 A1 | 11/2007 | Tai et al. |
| 2007/0283179 A1 | 12/2007 | Burnett et al. |
| 2007/0296709 A1 | 12/2007 | Guanghai |
| 2007/0297125 A1 | 12/2007 | Maatta |
| 2007/0297625 A1 | 12/2007 | Hjort et al. |
| 2008/0001924 A1 | 1/2008 | de los Reyes et al. |
| 2008/0002350 A1 | 1/2008 | Farrugia |
| 2008/0005423 A1 | 1/2008 | Jacobs et al. |
| 2008/0013809 A1 | 1/2008 | Zhu et al. |
| 2008/0018611 A1 | 1/2008 | Serban et al. |
| 2008/0019150 A1 | 1/2008 | Park et al. |
| 2008/0019684 A1 | 1/2008 | Shyu et al. |
| 2008/0030937 A1 | 2/2008 | Russo et al. |
| 2008/0037284 A1 | 2/2008 | Rudisill |
| 2008/0042978 A1 | 2/2008 | Perez-Noguera |
| 2008/0053222 A1 | 3/2008 | Ehrensvard et al. |
| 2008/0059888 A1 | 3/2008 | Dunko |
| 2008/0068451 A1 | 3/2008 | Hyatt |
| 2008/0074398 A1 | 3/2008 | Wright |
| 2008/0080166 A1 | 4/2008 | Duong et al. |
| 2008/0084499 A1 | 4/2008 | Kisacanin et al. |
| 2008/0088593 A1 | 4/2008 | Smoot |
| 2008/0090626 A1 | 4/2008 | Griffin et al. |
| 2008/0104437 A1 | 5/2008 | Lee |
| 2008/0106592 A1 | 5/2008 | Mikami |
| 2008/0111518 A1 | 5/2008 | Toya |
| 2008/0122803 A1 | 5/2008 | Izadi et al. |
| 2008/0129520 A1 | 6/2008 | Lee |
| 2008/0150913 A1 | 6/2008 | Bell et al. |
| 2008/0151478 A1 | 6/2008 | Chern, Jr. |
| 2008/0158185 A1 | 7/2008 | Westerman |
| 2008/0167832 A1 | 7/2008 | Soss |
| 2008/0174570 A1 | 7/2008 | Jobs et al. |
| 2008/0177185 A1 | 7/2008 | Nakao et al. |
| 2008/0179507 A2 | 7/2008 | Han |
| 2008/0180411 A1 | 7/2008 | Solomon et al. |
| 2008/0182622 A1 | 7/2008 | Makarowski et al. |
| 2008/0186660 A1 | 8/2008 | Yang |
| 2008/0186683 A1 | 8/2008 | Ligtenberg et al. |
| 2008/0203277 A1 | 8/2008 | Warszauer et al. |
| 2008/0211787 A1 | 9/2008 | Nakao et al. |
| 2008/0219025 A1 | 9/2008 | Spitzer et al. |
| 2008/0225205 A1 | 9/2008 | Travis |
| 2008/0228969 A1 | 9/2008 | Cheah et al. |
| 2008/0232061 A1 | 9/2008 | Wang et al. |
| 2008/0233326 A1 | 9/2008 | Hegemier et al. |
| 2008/0238884 A1 | 10/2008 | Harish |
| 2008/0253822 A1 | 10/2008 | Matias |
| 2008/0258679 A1 | 10/2008 | Manico et al. |
| 2008/0273297 A1 | 11/2008 | Kumar |
| 2008/0297878 A1 | 12/2008 | Brown et al. |
| 2008/0303479 A1 | 12/2008 | Park et al. |
| 2008/0307242 A1 | 12/2008 | Qu |
| 2008/0309636 A1 | 12/2008 | Feng et al. |
| 2008/0316002 A1 | 12/2008 | Brunet et al. |
| 2008/0316183 A1 | 12/2008 | Westerman et al. |
| 2008/0316768 A1 | 12/2008 | Travis |
| 2008/0320190 A1 | 12/2008 | Lydon et al. |
| 2009/0002218 A1 | 1/2009 | Rigazio et al. |
| 2009/0007001 A1 | 1/2009 | Morin et al. |
| 2009/0009476 A1 | 1/2009 | Daley, III |
| 2009/0013275 A1 | 1/2009 | May et al. |
| 2009/0033623 A1 | 2/2009 | Lin |
| 2009/0040426 A1 | 2/2009 | Mather et al. |
| 2009/0049979 A1 | 2/2009 | Naik et al. |
| 2009/0065267 A1 | 3/2009 | Sato |
| 2009/0067156 A1 | 3/2009 | Bonnett et al. |
| 2009/0073060 A1 | 3/2009 | Shimasaki et al. |
| 2009/0073957 A1 | 3/2009 | Newland et al. |
| 2009/0079639 A1 | 3/2009 | Hotta et al. |
| 2009/0083562 A1 | 3/2009 | Park et al. |
| 2009/0083710 A1 | 3/2009 | Best et al. |
| 2009/0085515 A1 | 4/2009 | Bourilkov et al. |
| 2009/0089600 A1 | 4/2009 | Nousiainen |
| 2009/0096738 A1 | 4/2009 | Chen et al. |
| 2009/0096756 A1 | 4/2009 | Lube |

(56) References Cited

U.S. PATENT DOCUMENTS

| | | |
|---|---|---|
| 2009/0102419 A1 | 4/2009 | Gwon et al. |
| 2009/0102805 A1 | 4/2009 | Meijer et al. |
| 2009/0117955 A1 | 5/2009 | Lo |
| 2009/0127005 A1 | 5/2009 | Zachut et al. |
| 2009/0131134 A1 | 5/2009 | Baerlocher et al. |
| 2009/0134838 A1 | 5/2009 | Raghuprasad |
| 2009/0135142 A1 | 5/2009 | Fu et al. |
| 2009/0135318 A1 | 5/2009 | Tateuchi et al. |
| 2009/0140985 A1 | 6/2009 | Liu |
| 2009/0141439 A1* | 6/2009 | Moser ................... G06F 1/1616 361/679.29 |
| 2009/0142020 A1 | 6/2009 | Van Ostrand et al. |
| 2009/0146975 A1 | 6/2009 | Chang |
| 2009/0146992 A1 | 6/2009 | Fukunaga et al. |
| 2009/0147102 A1 | 6/2009 | Kakinuma et al. |
| 2009/0152748 A1 | 6/2009 | Wang et al. |
| 2009/0158221 A1 | 6/2009 | Nielsen et al. |
| 2009/0160944 A1 | 6/2009 | Trevelyan et al. |
| 2009/0161385 A1 | 6/2009 | Parker et al. |
| 2009/0163147 A1 | 6/2009 | Steigerwald et al. |
| 2009/0167728 A1 | 7/2009 | Geaghan et al. |
| 2009/0167930 A1 | 7/2009 | Safaee-Rad et al. |
| 2009/0174687 A1 | 7/2009 | Ciesla et al. |
| 2009/0174759 A1 | 7/2009 | Yeh et al. |
| 2009/0177906 A1 | 7/2009 | Paniagua, Jr. et al. |
| 2009/0182901 A1 | 7/2009 | Callaghan et al. |
| 2009/0187860 A1 | 7/2009 | Fleck et al. |
| 2009/0189873 A1 | 7/2009 | Peterson |
| 2009/0189974 A1 | 7/2009 | Deering |
| 2009/0195497 A1 | 8/2009 | Fitzgerald et al. |
| 2009/0195518 A1 | 8/2009 | Mattice et al. |
| 2009/0200384 A1 | 8/2009 | Masalkar |
| 2009/0201254 A1 | 8/2009 | Rais |
| 2009/0207144 A1 | 8/2009 | Bridger |
| 2009/0219250 A1 | 9/2009 | Ure |
| 2009/0231275 A1 | 9/2009 | Odgers |
| 2009/0231465 A1 | 9/2009 | Senba |
| 2009/0239586 A1 | 9/2009 | Boeve et al. |
| 2009/0244009 A1* | 10/2009 | Staats ................... G06F 1/162 345/168 |
| 2009/0244832 A1 | 10/2009 | Behar et al. |
| 2009/0244872 A1 | 10/2009 | Yan |
| 2009/0251008 A1 | 10/2009 | Sugaya |
| 2009/0251623 A1 | 10/2009 | Koyama |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0269943 A1 | 10/2009 | Palli et al. |
| 2009/0276734 A1 | 11/2009 | Taylor et al. |
| 2009/0284613 A1 | 11/2009 | Kim |
| 2009/0285491 A1 | 11/2009 | Ravenscroft et al. |
| 2009/0296331 A1 | 12/2009 | Choy |
| 2009/0302175 A1 | 12/2009 | Torii et al. |
| 2009/0303137 A1 | 12/2009 | Kusaka et al. |
| 2009/0303204 A1 | 12/2009 | Nasiri et al. |
| 2009/0315830 A1 | 12/2009 | Westerman |
| 2009/0316072 A1 | 12/2009 | Okumura et al. |
| 2009/0320244 A1 | 12/2009 | Lin |
| 2009/0321490 A1 | 12/2009 | Groene et al. |
| 2009/0322278 A1 | 12/2009 | Franks et al. |
| 2010/0001963 A1 | 1/2010 | Doray et al. |
| 2010/0006412 A1 | 1/2010 | Wang et al. |
| 2010/0013319 A1 | 1/2010 | Kamiyama et al. |
| 2010/0013738 A1 | 1/2010 | Covannon et al. |
| 2010/0023869 A1 | 1/2010 | Saint-Hilaire et al. |
| 2010/0026656 A1 | 2/2010 | Hotelling et al. |
| 2010/0038821 A1 | 2/2010 | Jenkins et al. |
| 2010/0039081 A1 | 2/2010 | Sip |
| 2010/0039764 A1* | 2/2010 | Locker ................... G06F 1/1615 361/679.29 |
| 2010/0045540 A1 | 2/2010 | Lai et al. |
| 2010/0045609 A1 | 2/2010 | Do et al. |
| 2010/0045633 A1 | 2/2010 | Gettemy |
| 2010/0051356 A1 | 3/2010 | Stern et al. |
| 2010/0051432 A1 | 3/2010 | Lin et al. |
| 2010/0052880 A1 | 3/2010 | Laitinen et al. |
| 2010/0053534 A1 | 3/2010 | Hsieh et al. |
| 2010/0053771 A1 | 3/2010 | Travis et al. |
| 2010/0054435 A1 | 3/2010 | Louch et al. |
| 2010/0056130 A1 | 3/2010 | Louch et al. |
| 2010/0072334 A1 | 3/2010 | Le Gette et al. |
| 2010/0072351 A1 | 3/2010 | Mahowald |
| 2010/0073329 A1 | 3/2010 | Raman et al. |
| 2010/0075517 A1 | 3/2010 | Ni et al. |
| 2010/0077237 A1 | 3/2010 | Sawyers |
| 2010/0079379 A1 | 4/2010 | Demuynck et al. |
| 2010/0079861 A1 | 4/2010 | Powell |
| 2010/0081377 A1 | 4/2010 | Chatterjee et al. |
| 2010/0083108 A1 | 4/2010 | Rider et al. |
| 2010/0085321 A1 | 4/2010 | Pundsack |
| 2010/0100752 A1 | 4/2010 | Chueh et al. |
| 2010/0102182 A1 | 4/2010 | Lin |
| 2010/0102206 A1 | 4/2010 | Cazaux et al. |
| 2010/0103112 A1 | 4/2010 | Yoo et al. |
| 2010/0103131 A1 | 4/2010 | Segal et al. |
| 2010/0103332 A1 | 4/2010 | Li et al. |
| 2010/0103611 A1 | 4/2010 | Yang et al. |
| 2010/0105443 A1 | 4/2010 | Vaisanen |
| 2010/0106983 A1 | 4/2010 | Kasprzak et al. |
| 2010/0115309 A1 | 5/2010 | Carvalho et al. |
| 2010/0117993 A1 | 5/2010 | Kent |
| 2010/0123686 A1 | 5/2010 | Klinghult et al. |
| 2010/0128112 A1 | 5/2010 | Marti et al. |
| 2010/0128427 A1 | 5/2010 | Iso |
| 2010/0133398 A1 | 6/2010 | Chiu et al. |
| 2010/0135036 A1 | 6/2010 | Matsuba et al. |
| 2010/0141588 A1 | 6/2010 | Kimura et al. |
| 2010/0142130 A1 | 6/2010 | Wang et al. |
| 2010/0146317 A1 | 6/2010 | Challener et al. |
| 2010/0148995 A1 | 6/2010 | Elias |
| 2010/0148999 A1 | 6/2010 | Casparian et al. |
| 2010/0149073 A1 | 6/2010 | Chaum et al. |
| 2010/0149104 A1 | 6/2010 | Sim et al. |
| 2010/0149111 A1 | 6/2010 | Olien |
| 2010/0149117 A1 | 6/2010 | Chien et al. |
| 2010/0149134 A1 | 6/2010 | Westerman et al. |
| 2010/0149377 A1 | 6/2010 | Shintani et al. |
| 2010/0154171 A1 | 6/2010 | Lombardi et al. |
| 2010/0156798 A1 | 6/2010 | Archer |
| 2010/0156913 A1 | 6/2010 | Ortega et al. |
| 2010/0157085 A1 | 6/2010 | Sasaki |
| 2010/0161522 A1 | 6/2010 | Tirpak et al. |
| 2010/0162109 A1 | 6/2010 | Chatterjee et al. |
| 2010/0164857 A1 | 7/2010 | Liu et al. |
| 2010/0164897 A1 | 7/2010 | Morin et al. |
| 2010/0171891 A1 | 7/2010 | Kaji et al. |
| 2010/0174421 A1 | 7/2010 | Tsai et al. |
| 2010/0177388 A1 | 7/2010 | Cohen et al. |
| 2010/0180063 A1 | 7/2010 | Ananny et al. |
| 2010/0185877 A1 | 7/2010 | Chueh et al. |
| 2010/0185989 A1 | 7/2010 | Shiplacoff et al. |
| 2010/0188299 A1 | 7/2010 | Rinehart et al. |
| 2010/0188338 A1 | 7/2010 | Longe |
| 2010/0201308 A1 | 8/2010 | Lindholm |
| 2010/0205472 A1 | 8/2010 | Tupman et al. |
| 2010/0206614 A1 | 8/2010 | Park et al. |
| 2010/0206644 A1 | 8/2010 | Yeh |
| 2010/0207774 A1 | 8/2010 | Song |
| 2010/0214214 A1 | 8/2010 | Corson et al. |
| 2010/0214257 A1 | 8/2010 | Wussler et al. |
| 2010/0220205 A1 | 9/2010 | Lee et al. |
| 2010/0222110 A1 | 9/2010 | Kim et al. |
| 2010/0231498 A1 | 9/2010 | Large et al. |
| 2010/0231510 A1 | 9/2010 | Sampsell et al. |
| 2010/0231522 A1 | 9/2010 | Li |
| 2010/0231556 A1 | 9/2010 | Mines et al. |
| 2010/0235546 A1 | 9/2010 | Terlizzi et al. |
| 2010/0237970 A1 | 9/2010 | Liu |
| 2010/0238075 A1 | 9/2010 | Pourseyed |
| 2010/0238138 A1 | 9/2010 | Goertz et al. |
| 2010/0238270 A1 | 9/2010 | Bjelkhagen et al. |
| 2010/0238320 A1 | 9/2010 | Washisu |
| 2010/0238620 A1 | 9/2010 | Fish |

(56) References Cited

U.S. PATENT DOCUMENTS

| | | |
|---|---|---|
| 2010/0245106 A1* | 9/2010 | Miller .................. G06F 1/1618 340/686.1 |
| 2010/0245221 A1 | 9/2010 | Khan |
| 2010/0245289 A1 | 9/2010 | Svajda |
| 2010/0250975 A1 | 9/2010 | Gill et al. |
| 2010/0250988 A1 | 9/2010 | Okuda et al. |
| 2010/0259482 A1 | 10/2010 | Ball |
| 2010/0259876 A1 | 10/2010 | Kim |
| 2010/0265182 A1 | 10/2010 | Ball et al. |
| 2010/0271771 A1 | 10/2010 | Wu et al. |
| 2010/0274932 A1 | 10/2010 | Kose |
| 2010/0279768 A1 | 11/2010 | Huang et al. |
| 2010/0282953 A1 | 11/2010 | Tam |
| 2010/0289457 A1 | 11/2010 | Onnerud et al. |
| 2010/0291331 A1 | 11/2010 | Schaefer |
| 2010/0295812 A1 | 11/2010 | Burns et al. |
| 2010/0296163 A1 | 11/2010 | Saarikko |
| 2010/0299642 A1 | 11/2010 | Merrell et al. |
| 2010/0302378 A1 | 12/2010 | Marks et al. |
| 2010/0304793 A1 | 12/2010 | Kim |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0309617 A1 | 12/2010 | Wang et al. |
| 2010/0313680 A1 | 12/2010 | Joung et al. |
| 2010/0315345 A1 | 12/2010 | Laitinen |
| 2010/0315348 A1 | 12/2010 | Jellicoe et al. |
| 2010/0315373 A1 | 12/2010 | Steinhauser et al. |
| 2010/0315774 A1 | 12/2010 | Walker et al. |
| 2010/0321301 A1 | 12/2010 | Casparian et al. |
| 2010/0321339 A1 | 12/2010 | Kimmel |
| 2010/0321482 A1 | 12/2010 | Cleveland |
| 2010/0321877 A1 | 12/2010 | Moser |
| 2010/0322479 A1 | 12/2010 | Cleveland |
| 2010/0324457 A1 | 12/2010 | Bean et al. |
| 2010/0325155 A1 | 12/2010 | Skinner et al. |
| 2010/0331059 A1 | 12/2010 | Apgar et al. |
| 2011/0002577 A1 | 1/2011 | Van Ostrand |
| 2011/0007047 A1 | 1/2011 | Fujioka et al. |
| 2011/0012866 A1 | 1/2011 | Keam |
| 2011/0012873 A1 | 1/2011 | Prest et al. |
| 2011/0015894 A1* | 1/2011 | Chu ..................... G06F 1/1677 702/151 |
| 2011/0018799 A1 | 1/2011 | Lin |
| 2011/0019123 A1 | 1/2011 | Prest et al. |
| 2011/0031287 A1 | 2/2011 | Le Gette et al. |
| 2011/0032127 A1 | 2/2011 | Roush |
| 2011/0032215 A1 | 2/2011 | Sirotich et al. |
| 2011/0035209 A1 | 2/2011 | Macfarlane |
| 2011/0036965 A1 | 2/2011 | Zhang et al. |
| 2011/0037721 A1 | 2/2011 | Cranfill et al. |
| 2011/0043142 A1 | 2/2011 | Travis |
| 2011/0043479 A1 | 2/2011 | van Aerle et al. |
| 2011/0043990 A1 | 2/2011 | Mickey et al. |
| 2011/0044579 A1 | 2/2011 | Travis et al. |
| 2011/0044582 A1 | 2/2011 | Travis et al. |
| 2011/0050576 A1 | 3/2011 | Forutanpour et al. |
| 2011/0050626 A1 | 3/2011 | Porter et al. |
| 2011/0050946 A1 | 3/2011 | Lee et al. |
| 2011/0055407 A1 | 3/2011 | Lydon et al. |
| 2011/0057724 A1 | 3/2011 | Pabon |
| 2011/0057899 A1 | 3/2011 | Sleeman et al. |
| 2011/0060926 A1 | 3/2011 | Brooks et al. |
| 2011/0069148 A1 | 3/2011 | Jones et al. |
| 2011/0072391 A1 | 3/2011 | Hanggie et al. |
| 2011/0074688 A1 | 3/2011 | Hull et al. |
| 2011/0075440 A1 | 3/2011 | Wang |
| 2011/0081946 A1 | 4/2011 | Singh et al. |
| 2011/0095994 A1 | 4/2011 | Birnbaum |
| 2011/0096035 A1 | 4/2011 | Shen |
| 2011/0096513 A1 | 4/2011 | Kim |
| 2011/0102326 A1 | 5/2011 | Casparian et al. |
| 2011/0102356 A1 | 5/2011 | Kemppinen et al. |
| 2011/0102752 A1* | 5/2011 | Chen ..................... F16M 11/10 353/119 |
| 2011/0107958 A1 | 5/2011 | Pance et al. |
| 2011/0108401 A1 | 5/2011 | Yamada et al. |
| 2011/0113368 A1 | 5/2011 | Carvajal et al. |
| 2011/0115738 A1 | 5/2011 | Suzuki et al. |
| 2011/0115747 A1 | 5/2011 | Powell et al. |
| 2011/0117970 A1 | 5/2011 | Choi |
| 2011/0118025 A1 | 5/2011 | Lukas et al. |
| 2011/0122071 A1 | 5/2011 | Powell |
| 2011/0134032 A1 | 6/2011 | Chiu et al. |
| 2011/0134043 A1 | 6/2011 | Chen |
| 2011/0134112 A1 | 6/2011 | Koh et al. |
| 2011/0134161 A1 | 6/2011 | Son et al. |
| 2011/0147398 A1 | 6/2011 | Ahee et al. |
| 2011/0157037 A1 | 6/2011 | Shamir et al. |
| 2011/0157046 A1 | 6/2011 | Lee et al. |
| 2011/0157087 A1 | 6/2011 | Kanehira et al. |
| 2011/0157101 A1 | 6/2011 | Chang |
| 2011/0163955 A1 | 7/2011 | Nasiri et al. |
| 2011/0164357 A1 | 7/2011 | Yeom et al. |
| 2011/0164370 A1 | 7/2011 | McClure et al. |
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0167992 A1 | 7/2011 | Eventoff et al. |
| 2011/0169762 A1 | 7/2011 | Weiss |
| 2011/0169778 A1 | 7/2011 | Nungester et al. |
| 2011/0170289 A1 | 7/2011 | Allen et al. |
| 2011/0176035 A1 | 7/2011 | Poulsen |
| 2011/0179864 A1 | 7/2011 | Raasch et al. |
| 2011/0181754 A1 | 7/2011 | Iwasaki |
| 2011/0183120 A1 | 7/2011 | Sharygin et al. |
| 2011/0184646 A1 | 7/2011 | Wong et al. |
| 2011/0184824 A1 | 7/2011 | George et al. |
| 2011/0188199 A1 | 8/2011 | Pan |
| 2011/0191480 A1 | 8/2011 | Kobayashi |
| 2011/0193787 A1 | 8/2011 | Morishige et al. |
| 2011/0193938 A1 | 8/2011 | Oderwald et al. |
| 2011/0197156 A1 | 8/2011 | Strait et al. |
| 2011/0199389 A1 | 8/2011 | Lu et al. |
| 2011/0202878 A1 | 8/2011 | Park et al. |
| 2011/0205372 A1 | 8/2011 | Miramontes |
| 2011/0216039 A1 | 9/2011 | Chen et al. |
| 2011/0216266 A1 | 9/2011 | Travis |
| 2011/0221659 A1 | 9/2011 | King et al. |
| 2011/0221678 A1 | 9/2011 | Davydov |
| 2011/0227913 A1 | 9/2011 | Hyndman |
| 2011/0228462 A1 | 9/2011 | Dang |
| 2011/0231682 A1 | 9/2011 | Kakish et al. |
| 2011/0234494 A1 | 9/2011 | Peterson et al. |
| 2011/0234502 A1 | 9/2011 | Yun et al. |
| 2011/0234535 A1 | 9/2011 | Hung et al. |
| 2011/0234881 A1 | 9/2011 | Wakabayashi et al. |
| 2011/0235179 A1 | 9/2011 | Simmonds |
| 2011/0242063 A1 | 10/2011 | Li et al. |
| 2011/0242138 A1 | 10/2011 | Tribble |
| 2011/0242298 A1 | 10/2011 | Bathiche et al. |
| 2011/0242440 A1 | 10/2011 | Noma et al. |
| 2011/0242670 A1 | 10/2011 | Simmonds |
| 2011/0248152 A1 | 10/2011 | Svajda et al. |
| 2011/0248920 A1 | 10/2011 | Larsen |
| 2011/0248941 A1 | 10/2011 | Abdo et al. |
| 2011/0261001 A1 | 10/2011 | Liu |
| 2011/0261083 A1 | 10/2011 | Wilson |
| 2011/0262001 A1 | 10/2011 | Bi et al. |
| 2011/0265287 A1 | 11/2011 | Li et al. |
| 2011/0266672 A1 | 11/2011 | Sylvester |
| 2011/0267272 A1 | 11/2011 | Meyer et al. |
| 2011/0267300 A1 | 11/2011 | Serban et al. |
| 2011/0267757 A1 | 11/2011 | Probst |
| 2011/0273475 A1 | 11/2011 | Herz et al. |
| 2011/0285555 A1 | 11/2011 | Bocirnea |
| 2011/0290686 A1 | 12/2011 | Huang |
| 2011/0291958 A1 | 12/2011 | Wu et al. |
| 2011/0291993 A1 | 12/2011 | Miyazaki |
| 2011/0295697 A1 | 12/2011 | Boston et al. |
| 2011/0297566 A1 | 12/2011 | Gallagher et al. |
| 2011/0298919 A1 | 12/2011 | Maglaque |

(56) References Cited

U.S. PATENT DOCUMENTS

| | | |
|---|---|---|
| 2011/0302518 A1 | 12/2011 | Zhang |
| 2011/0304577 A1 | 12/2011 | Brown |
| 2011/0304815 A1 | 12/2011 | Newell |
| 2011/0304962 A1 | 12/2011 | Su |
| 2011/0305875 A1 | 12/2011 | Sanford et al. |
| 2011/0306424 A1 | 12/2011 | Kazama et al. |
| 2011/0310038 A1 | 12/2011 | Park et al. |
| 2011/0310548 A1 | 12/2011 | Ahn et al. |
| 2011/0314425 A1 | 12/2011 | Chiang |
| 2011/0316807 A1 | 12/2011 | Corrion |
| 2011/0317399 A1 | 12/2011 | Hsu |
| 2011/0320204 A1 | 12/2011 | Locker et al. |
| 2012/0002052 A1 | 1/2012 | Muramatsu et al. |
| 2012/0002820 A1 | 1/2012 | Leichter |
| 2012/0007821 A1 | 1/2012 | Zaliva |
| 2012/0008015 A1 | 1/2012 | Manabe |
| 2012/0011462 A1 | 1/2012 | Westerman et al. |
| 2012/0013490 A1 | 1/2012 | Pance |
| 2012/0013519 A1 | 1/2012 | Hakansson et al. |
| 2012/0019165 A1 | 1/2012 | Igaki et al. |
| 2012/0019686 A1 | 1/2012 | Manabe |
| 2012/0020112 A1 | 1/2012 | Fisher et al. |
| 2012/0020490 A1 | 1/2012 | Leichter |
| 2012/0020556 A1 | 1/2012 | Manabe |
| 2012/0021618 A1 | 1/2012 | Schultz |
| 2012/0023401 A1 | 1/2012 | Arscott et al. |
| 2012/0023459 A1 | 1/2012 | Westerman |
| 2012/0024682 A1 | 2/2012 | Huang et al. |
| 2012/0026048 A1 | 2/2012 | Vazquez et al. |
| 2012/0026096 A1 | 2/2012 | Ku |
| 2012/0026110 A1 | 2/2012 | Yamano |
| 2012/0032887 A1 | 2/2012 | Chiu et al. |
| 2012/0032891 A1 | 2/2012 | Parivar |
| 2012/0032901 A1 | 2/2012 | Kwon |
| 2012/0032917 A1 | 2/2012 | Yamaguchi |
| 2012/0033369 A1 | 2/2012 | Wu et al. |
| 2012/0038495 A1 | 2/2012 | Ishikawa |
| 2012/0044140 A1 | 2/2012 | Koyama et al. |
| 2012/0044179 A1 | 2/2012 | Hudson |
| 2012/0044379 A1 | 2/2012 | Manabe |
| 2012/0047368 A1 | 2/2012 | Chinn et al. |
| 2012/0050975 A1 | 3/2012 | Garelli et al. |
| 2012/0062564 A1 | 3/2012 | Miyashita |
| 2012/0062850 A1 | 3/2012 | Travis |
| 2012/0068919 A1 | 3/2012 | Lauder et al. |
| 2012/0069540 A1 | 3/2012 | Lauder et al. |
| 2012/0071008 A1 | 3/2012 | Sessford |
| 2012/0072167 A1 | 3/2012 | Cretella, Jr. et al. |
| 2012/0075249 A1 | 3/2012 | Hoch |
| 2012/0077384 A1 | 3/2012 | Bar-Niv et al. |
| 2012/0081316 A1 | 4/2012 | Sirpal et al. |
| 2012/0087078 A1 | 4/2012 | Medica et al. |
| 2012/0092279 A1 | 4/2012 | Martin |
| 2012/0094257 A1 | 4/2012 | Pillischer et al. |
| 2012/0099263 A1 | 4/2012 | Lin |
| 2012/0099749 A1 | 4/2012 | Rubin et al. |
| 2012/0102438 A1 | 4/2012 | Robinson et al. |
| 2012/0103778 A1 | 5/2012 | Obata et al. |
| 2012/0105321 A1 | 5/2012 | Wang et al. |
| 2012/0106082 A1 | 5/2012 | Wu et al. |
| 2012/0113031 A1 | 5/2012 | Lee et al. |
| 2012/0113137 A1 | 5/2012 | Nomoto |
| 2012/0113223 A1 | 5/2012 | Hilliges et al. |
| 2012/0113579 A1 | 5/2012 | Agata et al. |
| 2012/0115553 A1 | 5/2012 | Mahe et al. |
| 2012/0117409 A1 | 5/2012 | Lee et al. |
| 2012/0127118 A1 | 5/2012 | Nolting et al. |
| 2012/0127126 A1 | 5/2012 | Mattice et al. |
| 2012/0127573 A1 | 5/2012 | Robinson et al. |
| 2012/0133561 A1 | 5/2012 | Konanur et al. |
| 2012/0133797 A1 | 5/2012 | Sato et al. |
| 2012/0139727 A1 | 6/2012 | Houvener et al. |
| 2012/0140396 A1 | 6/2012 | Zeliff et al. |
| 2012/0145525 A1 | 6/2012 | Ishikawa |
| 2012/0146943 A1 | 6/2012 | Fairley et al. |
| 2012/0155015 A1 | 6/2012 | Govindasamy et al. |
| 2012/0156875 A1 | 6/2012 | Srinivas et al. |
| 2012/0161406 A1 | 6/2012 | Mersky |
| 2012/0162088 A1 | 6/2012 | van Lieshout et al. |
| 2012/0162126 A1 | 6/2012 | Yuan et al. |
| 2012/0162693 A1 | 6/2012 | Ito |
| 2012/0162889 A1 | 6/2012 | Han |
| 2012/0170284 A1 | 7/2012 | Shedletsky |
| 2012/0175487 A1 | 7/2012 | Goto |
| 2012/0182242 A1 | 7/2012 | Lindahl et al. |
| 2012/0182249 A1 | 7/2012 | Endo et al. |
| 2012/0182743 A1 | 7/2012 | Chou |
| 2012/0185803 A1 | 7/2012 | Wang et al. |
| 2012/0188791 A1 | 7/2012 | Voloschenko et al. |
| 2012/0194393 A1 | 8/2012 | Utterman et al. |
| 2012/0194448 A1 | 8/2012 | Rothkopf |
| 2012/0195063 A1 | 8/2012 | Kim et al. |
| 2012/0200532 A1 | 8/2012 | Powell et al. |
| 2012/0200802 A1 | 8/2012 | Large |
| 2012/0206937 A1 | 8/2012 | Travis et al. |
| 2012/0212438 A1 | 8/2012 | Vaisanen |
| 2012/0218194 A1 | 8/2012 | Silverman |
| 2012/0221877 A1 | 8/2012 | Prabu |
| 2012/0223866 A1 | 9/2012 | Ayala Vazquez et al. |
| 2012/0224073 A1 | 9/2012 | Miyahara |
| 2012/0227259 A1 | 9/2012 | Badaye et al. |
| 2012/0229634 A1 | 9/2012 | Laett et al. |
| 2012/0235635 A1 | 9/2012 | Sato |
| 2012/0235790 A1 | 9/2012 | Zhao et al. |
| 2012/0235921 A1 | 9/2012 | Laubach |
| 2012/0242584 A1 | 9/2012 | Tuli |
| 2012/0243102 A1 | 9/2012 | Takeda et al. |
| 2012/0243165 A1 | 9/2012 | Chang et al. |
| 2012/0243204 A1 | 9/2012 | Robinson |
| 2012/0246377 A1 | 9/2012 | Bhesania |
| 2012/0249443 A1 | 10/2012 | Anderson et al. |
| 2012/0250873 A1 | 10/2012 | Bakalos et al. |
| 2012/0256829 A1 | 10/2012 | Dodge |
| 2012/0256959 A1 | 10/2012 | Ye et al. |
| 2012/0260177 A1 | 10/2012 | Sehrer |
| 2012/0268911 A1 | 10/2012 | Lin |
| 2012/0268912 A1 | 10/2012 | Minami et al. |
| 2012/0274811 A1 | 11/2012 | Bakin |
| 2012/0278744 A1 | 11/2012 | Kozitsyn et al. |
| 2012/0284297 A1 | 11/2012 | Aguera-Arcas et al. |
| 2012/0287562 A1 | 11/2012 | Wu et al. |
| 2012/0298491 A1 | 11/2012 | Ozias et al. |
| 2012/0299872 A1 | 11/2012 | Nishikawa et al. |
| 2012/0300275 A1 | 11/2012 | Vilardell et al. |
| 2012/0306747 A1 | 12/2012 | Davidson et al. |
| 2012/0312955 A1 | 12/2012 | Randolph |
| 2012/0323933 A1 | 12/2012 | He et al. |
| 2012/0326003 A1 | 12/2012 | Solow et al. |
| 2012/0328349 A1 | 12/2012 | Isaac et al. |
| 2013/0002562 A1 | 1/2013 | Leskela et al. |
| 2013/0009413 A1 | 1/2013 | Chiu et al. |
| 2013/0015311 A1 | 1/2013 | Kim |
| 2013/0016468 A1 | 1/2013 | Oh |
| 2013/0017696 A1 | 1/2013 | Alvarez Rivera |
| 2013/0021289 A1 | 1/2013 | Chen et al. |
| 2013/0027354 A1 | 1/2013 | Yabuta et al. |
| 2013/0027356 A1 | 1/2013 | Nishida |
| 2013/0027867 A1 | 1/2013 | Lauder et al. |
| 2013/0031353 A1 | 1/2013 | Noro |
| 2013/0038541 A1 | 2/2013 | Bakker |
| 2013/0044059 A1 | 2/2013 | Fu |
| 2013/0044074 A1 | 2/2013 | Park et al. |
| 2013/0046397 A1 | 2/2013 | Fadell et al. |
| 2013/0063873 A1 | 3/2013 | Wodrich et al. |
| 2013/0067126 A1 | 3/2013 | Casparian et al. |
| 2013/0067259 A1 | 3/2013 | Freiwald et al. |
| 2013/0073877 A1 | 3/2013 | Radke |
| 2013/0076614 A1 | 3/2013 | Ive et al. |
| 2013/0076617 A1 | 3/2013 | Csaszar et al. |
| 2013/0076635 A1 | 3/2013 | Lin |
| 2013/0082824 A1 | 4/2013 | Colley |
| 2013/0083466 A1 | 4/2013 | Becze et al. |
| 2013/0088431 A1 | 4/2013 | Ballagas et al. |

(56) References Cited

U.S. PATENT DOCUMENTS

| | | |
|---|---|---|
| 2013/0093679 A1* | 4/2013 | Dickinson ............... G06F 3/016 345/168 |
| 2013/0094131 A1 | 4/2013 | O'Donnell et al. |
| 2013/0100008 A1 | 4/2013 | Marti et al. |
| 2013/0100030 A1 | 4/2013 | Los et al. |
| 2013/0100082 A1 | 4/2013 | Bakin et al. |
| 2013/0106766 A1 | 5/2013 | Yilmaz et al. |
| 2013/0106813 A1 | 5/2013 | Hotelling et al. |
| 2013/0107144 A1 | 5/2013 | Marhefka et al. |
| 2013/0107572 A1 | 5/2013 | Holman et al. |
| 2013/0118878 A1 | 5/2013 | Purcocks |
| 2013/0120466 A1 | 5/2013 | Chen et al. |
| 2013/0120760 A1 | 5/2013 | Raguin et al. |
| 2013/0127980 A1 | 5/2013 | Haddik et al. |
| 2013/0128102 A1 | 5/2013 | Yano |
| 2013/0135214 A1 | 5/2013 | Li et al. |
| 2013/0151944 A1 | 6/2013 | Lin |
| 2013/0154959 A1 | 6/2013 | Lindsay et al. |
| 2013/0155723 A1 | 6/2013 | Coleman |
| 2013/0159749 A1 | 6/2013 | Moeglein et al. |
| 2013/0162554 A1 | 6/2013 | Lauder et al. |
| 2013/0172906 A1 | 7/2013 | Olson et al. |
| 2013/0181926 A1 | 7/2013 | Lim |
| 2013/0182246 A1 | 7/2013 | Tanase |
| 2013/0187753 A1 | 7/2013 | Chiriyankandath |
| 2013/0191741 A1 | 7/2013 | Dickinson et al. |
| 2013/0201094 A1 | 8/2013 | Travis |
| 2013/0207896 A1 | 8/2013 | Robinson et al. |
| 2013/0207937 A1 | 8/2013 | Lutian et al. |
| 2013/0212483 A1 | 8/2013 | Brakensiek et al. |
| 2013/0215035 A1 | 8/2013 | Guard |
| 2013/0217451 A1 | 8/2013 | Komiyama et al. |
| 2013/0222272 A1 | 8/2013 | Martin, Jr. |
| 2013/0222274 A1 | 8/2013 | Mori et al. |
| 2013/0222275 A1 | 8/2013 | Byrd et al. |
| 2013/0222323 A1 | 8/2013 | McKenzie |
| 2013/0222353 A1 | 8/2013 | Large |
| 2013/0222681 A1 | 8/2013 | Wan |
| 2013/0226794 A1 | 8/2013 | Englebardt |
| 2013/0227836 A1 | 9/2013 | Whitt, III |
| 2013/0228023 A1 | 9/2013 | Drasnin |
| 2013/0228433 A1 | 9/2013 | Shaw |
| 2013/0228434 A1 | 9/2013 | Whitt, III |
| 2013/0228435 A1 | 9/2013 | Whitt, III |
| 2013/0228439 A1 | 9/2013 | Whitt, III |
| 2013/0229100 A1 | 9/2013 | Siddiqui et al. |
| 2013/0229335 A1 | 9/2013 | Whitman |
| 2013/0229347 A1 | 9/2013 | Lutz, III |
| 2013/0229350 A1 | 9/2013 | Shaw et al. |
| 2013/0229351 A1 | 9/2013 | Whitt, III |
| 2013/0229354 A1 | 9/2013 | Whitt, III et al. |
| 2013/0229356 A1 | 9/2013 | Marwah |
| 2013/0229357 A1 | 9/2013 | Powell |
| 2013/0229363 A1 | 9/2013 | Whitman |
| 2013/0229366 A1 | 9/2013 | Dighde |
| 2013/0229380 A1 | 9/2013 | Lutz, III |
| 2013/0229386 A1 | 9/2013 | Bathiche |
| 2013/0229534 A1 | 9/2013 | Panay |
| 2013/0229568 A1 | 9/2013 | Belesiu et al. |
| 2013/0229570 A1 | 9/2013 | Beck et al. |
| 2013/0229756 A1 | 9/2013 | Whitt, III |
| 2013/0229757 A1 | 9/2013 | Whitt, III et al. |
| 2013/0229758 A1 | 9/2013 | Belesiu |
| 2013/0229759 A1 | 9/2013 | Whitt, III et al. |
| 2013/0229760 A1 | 9/2013 | Whitt, III et al. |
| 2013/0229761 A1 | 9/2013 | Shaw |
| 2013/0229762 A1 | 9/2013 | Whitt, III |
| 2013/0229773 A1 | 9/2013 | Siddiqui et al. |
| 2013/0230346 A1 | 9/2013 | Shaw |
| 2013/0231755 A1 | 9/2013 | Perek |
| 2013/0232280 A1 | 9/2013 | Perek |
| 2013/0232348 A1 | 9/2013 | Oler |
| 2013/0232349 A1 | 9/2013 | Oler et al. |
| 2013/0232350 A1 | 9/2013 | Belesiu et al. |
| 2013/0232353 A1 | 9/2013 | Belesiu |
| 2013/0232571 A1 | 9/2013 | Belesiu |
| 2013/0232742 A1 | 9/2013 | Burnett et al. |
| 2013/0241860 A1 | 9/2013 | Ciesla et al. |
| 2013/0242495 A1 | 9/2013 | Bathiche et al. |
| 2013/0262886 A1 | 10/2013 | Nishimura |
| 2013/0265220 A1 | 10/2013 | Fleischmann et al. |
| 2013/0268897 A1 | 10/2013 | Li et al. |
| 2013/0278552 A1 | 10/2013 | Kamin-Lyndgaard |
| 2013/0283212 A1 | 10/2013 | Zhu et al. |
| 2013/0285922 A1 | 10/2013 | Alberth, Jr. et al. |
| 2013/0300590 A1 | 11/2013 | Dietz |
| 2013/0300647 A1 | 11/2013 | Drasnin |
| 2013/0301199 A1 | 11/2013 | Whitt |
| 2013/0301206 A1 | 11/2013 | Whitt |
| 2013/0304941 A1 | 11/2013 | Drasnin |
| 2013/0304944 A1 | 11/2013 | Young |
| 2013/0307935 A1 | 11/2013 | Rappel et al. |
| 2013/0308339 A1 | 11/2013 | Woodgate et al. |
| 2013/0321992 A1 | 12/2013 | Liu et al. |
| 2013/0322000 A1 | 12/2013 | Whitt |
| 2013/0322001 A1 | 12/2013 | Whitt |
| 2013/0328761 A1 | 12/2013 | Boulanger |
| 2013/0329301 A1 | 12/2013 | Travis |
| 2013/0329360 A1 | 12/2013 | Aldana |
| 2013/0332628 A1 | 12/2013 | Panay |
| 2013/0335330 A1 | 12/2013 | Lane |
| 2013/0335387 A1 | 12/2013 | Emerton |
| 2013/0335902 A1 | 12/2013 | Campbell |
| 2013/0335903 A1 | 12/2013 | Raken |
| 2013/0339757 A1 | 12/2013 | Reddy |
| 2013/0342464 A1 | 12/2013 | Bathiche et al. |
| 2013/0342465 A1 | 12/2013 | Bathiche |
| 2013/0342976 A1 | 12/2013 | Chung |
| 2013/0346636 A1 | 12/2013 | Bathiche |
| 2013/0346882 A1 | 12/2013 | Shiplacoff et al. |
| 2014/0012401 A1 | 1/2014 | Perek et al. |
| 2014/0022629 A1 | 1/2014 | Powell |
| 2014/0043275 A1 | 2/2014 | Whitman |
| 2014/0048399 A1 | 2/2014 | Whitt, III |
| 2014/0049894 A1 | 2/2014 | Rihn |
| 2014/0053108 A1 | 2/2014 | Johansson |
| 2014/0055624 A1 | 2/2014 | Gaines |
| 2014/0063198 A1 | 3/2014 | Boulanger |
| 2014/0078063 A1 | 3/2014 | Bathiche |
| 2014/0083883 A1 | 3/2014 | Elias |
| 2014/0085814 A1 | 3/2014 | Kielland |
| 2014/0098085 A1 | 4/2014 | Lee |
| 2014/0118241 A1 | 5/2014 | Chai |
| 2014/0119802 A1 | 5/2014 | Shaw |
| 2014/0123273 A1 | 5/2014 | Matus |
| 2014/0125864 A1 | 5/2014 | Rihn |
| 2014/0131000 A1 | 5/2014 | Bornemann et al. |
| 2014/0132550 A1 | 5/2014 | McCracken et al. |
| 2014/0135060 A1 | 5/2014 | Mercer |
| 2014/0139989 A1 | 5/2014 | Mori et al. |
| 2014/0148938 A1 | 5/2014 | Zhang |
| 2014/0154523 A1 | 6/2014 | Bornemann |
| 2014/0166227 A1 | 6/2014 | Bornemann |
| 2014/0167585 A1 | 6/2014 | Kuan et al. |
| 2014/0168131 A1 | 6/2014 | Rihn |
| 2014/0185215 A1 | 7/2014 | Whitt |
| 2014/0185220 A1 | 7/2014 | Whitt |
| 2014/0204514 A1 | 7/2014 | Whitt |
| 2014/0204515 A1 | 7/2014 | Whitt |
| 2014/0221098 A1 | 8/2014 | Boulanger |
| 2014/0247546 A1 | 9/2014 | Whitt |
| 2014/0291134 A1 | 10/2014 | Whitt |
| 2014/0293534 A1 | 10/2014 | Siddiqui |
| 2014/0313665 A1 | 10/2014 | Delpier et al. |
| 2014/0362506 A1 | 12/2014 | Whitt, III et al. |
| 2014/0372914 A1 | 12/2014 | Byrd et al. |
| 2014/0374230 A1 | 12/2014 | Shaw et al. |
| 2015/0005953 A1 | 1/2015 | Fadell et al. |
| 2015/0022995 A1 | 1/2015 | Peterson et al. |
| 2015/0036274 A1 | 2/2015 | Belesui et al. |
| 2015/0227212 A1 | 8/2015 | Whitt, III et al. |
| 2015/0234478 A1 | 8/2015 | Belesui et al. |

(56) References Cited

U.S. PATENT DOCUMENTS

| | | |
|---|---|---|
| 2015/0261262 A1 | 9/2015 | Whitt, III et al. |
| 2015/0311014 A1 | 10/2015 | Shaw et al. |
| 2015/0378392 A1* | 12/2015 | Siddiqui .............. G06F 1/1618 361/679.27 |
| 2016/0034424 A1 | 2/2016 | Won |
| 2016/0034695 A1 | 2/2016 | Won et al. |
| 2016/0037481 A1 | 2/2016 | Won et al. |
| 2016/0124467 A1 | 5/2016 | Whitt et al. |
| 2016/0170935 A1 | 6/2016 | Drasnin |
| 2016/0209884 A1 | 7/2016 | Whitt et al. |
| 2016/0299537 A1 | 10/2016 | Whitt et al. |
| 2016/0306396 A1 | 10/2016 | Bathiche et al. |

FOREIGN PATENT DOCUMENTS

| | | |
|---|---|---|
| CN | 1352767 | 6/2002 |
| CN | 1394119 | 1/2003 |
| CN | 1440513 | 9/2003 |
| CN | 1467615 | 1/2004 |
| CN | 1489031 | 4/2004 |
| CN | 1515937 | 7/2004 |
| CN | 1537223 | 10/2004 |
| CN | 1607418 | 4/2005 |
| CN | 1650202 | 8/2005 |
| CN | 1653411 | 8/2005 |
| CN | 1700072 | 11/2005 |
| CN | 1787605 | 6/2006 |
| CN | 1808362 | 7/2006 |
| CN | 1920642 | 2/2007 |
| CN | 101038401 | 9/2007 |
| CN | 101072366 | 11/2007 |
| CN | 101198925 | 6/2008 |
| CN | 101335147 | 12/2008 |
| CN | 101366001 | 2/2009 |
| CN | 101410781 | 4/2009 |
| CN | 101452334 | 6/2009 |
| CN | 101464750 | 6/2009 |
| CN | 101473167 | 7/2009 |
| CN | 101490642 | 7/2009 |
| CN | 101500388 | 8/2009 |
| CN | 101512403 | 8/2009 |
| CN | 101644979 | 2/2010 |
| CN | 101675406 | 3/2010 |
| CN | 101681189 | 3/2010 |
| CN | 101688991 | 3/2010 |
| CN | 101765825 | 6/2010 |
| CN | 101889225 | 11/2010 |
| CN | 101893785 | 11/2010 |
| CN | 101904661 | 12/2010 |
| CN | 101908428 | 12/2010 |
| CN | 101933082 | 12/2010 |
| CN | 102004559 | 4/2011 |
| CN | 102004577 | 4/2011 |
| CN | 102012772 | 4/2011 |
| CN | 1102012763 | 4/2011 |
| CN | 102096494 | 6/2011 |
| CN | 102112947 | 6/2011 |
| CN | 201853163 | 6/2011 |
| CN | 102117121 | 7/2011 |
| CN | 102124532 | 7/2011 |
| CN | 102138113 | 7/2011 |
| CN | 102147643 | 8/2011 |
| CN | 102156510 | 8/2011 |
| CN | 201936231 | 8/2011 |
| CN | 102214040 | 10/2011 |
| CN | 102292687 | 12/2011 |
| CN | 202119579 | 1/2012 |
| CN | 102339683 | 2/2012 |
| CN | 102356624 | 2/2012 |
| CN | 202441167 | 9/2012 |
| CN | 102778956 | 11/2012 |
| CN | 103455149 | 12/2013 |
| CN | 203480365 | 3/2014 |
| CN | 203606723 | 5/2014 |
| DE | 19924694 | 3/2001 |
| DE | 10116556 | 10/2002 |
| EP | 0271956 | 6/1988 |
| EP | 645726 | 3/1995 |
| EP | 1003188 | 5/2000 |
| EP | 1223722 | 7/2002 |
| EP | 1425763 | 6/2004 |
| EP | 1480029 | 11/2004 |
| EP | 1591891 | 11/2005 |
| EP | 1983411 | 10/2008 |
| EP | 2006869 | 12/2008 |
| EP | 2009660 | 12/2008 |
| EP | 2026178 | 2/2009 |
| EP | 2207076 | 7/2010 |
| EP | 2353978 | 8/2011 |
| EP | 2378607 | 10/2011 |
| EP | 2381290 | 10/2011 |
| EP | 2400365 | 12/2011 |
| EP | 2410408 | 1/2012 |
| EP | 2423787 | 2/2012 |
| EP | 2618247 | 7/2013 |
| GB | 2068643 | 8/1981 |
| GB | 2123213 | 1/1984 |
| GB | 2178570 | 2/1987 |
| GB | 2305780 | 4/1997 |
| GB | 2381584 | 5/2003 |
| GB | 2402460 | 12/2004 |
| GB | 2410116 | 7/2005 |
| GB | 2428101 | 1/2007 |
| GB | 2482932 | 2/2012 |
| JP | 52107722 | 9/1977 |
| JP | 56108127 | 8/1981 |
| JP | S57126617 | 8/1982 |
| JP | S5810335 | 1/1983 |
| JP | S593824 | 1/1984 |
| JP | 6014315 | 1/1985 |
| JP | S6037923 | 8/1985 |
| JP | S60216479 | 10/1985 |
| JP | H0245820 | 2/1990 |
| JP | 4363823 | 12/1992 |
| JP | 04363823 | 12/1992 |
| JP | 06250761 | 9/1994 |
| JP | H07218865 | 8/1995 |
| JP | 08273471 | 10/1996 |
| JP | H0980354 | 3/1997 |
| JP | H09178949 | 7/1997 |
| JP | H104540 | 1/1998 |
| JP | H1078357 | 3/1998 |
| JP | H10234057 | 9/1998 |
| JP | 10301055 | 11/1998 |
| JP | 10326124 | 12/1998 |
| JP | 1173239 | 3/1999 |
| JP | H11248557 | 9/1999 |
| JP | 11338575 | 12/1999 |
| JP | 2000010654 | 1/2000 |
| JP | 2000035849 | 2/2000 |
| JP | 2000106021 | 4/2000 |
| JP | 2001142564 | 5/2001 |
| JP | 2001174746 | 6/2001 |
| JP | 2002100226 | 4/2002 |
| JP | 2002162912 | 6/2002 |
| JP | 2002170458 | 6/2002 |
| JP | 2002300438 | 10/2002 |
| JP | 2002358852 | 12/2002 |
| JP | 2002366277 | 12/2002 |
| JP | 2003215349 | 7/2003 |
| JP | 2004038950 | 2/2004 |
| JP | 2004171948 | 6/2004 |
| JP | 3602207 | 12/2004 |
| JP | 2005031555 | 2/2005 |
| JP | 2005077437 | 3/2005 |
| JP | 2005078104 | 3/2005 |
| JP | 2005117161 | 4/2005 |
| JP | 2005156932 | 5/2005 |
| JP | 2005331565 | 12/2005 |
| JP | 2006004877 | 1/2006 |
| JP | 2006093461 | 4/2006 |
| JP | 2006160155 | 6/2006 |
| JP | 2006163459 | 6/2006 |

(56) References Cited

FOREIGN PATENT DOCUMENTS

| | | |
|---|---|---|
| JP | 2006266812 | 10/2006 |
| JP | 2006278251 | 10/2006 |
| JP | 2006294361 | 10/2006 |
| JP | 2006310269 | 11/2006 |
| JP | 2007184286 | 7/2007 |
| JP | 2007273288 | 10/2007 |
| JP | 2008066152 | 3/2008 |
| JP | 2008152805 | 7/2008 |
| JP | 2008286874 | 7/2008 |
| JP | 2008529251 | 7/2008 |
| JP | 2009003053 | 1/2009 |
| JP | 2009059583 | 3/2009 |
| JP | 2009122551 | 6/2009 |
| JP | 2010151951 | 7/2010 |
| JP | 2010244514 | 10/2010 |
| JP | 2003077368 | 3/2014 |
| KR | 20010039013 | 5/2001 |
| KR | 20010107055 | 12/2001 |
| KR | 20040066647 | 7/2004 |
| KR | 20050014299 | 2/2005 |
| KR | 20060003093 | 1/2006 |
| KR | 20080006404 | 1/2008 |
| KR | 20080009490 | 1/2008 |
| KR | 20080055051 | 6/2008 |
| KR | 20090029411 | 3/2009 |
| KR | 20100022059 | 2/2010 |
| KR | 20100067366 | 6/2010 |
| KR | 20100115675 | 10/2010 |
| KR | 20110064265 | 6/2011 |
| KR | 102011008718 | 8/2011 |
| KR | 20110109791 | 10/2011 |
| KR | 20110120002 | 11/2011 |
| KR | 20110122333 | 11/2011 |
| KR | 101113530 | 2/2012 |
| NL | 1038411 | 5/2012 |
| WO | WO-9108915 | 6/1991 |
| WO | WO-9919995 | 4/1999 |
| WO | WO-9964784 | 12/1999 |
| WO | WO-0072079 | 11/2000 |
| WO | WO-0079327 | 12/2000 |
| WO | WO-0128309 | 4/2001 |
| WO | WO-0172037 | 9/2001 |
| WO | WO-03048635 | 6/2003 |
| WO | WO-03083530 | 9/2003 |
| WO | WO-03106134 | 12/2003 |
| WO | WO-2005027696 | 3/2005 |
| WO | WO-2005059874 | 6/2005 |
| WO | WO-2006044818 | 4/2006 |
| WO | WO-2006082444 | 8/2006 |
| WO | WO-2007094304 | 8/2007 |
| WO | WO-2007103631 | 9/2007 |
| WO | WO-2007112172 | 10/2007 |
| WO | WO-2007123202 | 11/2007 |
| WO | WO-2008013146 | 1/2008 |
| WO | WO-2008038016 | 4/2008 |
| WO | WO-2008055039 | 5/2008 |
| WO | WO-2008117529 | 10/2008 |
| WO | WO-2009034484 | 3/2009 |
| WO | WO-2010011983 | 1/2010 |
| WO | WO-2010074116 | 7/2010 |
| WO | WO-2010105272 | 9/2010 |
| WO | WO-2010147609 | 12/2010 |
| WO | WO-2011016200 | 2/2011 |
| WO | WO-2011049609 | 4/2011 |
| WO | WO-2011071096 | 6/2011 |
| WO | WO-2011138200 | 11/2011 |
| WO | WO-2012036717 | 3/2012 |
| WO | WO-2012063410 | 5/2012 |
| WO | WO-2012174364 | 12/2012 |
| WO | WO-2013012699 | 1/2013 |
| WO | WO-2013033067 | 3/2013 |
| WO | WO-2013033274 | 3/2013 |
| WO | WO-2013163347 | 10/2013 |
| WO | WO-2014209818 | 12/2014 |

OTHER PUBLICATIONS

"ACPI Docking for Windows Operating Systems", Retrieved from: <http://www.scritube.com/limba/engleza/software/ACPI-Docking-for-Windows-Opera331824193.php> on Jul. 6, 2012, 2012, 10 pages.

"Advanced Configuration and Power Management Specification", Intel Corporation, Microsoft Corporation, Toshiba Corp. Revision 1, Dec. 22, 1996, 364 pages.

"Advisory Action", U.S. Appl. No. 13/939,032, Feb. 24, 2014, 2 pages.

"Advisory Action", U.S. Appl. No. 14/199,924, May 28, 2014, 2 pages.

"Apple®—45W MagSafe 2 Power Adapter with Magnetic DC Connector -", Retrieved from <http://www.bestbuy.com/site/Apple%26%23174%3B---45W-MagSafe-2-Power-Adapter-with-Magnetic-DC-Connector/5856526.p?id=1218696408860&skuId=5856526#tab=overview> on May 14, 2013, 2013, 4 Pages.

"Basic Cam Motion Curves", Retrieved From: <http://ocw.metu.edu.tr/pluginfile.php/6886/mod_resource/content/1/ch8/8-3.htm> Nov. 22, 2013, Middle East Technical University,1999, 14 Pages.

"Can I Customize my Samsung Galaxy S® 4 Lock Screen? Which Features can I Access When the Device is Locked?", Retrieved From: <http://www.samsung.com/us/support/howtoguide/N0000006/10632/127767> Jul. 3, 2014, May 16, 2014, 12 Pages.

"Cholesteric Liquid Crystal", Retrieved from: <http://en.wikipedia.org/wiki/Cholesteric_liquid_crystal> on Aug. 6, 2012, Jun. 10, 2012, 2 pages.

"Cirago Slim Case®—Protective case with built-in kickstand for your iPhone 5®", Retrieved from <http://cirago.com/wordpress/wp-content/uploads/2012/10/ipc1500brochure1.pdf> on Jan. 29, 2013, Jan. 2013, 1 page.

"Controlling Your Desktop's Power Management", Retrieved From: <http://www.vorkon.de/SU1210.001/drittanbieter/Dokumentation/openSUSE_11.2/manual/sec.gnomeuser.start.power_mgmt.html> Jul. 7, 2014, 6 Pages.

"Corrected Notice of Allowance", U.S. Appl. No. 13/470,633, Apr. 9, 2013, 2 pages.

"Corrected Notice of Allowance", U.S. Appl. No. 13/470,633, Jul. 2, 2013, 2 pages.

"Corrected Notice of Allowance", U.S. Appl. No. 13/471,030, Sep. 30, 2014, 2 pages.

"Corrected Notice of Allowance", U.S. Appl. No. 13/494,651, Oct. 24, 2014, 2 pages.

"Corrected Notice of Allowance", U.S. Appl. No. 13/563,435, Jan. 14, 2014, 2 pages.

"Corrected Notice of Allowance", U.S. Appl. No. 13/563,435, Mar. 20, 2014, 2 pages.

"Corrected Notice of Allowance", U.S. Appl. No. 13/563,435, Jan. 22, 2014, 2 pages.

"Corrected Notice of Allowance", U.S. Appl. No. 13/565,124, Apr. 3, 2014, 4 pages.

"Corrected Notice of Allowance", U.S. Appl. No. 13/565,124, Mar. 10, 2014, 2 pages.

"Corrected Notice of Allowance", U.S. Appl. No. 13/565,124, Apr. 14, 2014, 2 pages.

"Corrected Notice of Allowance", U.S. Appl. No. 13/651,232, Jul. 31, 2014, 2 pages.

"Corrected Notice of Allowance", U.S. Appl. No. 13/651,287, Aug. 21, 2014, 2 pages.

"Corrected Notice of Allowance", U.S. Appl. No. 13/651,327, Sep. 12, 2013, 2 pages.

"Corrected Notice of Allowance", U.S. Appl. No. 13/651,327, Sep. 23, 2013, 2 pages.

"Corrected Notice of Allowance", U.S. Appl. No. 13/651,726, Sep. 17, 2013, 2 pages.

"Corrected Notice of Allowance", U.S. Appl. No. 13/656,520, Jan. 16, 2014, 3 pages.

"Corrected Notice of Allowance", U.S. Appl. No. 13/667,408, Jun. 24, 2014, 9 pages.

"Corrected Notice of Allowance", U.S. Appl. No. 13/715,133, Apr. 2, 2014, 2 pages.

(56) References Cited

OTHER PUBLICATIONS

"Corrected Notice of Allowance", U.S. Appl. No. 13/938,930, May 6, 2014, 2 pages.
"Corrected Notice of Allowance", U.S. Appl. No. 13/938,930, Jun. 6, 2014, 2 pages.
"Corrected Notice of Allowance", U.S. Appl. No. 13/939,002, May 22, 2014, 2 pages.
"Corrected Notice of Allowance", U.S. Appl. No. 13/939,002, Jun. 19, 2014, 2 pages.
"Corrected Notice of Allowance", U.S. Appl. No. 13/939,002, May 5, 2014, 2 pages.
"Corrected Notice of Allowance", U.S. Appl. No. 13/939,032, Jun. 26, 2014, 2 pages.
"Corrected Notice of Allowance", U.S. Appl. No. 13/939,032, Jul. 15, 2014, 2 pages.
"Corrected Notice of Allowance", U.S. Appl. No. 14/199,924, Aug. 29, 2014, 2 pages.
"Corrected Notice of Allowance", U.S. Appl. No. 14/199,924, Sep. 5, 2014, 2 pages.
"Corrected Notice of Allowance", U.S. Appl. No. 14/199,924, Sep. 19, 2014, 2 pages.
"Developing Next-Generation Human Interfaces using Capacitive and Infrared Proximity Sensing", Silicon Laboratories, Inc., Available at <http://www.silabs.com/pages/DownloadDoc.aspx?FILEURL=support%20documents/technicaldocs/capacitive%20and%20proximity%20sensing_wp.pdf&src=SearchResults>,Aug. 30, 2010, pp. 1-10.
"Directional Backlighting for Display Panels", U.S. Appl. No. 13/021,448, Feb. 4, 2011, 38 pages.
"DR2PA", retrieved from <http://www.architainment.co.uk/wp-content/uploads/2012/08/DR2PA-AU-US-size-Data-Sheet-Rev-H_LOGO.pdf> on Sep. 17, 2012, Jan. 2012, 4 pages.
"Edwards 1508 Series Surface Wall Mount Electromagnetic Door Holder", Edwards Signaling, retrieved from <http://www.thesignalsource.com/documents/1508.pdf>, 2000, 1 page.
"EP Search Report", EP Application No. 09812072.8, Apr. 5, 2012, 6 Pages.
"Final Office Action", U.S. Appl. No. 12/163,614, Nov. 8, 2012, 15 pages.
"Final Office Action", U.S. Appl. No. 12/163,614, Aug. 19, 2011, 15 pages.
"Final Office Action", U.S. Appl. No. 13/021,448, Jan. 16, 2014, 33 Pages.
"Final Office Action", U.S. Appl. No. 13/371,725, Apr. 2, 2014, 22 pages.
"Final Office Action", U.S. Appl. No. 13/408,257, Mar. 28, 2014, 17 pages.
"Final Office Action", U.S. Appl. No. 13/468,949, Oct. 6, 2014, 11 pages.
"Final Office Action", U.S. Appl. No. 13/471,001, Jul. 25, 2013, 20 pages.
"Final Office Action", U.S. Appl. No. 13/471,054, Oct. 23, 2014, 17 pages.
"Final Office Action", U.S. Appl. No. 13/471,139, Sep. 16, 2013, 13 pages.
"Final Office Action", U.S. Appl. No. 13/471,336, Aug. 28, 2013, 18 pages.
"Final Office Action", U.S. Appl. No. 13/471,336, Oct. 6, 2014, 13 pages.
"Final Office Action", U.S. Appl. No. 13/471,376, Aug. 18, 2014, 24 pages.
"Final Office Action", U.S. Appl. No. 13/494,651, Jun. 11, 2014, 19 pages.
"Final Office Action", U.S. Appl. No. 13/525,070, Apr. 24, 2014, 21 pages.
"Final Office Action", U.S. Appl. No. 13/564,520, Jan. 15, 2014, 7 pages.
"Final Office Action", U.S. Appl. No. 13/595,700, Aug. 15, 2014, 6 pages.
"Final Office Action", U.S. Appl. No. 13/595,700, Oct. 9, 2014, 8 pages.
"Final Office Action", U.S. Appl. No. 13/599,635, Aug. 8, 2014, 16 pages.
"Final Office Action", U.S. Appl. No. 13/603,918, Mar. 21, 2014, 14 pages.
"Final Office Action", U.S. Appl. No. 13/651,195, Apr. 18, 2013, 13 pages.
"Final Office Action", U.S. Appl. No. 13/651,232, May 21, 2013, 21 pages.
"Final Office Action", U.S. Appl. No. 13/651,287, May 3, 2013, 16 pages.
"Final Office Action", U.S. Appl. No. 13/651,976, Jul. 25, 2013, 21 pages.
"Final Office Action", U.S. Appl. No. 13/653,321, Aug. 2, 2013, 17 pages.
"Final Office Action", U.S. Appl. No. 13/653,682, Jun. 11, 2014, 11 pages.
"Final Office Action", U.S. Appl. No. 13/653,682, Oct. 18, 2013, 16 pages.
"Final Office Action", U.S. Appl. No. 13/655,065, Aug. 8, 2014, 20 pages.
"Final Office Action", U.S. Appl. No. 13/656,055, Sep. 17, 2014, 10 pages.
"Final Office Action", U.S. Appl. No. 13/656,055, Oct. 23, 2013, 14 pages.
"Final Office Action", U.S. Appl. No. 13/780,228, Mar. 28, 2014, 13 pages.
"Final Office Action", U.S. Appl. No. 13/938,930, Nov. 8, 2013, 10 pages.
"Final Office Action", U.S. Appl. No. 13/939,002, Nov. 8, 2013, 7 pages.
"Final Office Action", U.S. Appl. No. 13/939,032, Dec. 20, 2013, 5 pages.
"Final Office Action", U.S. Appl. No. 14/063,912, Apr. 29, 2014, 10 pages.
"Final Office Action", U.S. Appl. No. 14/199,924, May 6, 2014, 5 pages.
"FingerWorks Installation and Operation Guide for the TouchStream ST and TouchStream LP", FingerWorks, Inc. Retrieved from <http://ec1.images-amazon.com/media/i3d/01/A/man-migrate/MANUAL000049862.pdf>, 2002, 14 pages.
"First One Handed Fabric Keyboard with Bluetooth Wireless Technology", Retrieved from: <http://press.xtvworld.com/article3817.html> on May 8, 2012, Jan. 6, 2005, 2 pages.
"For Any Kind of Proceeding 2011 Springtime as Well as Coil Nailers as Well as Hotter Summer Season", Lady Shoe Worlds, retrieved from <http://www.ladyshoesworld.com/2011/09/18/for-any-kind-of-proceeding-2011-springtime-as-well-as-coil-nailers-as-well-as-hotter-summer-season/> on Nov. 3, 2011,Sep. 8, 2011, 2 pages.
"Force and Position Sensing Resistors: An Emerging Technology", Interlink Electronics, Available at <http://staff.science.uva.nl/~vlaander/docu/FSR/An_Exploring_Technology.pdf>,Feb. 1990, pp. 1-6.
"Foreign Notice of Allowance", CN Application No. 201320096755.7, Jan. 27, 2014, 2 pages.
"Foreign Notice of Allowance", CN Application No. 201320097065.3, Nov. 21, 2013, 2 pages.
"Foreign Office Action", CN Application No. 200980134848, May 13, 2013, 7 Pages.
"Foreign Office Action", CN Application No. 200980134848, May 31, 2012, 7 Pages.
"Foreign Office Action", CN Application No. 200980134848, Dec. 4, 2013, 8 Pages.
"Foreign Office Action", CN Application No. 200980134848, Dec. 19, 2012, 8 Pages.
"Foreign Office Action", CN Application No. 201080037117.7, Jul. 1, 2014, 9 Pages.
"Foreign Office Action", CN Application No. 201110272868.3, Apr. 1, 2013, 10 pages.
"Foreign Office Action", CN Application No. 201210023945.6, Jun. 25, 2014, 6 Pages.

(56) References Cited

OTHER PUBLICATIONS

"Foreign Office Action", CN Application No. 201320097065.3, Jun. 18, 2013, 2 pages.
"Foreign Office Action", CN Application No. 201320097066.8, Oct. 24, 2013, 5 Pages.
"Foreign Office Action", CN Application No. 201320097079.5, Sep. 26, 2013, 4 pages.
"Foreign Office Action", CN Application No. 201320328022.1, Feb. 17, 2014, 4 Pages.
"Foreign Office Action", CN Application No. 201320328022.1, Oct. 18, 2013, 3 Pages.
"Foreign Office Action", JP Application No. 2011-526118, Aug. 16, 2013, 8 Pages.
"Foreign Office Action", JP Application No. 2012-525632, May 2, 2014, 10 Pages.
"Foreign Office Action", JP Application No. 2012-525722, Apr. 22, 2014, 15 pages.
"Frogpad Introduces Weareable Fabric Keyboard with Bluetooth Technology", Retrieved from: <http://www.geekzone.co.nz/content.asp?contentid=3898> on May 7, 2012, Jan. 7, 2005, 3 pages.
"How to Use the iPad's Onscreen Keyboard", Retrieved from <http://www.dummies.com/how-to/content/how-to-use-the-ipads-onscreen-keyboard.html> on Aug. 28, 2012, 2012, 3 pages.
"i-Blason Spring Series Premium Flexible KickStand Anti-Slippery TPU Cover Case for iPhone 4 4S (White)", Retrieved From: <http://www.amazon.com/i-Blason-Premium-Flexible-KickStand-Anti-Slippery/dp/B007LCLXLU> Jun. 12, 2014, Nov. 30, 2012, 4 Pages.
"iControlPad 2—The open source controller", Retrieved from <http://www.kickstarter.com/projects/1703567677/icontrolpad-2-the-open-source-controller> on Nov. 20, 2012, 2012, 15 pages.
"i-Interactor electronic pen", Retrieved from: <http://www.alibaba.com/product-gs/331004878/i_Interactor_electronic_pen.html> on Jun. 19, 2012, 2012, 5 pages.
"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 2012, 4 pages.
"Interlink Electronics FSR (TM) Force Sensing Resistors (TM)", Retrieved at <<http://akizukidenshi.com/download/ds/interlinkelec/94-00004+Rev+B%20FSR%20Integration%20Guide.pdf on Mar. 21, 2013, 36 pages.
"International Search Report and Written Opinion", Application No. PCT/US2009/055250, Mar. 2, 2014, 10 Pages.
"International Search Report and Written Opinion", Application No. PCT/US2013/028479, Jun. 17, 2013, 10 pages.
"International Search Report and Written Opinion", Application No. PCT/US2014/031531, Jun. 20, 2014, 10 Pages.
"International Search Report and Written Opinion", Application No. PCT/US2013/028483, Jun. 24, 2014, 10 pages.
"International Search Report and Written Opinion", Application No. PCT/US2013/028484, Jun. 24, 2014, 10 pages.
"International Search Report and Written Opinion", Application No. PCT/US2013/028485, Jun. 25, 2014, 10 pages.
"International Search Report and Written Opinion", Application No. PCT/US2013/028769, Jun. 26, 2014, 10 pages.
"International Search Report and Written Opinion", Application No. PCT/US2014/043546, Oct. 9, 2014, 10 pages.
"International Search Report and Written Opinion", Application No. PCT/US2013/051421, Dec. 6, 2013, 10 pages.
"International Search Report and Written Opinion", Application No. PCT/US2013/065154, Feb. 5, 2014, 10 pages.
"International Search Report and Written Opinion", Application No. PCT/US2014/020050, May 9, 2014, 10 pages.
"International Search Report and Written Opinion", Application No. PCT/US2013/028771, Jun. 19, 2014, 10 pages.
"International Search Report and Written Opinion", Application No. PCT/US2013/028486, Jun. 20, 2014, 10 pages.
"International Search Report and Written Opinion", Application No. PCT/US2013/041017, Jul. 17, 2014, 10 pages.
"International Search Report and Written Opinion", Application No. PCT/US2013/028489, Jun. 20, 2014, 11 pages.
"International Search Report and Written Opinion", Application No. PCT/US2013/028488, Jun. 24, 2014, 11 pages.
"International Search Report and Written Opinion", Application No. PCT/US2013/028767, Jun. 24, 2014, 11 pages.
"International Search Report and Written Opinion", Application No. PCT/US2013/043961, Oct. 17, 2013, 11 pages.
"International Search Report and Written Opinion", Application No. PCT/US2013/053683, Nov. 28, 2013, 11 pages.
"International Search Report and Written Opinion", Application No. PCT/US2014/016654, May 16, 2014, 11 pages.
"International Search Report and Written Opinion", Application No. PCT/US2013/028481, Jun. 19, 2014, 11 pages.
"International Search Report and Written Opinion", Application No. PCT/US2013/028948, Jun. 21, 2013, 11 pages.
"International Search Report and Written Opinion", Application No. PCT/US2013/029461, Jun. 21, 2013, 11 pages.
"International Search Report and Written Opinion", Application No. PCT/US2013/028490, Jun. 24, 2014, 11 pages.
"International Search Report and Written Opinion", Application No. PCT/US2013/028766, Jun. 26, 2014, 11 pages.
"International Search Report and Written Opinion", Application No. PCT/US2013/028772, Jun. 30, 2014, 11 pages.
"International Search Report and Written Opinion", Application No. PCT/US2013/040968, Sep. 5, 2013, 11 pages.
"International Search Report and Written Opinion", Application No. PCT/US2013/067912, Feb. 13, 2014, 12 pages.
"International Search Report and Written Opinion", Application No. PCT/US2013/028768, Jun. 24, 2014, 12 pages.
"International Search Report and Written Opinion", Application No. PCT/US2013/075180, May 6, 2014, 12 pages.
"International Search Report and Written Opinion", Application No. PCT/US2013/044871, Aug. 14, 2013, 12 pages.
"International Search Report and Written Opinion", Application No. PCT/US2013/028482, Jun. 20, 2014, 13 pages.
"International Search Report and Written Opinion", Application No. PCT/US2014/014522, Jun. 6, 2014, 13 pages.
"International Search Report and Written Opinion", Application No. PCT/US2013/042550, Sep. 24, 2013, 14 pages.
"International Search Report and Written Opinion", Application No. PCT/US2014/013928, May 12, 2014, 17 pages.
"International Search Report and Written Opinion", Application No. PCT/US2013/045283, Mar. 12, 2014, 19 pages.
"International Search Report and Written Opinion", Application No. PCT/US2013/055679, Nov. 18, 2013, 8 pages.
"International Search Report and Written Opinion", Application No. PCT/US2011/050471, Apr. 9, 2012, 8 pages.
"International Search Report and Written Opinion", Application No. PCT/US2013/044873, Nov. 22, 2013, 9 pages.
"International Search Report and Written Opinion", Application No. PCT/US2013/063156, Dec. 5, 2013, 9 pages.
"International Search Report and Written Opinion", Application No. PCT/US2013/067905, Apr. 15, 2014, 9 pages.
"International Search Report and Written Opinion", Application No. PCT/US2013/028487, May 27, 2014, 9 pages.
"International Search Report and Written Opinion", Application No. PCT/US2013/028770, Jun. 26, 2014, 9 pages.
"International Search Report and Written Opinion", Application No. PCT/US2013/042790, Aug. 8, 2013, 9 pages.
"International Search Report and Written Opinion", Application No. PCT/US2013/045049, Sep. 16, 2013, 9 pages.
"International Search Report", Application No. PCT/US2010/045676, Apr. 28, 2011, 2 Pages.
"International Search Report", Application No. PCT/US2010/046129, Mar. 2, 2011, 3 Pages.
"Lock Screen Overview (Windows Runtime Apps)", Retrieved From: <http://msdn.microsoft.com/en-in/library/windows/apps/hh779720.aspx> Jul. 8, 2014, Dec. 31, 2012, 5 Pages.
"Magnetic Cell Phone Holder", Extreme Computing, retrieved from <http://www.extremecomputing.com/magnetholder.html> on May 7, 2008, 1 page.

(56) References Cited

OTHER PUBLICATIONS

"Membrane Keyboards & Membrane Keypads", Retrieved from: <http://www.pannam.org/> on May 9, 2012, Mar. 4, 2009, 2 pages.
"Microsoft Develops Glasses-Free Eye-Tracking 3D Display", Tech-FAQ—retrieved from <http://www.tech-faq.com/microsoft-develops-glasses-free-eye-tracking-3d-display.html> on Nov. 2, 2011, Nov. 2, 2011, 3 pages.
"Microsoft Reveals Futuristic 3D Virtual HoloDesk Patent", Retrieved from <http://www.patentbolt.com/2012/05/microsoft-reveals-futuristic-3d-virtual-holodesk-patent.htmlt> on May 28, 2012, May 23, 2012, 9 pages.
"Microsoft Tablet PC", Retrieved from <http://web.archive.org/web/20120622064335/https://en.wikipedia.org/wiki/Microsoft_Tablet_PC> on Jun. 4, 2014, Jun. 21, 2012, 9 pages.
"Molex:PCI Express Mini Card Connector, Right Angle, Low-Profile, Mid-Mount 0.80mm (.031") Pitch", Retrieved from <http://rhu004.sma-promail.com/SQLImages/kelmscott/Molex/PDF_Images/987650-4441.PDF> on Feb. 6, 2013, 2010, 3 pages.
"Motion Sensors", Android Developers—retrieved from <http://developer.android.com/guide/topics/sensors/sensors_motion.html> on May 25, 2012, 2012, 7 pages.
"MPC Fly Music Production Controller", AKAI Professional, Retrieved from: <http://www.akaiprompc.com/mpc-fly> on Jul. 9, 2012, 4 pages.
"NI Releases New Maschine & Maschine Mikro", Retrieved from <http://www.djbooth.net/index/dj-equipment/entry/ni-releases-new-maschine-mikro/> on Sep. 17, 2012, 19 pages.
"Non-Final Office Action", U.S. Appl. No. 13/409,967, Dec. 10, 2013, 5 pages.
"Non-Final Office Action", U.S. Appl. No. 13/599,635, Feb. 25, 2014, 13 pages.
"Non-Final Office Action", U.S. Appl. No. 12/163,614, Apr. 27, 2011, 15 pages.
"Non-Final Office Action", U.S. Appl. No. 12/163,614, May 24, 2012, 15 pages.
"Non-Final Office Action", U.S. Appl. No. 12/882,994, Feb. 1, 2013, 17 pages.
"Non-Final Office Action", U.S. Appl. No. 13/021,448, Jul. 22, 2014, 35 pages.
"Non-Final Office Action", U.S. Appl. No. 13/021,448, Dec. 13, 2012, 9 pages.
"Non-Final Office Action", U.S. Appl. No. 13/021,448, Aug. 16, 2013, 25 pages.
"Non-Final Office Action", U.S. Appl. No. 13/371,725, Nov. 7, 2013, 19 pages.
"Non-Final Office Action", U.S. Appl. No. 13/371,725, Nov. 3, 2014, 27 pages.
"Non-Final Office Action", U.S. Appl. No. 13/408,257, Jul. 2, 2014, 20 pages.
"Non-Final Office Action", U.S. Appl. No. 13/408,257, Dec. 5, 2013, 13 pages.
"Non-Final Office Action", U.S. Appl. No. 13/468,882, Jul. 9, 2014, 9 pages.
"Non-Final Office Action", U.S. Appl. No. 13/468,918, Dec. 26, 2013, 18 pages.
"Non-Final Office Action", U.S. Appl. No. 13/468,949, Jun. 20, 2014, 10 pages.
"Non-Final Office Action", U.S. Appl. No. 13/470,951, Jul. 2, 2014, 19 pages.
"Non-Final Office Action", U.S. Appl. No. 13/471,001, Feb. 19, 2013, 15 pages.
"Non-Final Office Action", U.S. Appl. No. 13/471,001, Jun. 17, 2014, 23 pages.
"Non-Final Office Action", U.S. Appl. No. 13/471,030, May 15, 2014, 10 pages.
"Non-Final Office Action", U.S. Appl. No. 13/471,054, Jun. 3, 2014, 15 pages.
"Non-Final Office Action", U.S. Appl. No. 13/471,139, Mar. 21, 2013, 12 pages.
"Non-Final Office Action", U.S. Appl. No. 13/471,186, Feb. 27, 2014, 8 pages.
"Non-Final Office Action", U.S. Appl. No. 13/471,202, Feb. 11, 2013, 10 pages.
"Non-Final Office Action", U.S. Appl. No. 13/471,237, Mar. 24, 2014, 7 pages.
"Non-Final Office Action", U.S. Appl. No. 13/471,282, Sep. 3, 2014, 13 pages.
"Non-Final Office Action", U.S. Appl. No. 13/471,336, Jan. 18, 2013, 14 pages.
"Non-Final Office Action", U.S. Appl. No. 13/471,336, May 7, 2014, 17 pages.
"Non-Final Office Action", U.S. Appl. No. 13/471,376, Apr. 2, 2014, 17 pages.
"Non-Final Office Action", U.S. Appl. No. 13/471,393, Oct. 20, 2014, 12 pages.
"Non-Final Office Action", U.S. Appl. No. 13/471,405, Feb. 20, 2014, 37 pages.
"Non-Final Office Action", U.S. Appl. No. 13/471,412, Jul. 11, 2014, 22 pages.
"Non-Final Office Action", U.S. Appl. No. 13/492,232, Apr. 30, 2014, 9 pages.
"Non-Final Office Action", U.S. Appl. No. 13/494,651, Feb. 4, 2014, 15 pages.
"Non-Final Office Action", U.S. Appl. No. 13/494,722, May 9, 2014, 8 pages.
"Non-Final Office Action", U.S. Appl. No. 13/525,070, Jan. 17, 2014, 19 pages.
"Non-Final Office Action", U.S. Appl. No. 13/525,070, Aug. 14, 2014, 24 pages.
"Non-Final Office Action", U.S. Appl. No. 13/527,263, Apr. 3, 2014, 6 pages.
"Non-Final Office Action", U.S. Appl. No. 13/527,263, Jul. 19, 2013, 5 pages.
"Non-Final Office Action", U.S. Appl. No. 13/563,435, Jun. 14, 2013, 6 pages.
"Non-Final Office Action", U.S. Appl. No. 13/564,520, Feb. 14, 2014, 5 pages.
"Non-Final Office Action", U.S. Appl. No. 13/564,520, Jun. 19, 2013, 8 pages.
"Non-Final Office Action", U.S. Appl. No. 13/564,520, Jun. 16, 2014, 5 pages.
"Non-Final Office Action", U.S. Appl. No. 13/565,124, Jun. 17, 2013, 5 pages.
"Non-Final Office Action", U.S. Appl. No. 13/595,700, Jun. 18, 2014, 8 pages.
"Non-Final Office Action", U.S. Appl. No. 13/599,763, May 28, 2014, 6 pages.
"Non-Final Office Action", U.S. Appl. No. 13/603,918, Dec. 19, 2013, 12 pages.
"Non-Final Office Action", U.S. Appl. No. 13/645,405, Jan. 31, 2014, 6 pages.
"Non-Final Office Action", U.S. Appl. No. 13/645,405, Aug. 11, 2014, 5 pages.
"Non-Final Office Action", U.S. Appl. No. 13/647,479, Jul. 3, 2014, 10 pages.
"Non-Final Office Action", U.S. Appl. No. 13/647,507, Jun. 19, 2014, 22 pages.
"Non-Final Office Action", U.S. Appl. No. 13/651,195, Jan. 2, 2013, 14 pages.
"Non-Final Office Action", U.S. Appl. No. 13/651,232, Jan. 17, 2013, 15 pages.
"Non-Final Office Action", U.S. Appl. No. 13/651,232, Dec. 5, 2013, 15 pages.
"Non-Final Office Action", U.S. Appl. No. 13/651,272, Feb. 12, 2013, 10 pages.
"Non-Final Office Action", U.S. Appl. No. 13/651,287, Jan. 29, 2013, 13 pages.
"Non-Final Office Action", U.S. Appl. No. 13/651,304, Mar. 22, 2013, 9 pages.
"Non-Final Office Action", U.S. Appl. No. 13/651,327, Mar. 22, 2013, 6 pages.

(56) References Cited

OTHER PUBLICATIONS

"Non-Final Office Action", U.S. Appl. No. 13/651,726, Apr. 15, 2013, 6 pages.
"Non-Final Office Action", U.S. Appl. No. 13/651,871, Mar. 18, 2013, 14 pages.
"Non-Final Office Action", U.S. Appl. No. 13/651,871, Jul. 1, 2013, 5 pages.
"Non-Final Office Action", U.S. Appl. No. 13/651,976, Feb. 22, 2013, 16 pages.
"Non-Final Office Action", U.S. Appl. No. 13/651,976, Jun. 16, 2014, 23 pages.
"Non-Final Office Action", U.S. Appl. No. 13/653,321, Feb. 1, 2013, 13 pages.
"Non-Final Office Action", U.S. Appl. No. 13/653,682, Feb. 7, 2013, 11 pages.
"Non-Final Office Action", U.S. Appl. No. 13/653,682, Feb. 26, 2014, 10 pages.
"Non-Final Office Action", U.S. Appl. No. 13/653,682, Jun. 3, 2013, 14 pages.
"Non-Final Office Action", U.S. Appl. No. 13/655,065, Apr. 24, 2014, 16 pages.
"Non-Final Office Action", U.S. Appl. No. 13/656,055, Mar. 12, 2014, 17 pages.
"Non-Final Office Action", U.S. Appl. No. 13/656,055, Apr. 23, 2013, 11 pages.
"Non-Final Office Action", U.S. Appl. No. 13/656,520, Feb. 1, 2013, 15 pages.
"Non-Final Office Action", U.S. Appl. No. 13/656,520, Jun. 5, 2013, 8 pages.
"Non-Final Office Action", U.S. Appl. No. 13/712,111, Aug. 1, 2014, 11 pages.
"Non-Final Office Action", U.S. Appl. No. 13/714,401, Jul. 8, 2014, 11 pages.
"Non-Final Office Action", U.S. Appl. No. 13/715,229, Aug. 19, 2014, 9 pages.
"Non-Final Office Action", U.S. Appl. No. 13/759,875, Aug. 1, 2014, 16 pages.
"Non-Final Office Action", U.S. Appl. No. 13/773,496, Jun. 23, 2014, 10 pages.
"Non-Final Office Action", U.S. Appl. No. 13/780,228, Sep. 15, 2014, 18 pages.
"Non-Final Office Action", U.S. Appl. No. 13/780,228, Oct. 30, 2013, 12 pages.
"Non-Final Office Action", U.S. Appl. No. 13/938,930, Aug. 29, 2013, 9 pages.
"Non-Final Office Action", U.S. Appl. No. 13/939,002, Aug. 28, 2013, 6 pages.
"Non-Final Office Action", U.S. Appl. No. 13/939,002, Dec. 20, 2013, 5 pages.
"Non-Final Office Action", U.S. Appl. No. 13/939,032, Aug. 29, 2013, 7 pages.
"Non-Final Office Action", U.S. Appl. No. 13/974,994, Jun. 4, 2014, 24 pages.
"Non-Final Office Action", U.S. Appl. No. 13/975,087, May 8, 2014, 18 pages.
"Non-Final Office Action", U.S. Appl. No. 14/063,912, Jan. 2, 2014, 10 pages.
"Non-Final Office Action", U.S. Appl. No. 14/063,912, Sep. 2, 2014, 11 pages.
"Non-Final Office Action", U.S. Appl. No. 14/199,924, Apr. 10, 2014, 6 pages.
"Non-Final Office Action", U.S. Appl. No. 14/200,595, Apr. 11, 2014, 4 pages.
"Non-Final Office Action", U.S. Appl. No. 14/225,250, Jun. 17, 2014, 5 pages.
"Non-Final Office Action", U.S. Appl. No. 14/225,276, Jun. 13, 2014, 6 pages.
"Non-Final Office Action", U.S. Appl. No. 14/277,240, Jun. 13, 2014, 6 pages.
"Notice of Allowance", U.S. Appl. No. 12/163,614, Apr. 3, 2013, 9 pages.
"Notice of Allowance", U.S. Appl. No. 12/882,994, Jul. 12, 2013, 9 pages.
"Notice of Allowance", U.S. Appl. No. 13/409,967, Feb. 14, 2014, 4 pages.
"Notice of Allowance", U.S. Appl. No. 13/468,918, Jun. 17, 2014, 5 pages.
"Notice of Allowance", U.S. Appl. No. 13/470,633, Mar. 22, 2013, 7 pages.
"Notice of Allowance", U.S. Appl. No. 13/471,030, Sep. 5, 2014, 6 pages.
"Notice of Allowance", U.S. Appl. No. 13/471,139, Mar. 17, 2014, 4 pages.
"Notice of Allowance", U.S. Appl. No. 13/471,186, Jul. 3, 2014, 7 pages.
"Notice of Allowance", U.S. Appl. No. 13/471,202, May 28, 2013, 7 pages.
"Notice of Allowance", U.S. Appl. No. 13/471,237, May 12, 2014, 8 pages.
"Notice of Allowance", U.S. Appl. No. 13/471,405, Jun. 24, 2014, 9 pages.
"Notice of Allowance", U.S. Appl. No. 13/494,651, Oct. 2, 2014, 4 pages.
"Notice of Allowance", U.S. Appl. No. 13/563,435, Nov. 12, 2013, 5 pages.
"Notice of Allowance", U.S. Appl. No. 13/565,124, Dec. 24, 2013, 6 pages.
"Notice of Allowance", U.S. Appl. No. 13/651,195, Jul. 8, 2013, 9 pages.
"Notice of Allowance", U.S. Appl. No. 13/651,232, Apr. 25, 2014, 9 pages.
"Notice of Allowance", U.S. Appl. No. 13/651,272, May 2, 2013, 7 pages.
"Notice of Allowance", U.S. Appl. No. 13/651,287, May 2, 2014, 6 pages.
"Notice of Allowance", U.S. Appl. No. 13/651,304, Jul. 1, 2013, 5 pages.
"Notice of Allowance", U.S. Appl. No. 13/651,327, Jun. 11, 2013, 7 pages.
"Notice of Allowance", U.S. Appl. No. 13/651,726, May 31, 2013, 5 pages.
"Notice of Allowance", U.S. Appl. No. 13/651,871, Oct. 2, 2013, 7 pages.
"Notice of Allowance", U.S. Appl. No. 13/653,321, Dec. 18, 2013, 4 pages.
"Notice of Allowance", U.S. Appl. No. 13/653,682, Sep. 24, 2014, 4 pages.
"Notice of Allowance", U.S. Appl. No. 13/656,520, Oct. 2, 2013, 5 pages.
"Notice of Allowance", U.S. Appl. No. 13/667,408, Mar. 13, 2014, 11 pages.
"Notice of Allowance", U.S. Appl. No. 13/715,133, Jan. 6, 2014, 7 pages.
"Notice of Allowance", U.S. Appl. No. 13/938,930, Feb. 20, 2014, 4 pages.
"Notice of Allowance", U.S. Appl. No. 13/939,002, Mar. 3, 2014, 4 pages.
"Notice of Allowance", U.S. Appl. No. 13/939,032, Apr. 3, 2014, 4 pages.
"Notice of Allowance", U.S. Appl. No. 14/018,286, May 23, 2014, 8 pages.
"Notice of Allowance", U.S. Appl. No. 14/199,924, Jun. 10, 2014, 4 pages.
"Notice of Allowance", U.S. Appl. No. 14/277,240, Sep. 16, 2014, 4 pages.
"Notice to Grant", CN Application No. 201320097089.9, Sep. 29, 2013, 2 Pages.
"Notice to Grant", CN Application No. 201320097124.7, Oct. 8, 2013, 2 pages.
"On-Screen Keyboard for Windows 7, Vista, XP with Touchscreen", Retrieved from <www.comfort-software.com/on-screen-keyboard.html> on Aug. 28, 2012, Feb. 2, 2011, 3 pages.

(56) References Cited

OTHER PUBLICATIONS

"Optical Sensors in Smart Mobile Devices", ON Semiconductor, TND415/D, Available at <http://www.onsemi.jp/pub_link/Collateral/TND415-D.PDF>,Nov. 2010, pp. 1-13.
"Optics for Displays: Waveguide-based Wedge Creates Collimated Display Backlight", OptoIQ, retrieved from <http://www.optoiq.com/index/photonics-technologies-applications/lfw-display/lfw-article-display.articles.laser-focus-world.volume-46.issue-1.worldnews.optics-for_displays.html> on Nov. 2, 2010,Jan. 1, 2010, 3 pages.
"PCI Express® SMT Connector | FCI", Retrieved from <http://www.ttiinc.com/object/fp_fci_PCISMT> on Feb. 6, 2013, Feb. 2013, 1 page.
"Position Sensors", Android Developers—retrieved from <http://developer.android.com/guide/topics/sensors/sensors_position.html> on May 25, 2012, 5 pages.
"Real-Time Television Content Platform", retrieved from <http://www.accenture.com/us-en/pages/insight-real-time-television-platform.aspx> on Mar. 10, 2011, May 28, 2002, 3 pages.
"Reflex LCD Writing Tablets", retrieved from <http://www.kentdisplays.com/products/lcdwritingtablets.html> on Jun. 27, 2012, 3 pages.
"Restriction Requirement", U.S. Appl. No. 13/468,918, Nov. 29, 2013, 6 pages.
"Restriction Requirement", U.S. Appl. No. 13/603,918, Nov. 27, 2013, 8 pages.
"Restriction Requirement", U.S. Appl. No. 13/715,133, Oct. 28, 2013, 6 pages.
"Restriction Requirement", U.S. Appl. No. 13/367,812, Mar. 11, 2014, 6 pages.
"Restriction Requirement", U.S. Appl. No. 13/471,139, Jan. 17, 2013, 7 pages.
"Restriction Requirement", U.S. Appl. No. 13/494,722, Dec. 20, 2013, 6 pages.
"Restriction Requirement", U.S. Appl. No. 13/589,773, Aug. 6, 2014, 6 pages.
"Restriction Requirement", U.S. Appl. No. 13/595,700, May 28, 2014, 6 pages.
"Restriction Requirement", U.S. Appl. No. 13/651,304, Jan. 18, 2013, 7 pages.
"Restriction Requirement", U.S. Appl. No. 13/651,726, Feb. 22, 2013, 6 pages.
"Restriction Requirement", U.S. Appl. No. 13/651,871, Feb. 7, 2013, 6 pages.
"Restriction Requirement", U.S. Appl. No. 13/653,184, Sep. 5, 2014, 6 pages.
"Restriction Requirement", U.S. Appl. No. 13/715,133, Dec. 3, 2013, 6 pages.
"Restriction Requirement", U.S. Appl. No. 13/715,229, Aug. 13, 2013, 7 pages.
"RoPD® Connectors", Retrieved from <http://www.rosenberger.de/documents/headquarters_de_en/ba_automotive/AUTO_RoPD_Flyer_2012.pdf> on May 14, 2013, Jun. 2012, 6 pages.
"Search Report", EP Application No. 09812072.8, Apr. 17, 2013, 5 Pages.
"SMART Board™ Interactive Display Frame Pencil Pack", Available at <http://downloads01.smarttech.com/media/sitecore/en/support/product/sbfpd/400series(interactivedisplayframes)/guides/smartboardinteractivedisplayframepencilpackv12mar09.pdf>, 2009, 2 pages.
"SolRxTM E-Series Multidirectional Phototherapy ExpandableTM 2-Bulb Full Body Panel System", Retrieved from: < http://www.solarcsystems.com/us_multidirectional_uv_light_therapy_1_intro.html > on Jul. 25, 2012, 2011, 4 pages.
"Supplemental Notice of Allowance", U.S. Appl. No. 13/471,405, Aug. 29, 2014, 5 pages.
"Supplemental Notice of Allowance", U.S. Appl. No. 13/653,321, Mar. 28, 2014, 4 pages.
"Supplemental Notice of Allowance", U.S. Appl. No. 14/018,286, Jun. 11, 2014, 5 pages.
"Surface", Retrieved from <http://www.microsoft.com/surface/en-us/support/hardware-and-drivers/type-cover> on Dec. 24, 2013, 6 pages.
"Teach Me Simply", Retrieved From: <http://techmesimply.blogspot.in/2013/05/yugatech_3.html> on Nov. 22, 2013, May 3, 2013, pp. 1-6.
"The Microsoft Surface Tablets Comes With Impressive Design and Specs", Retrieved from <http://microsofttabletreview.com/the-microsoft-surface-tablets-comes-with-impressive-design-and-specs> on Jan. 30, 2013, Jun. 2012, 2 pages.
"The New Lenovo Yoga Tablet 8", Retrieved From:<http://www.pricepanda.co.in/lenovo-yoga-tablet-8-pid1529091/> Jun. 11, 2014, 2014, 2 Pages.
"Tilt Shift Lenses: Perspective Control", retrieved from http://www.cambridgeincolour.com/tutorials/tilt-shift-lenses1.htm, Mar. 28, 2008, 11 Pages.
"Virtualization Getting Started Guide", Red Hat Enterprise Linux 6, Edition 0.2—retrieved from <http://docs.redhat.com/docs/en-US/Red_Hat_Enterprise_Linux/6/html-single/Virtualization_Getting_Started_Guide/index.html> on Jun. 13, 2012, 24 pages.
"Welcome to Windows 7", Retrieved from: <http://www.microsoft.com/en-us/download/confirmation.aspx?id=4984> on Aug. 1, 2013, Sep. 16, 2009, 3 pages.
"What is Active Alignment?", http://www.kasalis.com/active_alignment.html, retrieved on Nov. 22, 2012,Nov. 22, 2012, 2 Pages.
"What is the PD-Net Project About?", retrieved from <http://pd-net.org/about/> on Mar. 10, 2011, Mar. 10, 2011, 3 pages.
"Windows 7: Display Reminder When Click on Shutdown?", Retrieved From: < http://www.sevenforums.com/customization/118688-display-reminder-when-click-shutdown.html> Jul. 8, 2014, Oct. 18, 2010, 5 Pages.
"Write & Learn Spellboard Advanced", Available at <http://somemanuals.com/VTECH,WRITE%2526LEARN--SPELLBOARD--ADV--71000,JIDFHE.PDF>, 2006, 22 pages.
"HP Envy Rove: A Movable (If Underpowered) All-In-One PC", Retrieved From: <http://www.pcworld.com/article/2047032/hp-envy-rove-a-movable-if-underpowered-all-in-one-pc.html> Jun. 11, 2014, Aug. 21, 2013, 6 Pages.
Bathiche, et al., "Input Device with Interchangeable Surface", U.S. Appl. No. 13/974,749, filed Aug. 23, 2013, 51 pages.
Bert, et al., "Passive Matrix Addressing of Electrophoretic Image Display", Conference on International Display Research Conference, Retrieved from <http://www.cmst.be/publi/eurodisplay2002_s14-1.pdf>,Oct. 1, 2002, 4 pages.
Block, et al., "Device Orientation Event Specification", W3C, Editor's Draft, retrieved from <https://developer.palm.com/content/api/dev-guide/pdk/accessing-device-sensors.html> on May 25, 2012,Jul. 12, 2011, 14 pages.
Boual, et al., "Wedge Displays as Cameras", Retrieved From: http://www.camfpd.com/72-3.pdf, SID Symposium Digest of Technical Papers, vol. 37, Issue 1, pp. 1999-2002, Jun. 2006,Jun. 2006, 4 Pages.
Breath, "ThinkSafe: A Magnetic Power Connector for Thinkpads", Retrieved from <http://www.instructables.com/id/ThinkSafe%3A-A-Magnetic-Power-Connector-for-Thinkpad/> on May 14, 2013, Oct. 26, 2006, 9 pages.
Brown, "Microsoft Shows Off Pressure-Sensitive Keyboard", retrieved from <http://news.cnet.com/8301-17938_105-10304792-1.html> on May 7, 2012, Aug. 6, 2009, 2 pages.
Burge, et al., "Determination of off-axis aberrations of imaging systems using on-axis measurements", SPIE Proceeding, Retrieved from <http://www.loft.optics.arizona.edu/documents/journal_articles/Jim_Burge_Determination_of_off-axis_aberrations_of_imaging_systems_using_on-axis_measurements.pdf>,Sep. 21, 2011, 10 pages.
Butler, et al., "SideSight: Multi-"touch" Interaction around Small Devices", In the proceedings of the 21st annual ACM symposium on User interface software and technology., retrieved from <http://research.microsoft.com/pubs/132534/sidesight_crv3.pdf> on May 29, 2012,Oct. 19, 2008, 4 pages.

(56) References Cited

OTHER PUBLICATIONS

Campbell, "Future iPhones May Unlock, Hide Messages based on a User's Face", Retrieved From:<http://appleinsider.com/articles/13/12/03/future-iphones-may-unlock-hide-messages-based-on-a-users-face> Jul. 3, 2014, Dec. 3, 2013, 11 Pages.

Caprio, "Enabling Notification Badges for Whatsapp and Other Android Apps", Retrieved From: <http://geek.ng/2013/05/enabling-notification-badges-for-whatsapp-and-other-android-apps.html> Jul. 3, 2014, May 20, 2014, 7 Pages.

Carlon, "How to Add a WhatsApp Widget to your Lock Screen", Retrieved From: <http://www.androidpit.com/how-to-add-a-whatsapp-widget-to-your-lock-screen> Jul. 3, 2014, Apr. 9, 2014, 6 Pages.

Chang, et al., "Optical Design and Analysis of LCD Backlight Units Using ASAP", Optical Engineering, Available at <http://www.opticsvalley.com/resources/kbasePDF/ma_oe_001_optical_design.pdf>,Jun. 2003, 15 pages.

Chavan, et al., "Synthesis, Design and Analysis of a Novel Variable Lift Cam Follower System", In Proceedings: International Journal of Design Engineering, vol. 3, Issue Interscience Publishers,Jun. 3, 2010, 1 Page.

Chen, et al., "Design of a Novel Hybrid Light Guide Plate for Viewing Angle Switchable Backlight Module", Institute of Photonic Systems, National Chiao Tung University, Tainan, Taiwan., Jul. 1, 2013, 4 Pages.

Chou, et al., "Imaging and Chromatic Behavior Analysis of a Wedge-Plate Display", Retrieved From: http://www.di.nctu.edu.tw/2006TDC/papers/Flexible/06-012.doc, SID Symposium Digest of Technical Papers vol. 37, Issue 1, pp. 1031-1034,Jun. 2006, 4 Pages.

Constine, "Cover is an Android-Only Lockscreen that Shows Apps When You Need Them", Retrieved From: <http://techcrunch.com/2013/10/24/cover-android/> Jul. 2, 2014, Oct. 24, 2013, 15 pages.

Crider, "Sony Slate Concept Tablet "Grows" a Kickstand", Retrieved from: <http://androidcommunity.com/sony-slate-concept-tablet-grows-a-kickstand-20120116/> on May 4, 2012, Jan. 16, 2012, 9 pages.

Das, et al., "Study of Heat Transfer through Multilayer Clothing Assemblies: A Theoretical Prediction", Retrieved from <http://www.autexrj.com/cms/zalaczone_pliki/5_013_11.pdf>, Jun. 2011, 7 pages.

Dietz, et al., "A Practical Pressure Sensitive Computer Keyboard", In Proceedings of UIST 2009, Oct. 2009, 4 pages.

Diverdi, et al., "An Immaterial Pseudo-3D Display with 3D Interaction", In the proceedings of Three-Dimensional Television: Capture, Transmission, and Display, Springer, Retrieved from <http://www.cs.ucsb.edu/~holl/pubs/DiVerdi-2007-3DTV.pdf>,Feb. 6, 2007, 26 pages.

Eckel, "Personalize Alerts with the Help of OS X Mavericks Notifications", Retrieved From: <http://www.techrepublic.com/article/customize-os-x-mavericks-notifications-to-personalize-alerts/> Jul. 8, 2014, Mar. 10, 2014, 7 Pages.

Gaver, et al., "A Virtual Window on Media Space", retrieved from <http://www.gold.ac.uk/media/15gaver-smets-overbeeke.MediaSpaceWindow.chi95.pdf> on Jun. 1, 2012, retrieved from <http://www.gold.ac.uk/media/15gaver-smets-overbeeke.MediaSpaceWindow.chi95.pdf> on Jun. 1, 2012,May 7, 1995, 9 pages.

Glatt, "Channel and Key Pressure (Aftertouch).", Retrieved from: <http://home.roadrunner.com/~jgglatt/tutr/touch.htm> on Jun. 11, 2012, 2012, 2 pages.

Grossman, et al., "Multi-Finger Gestural Interaction with 3D Volumetric Displays", In the proceedings of the 17th annual ACM symposium on User interface software and technology, Retrieved from <http://www.dgp.toronto.edu/papers/tgrossman_UIST2004.pdf>,Oct. 24, 2004, 61-70.

Hanlon, "ElekTex Smart Fabric Keyboard Goes Wireless", Retrieved from: <http://www.gizmag.com/go/5048/> on May 7, 2012, Jan. 15, 2006, 5 pages.

Harada, et al., "VoiceDraw: A Hands-Free Voice-Driven Drawing Application for People With Motor Impairments", In Proceedings of Ninth International ACM SIGACCESS Conference on Computers and Accessibility, retrieved from <http://citeseerx.ist.psu.edu/viewdoc/download?doi=10.1.1.113.7211&rep=rep1&type=pdf> on Jun. 1, 2012,Oct. 15, 2007, 8 pages.

Harrison, "UIST 2009 Student Innovation Contest—Demo Video", Retrieved From: <https://www.youtube.com/watch?v=PDI8eYIASf0> Sep. 16, 2014, Jul. 23, 2009, 1 pages.

Haslam, "This App for Android Customizes your Lock Screen Automatically Depending on Time of Day or Situation", Retrieved From: <http://www.redmondpie.com/this-app-for-android-customizes-your-lock-screen-automatically-depending-on-time-of-day-or-situation/> Jul. 8, 2014, Jun. 1, 2012, 6 Pages.

Henry, "Supercharge Your Lock Screen with DashClock and These Add-Ons", Retrieved From: <http://lifehacker.com/supercharge-your-lock-screen-with-dashclock-and-these-a-493206006> Jul. 3, 2014, May 7, 2013, 12 Pages.

Hinckley, et al., "Codex: A Dual Screen Tablet Computer", Conference on Human Factors in Computing Systems, Apr. 9, 2009, 10 pages.

Ishida, et al., "A Novel Ultra Thin Backlight System without Optical Sheets Using a Newly Developed Multi-Layered Light-guide", SID 10 Digest, Jul. 5, 2012, 4 Pages.

Iwase, "Multistep Sequential Batch Assembly of Three-Dimensional Ferromagnetic Microstructures with Elastic Hinges", Retrieved at <<http://ieeexplore.ieee.org/stamp/stamp.jsp?tp=&arnumber=1549861>> Proceedings: Journal of Microelectromechanical Systems, Dec. 2005, 7 pages.

Izadi, et al., "ThinSight: A Thin Form-Factor Interactive Surface Technology", Communications of the ACM, vol. 52, No. 12, retrieved from <http://research.microsoft.com/pubs/132532/p90-izadi.pdf> on Jan. 5, 2012,Dec. 2009, pp. 90-98.

Jacobs, et al., "2D/3D Switchable Displays", In the proceedings of Sharp Technical Journal (4), Available at <https://cgi.sharp.co.jp/corporate/rd/journal-85/pdf/85-04.pdf>,Apr. 2003, pp. 15-18.

Justin, "Seidio Active with Kickstand for the Galaxy SIII", Retrieved From: <http://www.t3chniq.com/seidio-active-with-kickstand-gs3/> on Nov. 22, 2013, Jan. 3, 2013, 5 Pages.

Kaufmann, et al., "Hand Posture Recognition Using Real-time Artificial Evolution", EvoApplications'09, retrieved from <http://evelyne.lutton.free.fr/Papers/KaufmannEvolASP2010.pdf> on Jan. 5, 2012,Apr. 3, 2010, 10 pages.

Kaur, "Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012, Jun. 21, 2010, 4 pages.

Khuntontong, et al., "Fabrication of Molded Interconnection Devices by Ultrasonic Hot Embossing on Thin Polymer Films", IEEE Transactions on Electronics Packaging Manufacturing, vol. 32, No. 3, Jul. 2009, pp. 152-156.

Kim, et al., "A Controllable Viewing Angle LCD with an Optically isotropic liquid crystal", Journal of Physics D: Applied Physics, vol. 43, No. 14, Mar. 23, 2010, 7 Pages.

Lahr, "Development of a Novel Cam-based Infinitely Variable Transmission", Proceedings: In Thesis of Master of Science in Mechanical Engineering, Virginia Polytechnic Institute and State University,Nov. 6, 2009, 91 pages.

Lambert, "Cam Design", In Proceedings: Kinematics and dynamics of Machine, University of Waterloo Department of Mechanical Engineering,Jul. 2, 2002, pp. 51-60.

Lane, et al., "Media Processing Input Device", U.S. Appl. No. 13/655,065, Oct. 18, 2012, 43 pages.

Lee, "Flat-Panel Autostereoscopic 3D Display", Optoelectronics, IET, Available at <http://ieeexplore.ieee.org/stamp/stamp.jsp?arnumber=04455550>,Feb. 2008, pp. 24-28.

Lee, "Flat-panel Backlight for View-sequential 3D Display", Optoelectronics, IEE Proceedings—.vol. 151. No. 6 IET, Dec. 2004, 4 pages.

Lee, et al., "Depth-Fused 3D Imagery on an Immaterial Display", In the proceedings of IEEE Transactions on Visualization and Computer Graphics, vol. 15, No. 1, Retrieved from <http://ieeexplore.ieee.org/stamp/stamp.jsp?arnumber=04540094>,Jan. 2009, 20-33.

(56) References Cited

OTHER PUBLICATIONS

Lee, et al., "LED Light Coupler Design for a Ultra Thin Light Guide", Journal of the Optical Society of Korea, vol. 11, Issue.3, Retrieved from <http://opticslab.kongju.ac.kr/pdf/06.pdf>,Sep. 2007, 5 pages.
Li, et al., "Characteristic Mode Based Tradeoff Analysis of Antenna-Chassis Interactions for Multiple Antenna Terminals", In IEEE Transactions on Antennas and Propagation, Retrieved from <http://ieeexplore.ieee.org/stamp/stamp.jsp?tp=&arnumber=6060882>,Feb. 2012, 13 pages.
Linderholm, "Logitech Shows Cloth Keyboard for PDAs", Retrieved from: <http://www.pcworld.com/article/89084/logitech_shows_cloth_keyboard_for_pdas.html> on May 7, 2012, Mar. 15, 2002, 5 pages.
Liu, et al., "Three-dimensional PC: toward novel forms of human-computer interaction", In the proceedings of Three-Dimensional Video and Display: Devices and Systems vol. CR76, Retrieved from <http://www.google.co.in/url?sa=t&rct=j&g=Three-dimensional+PC:+toward+novel+forms+of+human-computer+interaction&source=web&cd=1&ved=0CFoQFjAA&url=http%3A%2F%2Fciteseerx.ist.psu.edu%2Fviewdoc%2Fdownload%3Fdoi%3D10.1.1.32.9469%26rep%3Drep1%26,Nov. 5, 2000, 250-281.
Mack, "Moto X: The First Two Weeks", Retrieved From: <http://www.gizmag.com/two-weeks-motorola-google-moto-x-review/28722/> Jul. 8, 2014, Aug. 16, 2013, 8 pages.
Manresa-Yee, et al., "Experiences Using a Hands-Free Interface", In Proceedings of the 10th International ACM SIGACCESS Conference on Computers and Accessibility, retrieved from <http://dmi.uib.es/~cmanresay/Research/%5BMan08%5DAssets08.pdf> on Jun. 1, 2012,Oct. 13, 2008, pp. 261-262.
McLellan, "Eleksen Wireless Fabric Keyboard: a first look", Retrieved from: <http://www.zdnetasia.com/eleksen-wireless-fabric-keyboard-a-first-look-40278954.htm> on May 7, 2012, Jul. 17, 2006, 9 pages.
McLellan, "Microsoft Surface Review", Retrieved from <http://www.zdnet.com/microsoft-surface-review-7000006968/> on May 13, 2013, Nov. 6, 2012, 17 pages.
Miller, "MOGA gaming controller enhances the Android gaming experience", Retrieved from <http://www.zdnet.com/moga-gaming-controller-enhances-the-android-gaming-experience-7000007550/> on Nov. 20, 2012, Nov. 18, 2012, 9 pages.
Morookian, et al., "Ambient-Light-Canceling Camera Using Subtraction of Frames", NASA Tech Briefs, Retrieved from <http://ntrs.nasa.gov/archive/nasa/casi.ntrs.nasa.gov/20110016693_2011017808.pdf>,May 2004, 2 pages.
Nakanishi, et al., "Movable Cameras Enhance Social Telepresence in Media Spaces", In Proceedings of the 27th International Conference on Human Factors in Computing Systems, retrieved from <http://smg.ams.eng.osaka-u.ac.jp/~nakanishi/hnp_2009_chi.pdf> on Jun. 1, 2012,Apr. 6, 2009, 10 pages.
Nishizawa, et al., "Investigation of Novel Diffuser Films for 2D Light-Distribution Control", Tohoku University, Aramaki Aoba, Aoba-ku, Sendai 980-8579, Japan, LINTEC Corporation, 23-23 Honcho, Itabashi-ku, Tokyo 173-0001, Japan., Dec. 2011, 4 Pages.
Patterson, "iOS 7 Tip: Alerts, Banners, and Badges—What's the Difference?", Retrieved From: <http://heresthethingblog.com/2014/01/22/ios-7-tip-whats-difference-alert/>, Jan. 22, 2014, 6 Pages.
Peli, "Visual and Optometric Issues with Head-Mounted Displays", IS & T/OSA Optics & Imaging in the Information Age, The Society for Imaging Science and Technology, available at <http://www.u.arizona.edu/~zrui3/zhang_pHMPD_spie07.pdf>,1996, pp. 364-369.
Phillips, et al., "Links Between Holography and Lithography", Fifth International Symposium on Display Holography, 206., Feb. 17, 1995, 9 Pages.
Piltch, "ASUS Eee Pad Slider SL101 Review", Retrieved from <http://www.laptopmag.com/review/tablets/asus-eee-pad-slider-sl101.aspx>, Sep. 22, 2011, 5 pages.
Post, et al., "E-Broidery: Design and Fabrication of Textile-Based Computing", IBM Systems Journal, vol. 39, Issue 3 & 4, Jul. 2000, pp. 840-860.
Powell, "High-Efficiency Projection Screen", U.S. Appl. No. 14/243,501, Apr. 2, 2014, 26 Pages.
Prospero, "Samsung Outs Series 5 Hybrid PC Tablet", Retrieved from: <http://blog.laptopmag.com/samsung-outs-series-5-hybrid-pc-tablet-running-windows-8> on Oct. 31, 2013, Jun. 4, 2012, 7 pages.
Purcher, "Apple Designs a Future Built-In Stand for the iPad & More", Retrieved From: <http://www.patentlyapple.com/patently-apple/2011/02/apple-designs-a-future-built-in-stand-for-the-ipad-more.html> Jun. 11, 2014, Feb. 13, 2011, 9 pages.
Purcher, "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012, Retrieved from: <http://www.patentlyapple.com/patently-apple/2012/01/apple-is-paving-the-way-for-a-new-3d-gui-for-ios-devices.html> on Jun. 4, 2012,Jan. 12, 2012, 15 pages.
Qin, et al., "pPen: Enabling Authenticated Pen and Touch Interaction on Tabletop Surfaces", In Proceedings of ITS 2010, Available at <http://www.dfki.de/its2010/papers/pdf/po172.pdf>,Nov. 2010, pp. 283-284.
Ramirez, "Applying Solventless Elastomeric Polyurethanes on Concrete in Wastewater Service", In Proceedings: Journal of Protective Coatings and Linings, May 1995, 13 pages.
Reilink, et al., "Endoscopic Camera Control by Head Movements for Thoracic Surgery", In Proceedings of 3rd IEEE RAS & EMBS International Conference of Biomedical Robotics and Biomechatronics, retrieved from <http://doc.utwente.nl/74929/1/biorob_online.pdf> on Jun. 1, 2012,Sep. 26, 2010, pp. 510-515.
Reisman, et al., "A Screen-Space Formulation for 2D and 3D Direct Manipulation", In the proceedings of the 22nd annual ACM symposium on User interface, Retrieved from <http://innovis.cpsc.ucalgary.ca/innovis/uploads/Courses/TableTopDetails2009/Reisman2009.pdf>,Oct. 4, 2009, 69-78.
Ritchie, "How to Use Lock Screen, Today, Popups, and Banners in Notification Center for iPhone and iPad", Retrieved From: <http://www.imore.com/how-use-notification-center-iphone-ipad> Jul. 3, 2014, Apr. 30, 2014, 8 pages.
Royman, "NiLS Lockscreen Notifications", Retrieved From: <https://play.google.com/store/apps/details?id=com.roymam.android.notificationswidget&hl=en> Jul. 3, 2014, Jun. 28, 2014, 3 Pages.
Salman, "Create a Minimal Lock Screen With WidgetLocker", Retrieved From: <http://android.appstorm.net/how-to/create-a-minimal-lock-screen-with-widgetlocked> Jul. 3, 2014, Dec. 26, 2011, 12 Pages.
Sanap, et al., "Design and Analysis of Globoidal Cam Index Drive", Proceedings: In International Journal of Scientific Research Engineering & Technology, Jun. 2013, 6 Pages.
Schoning, et al., "Building Interactive Multi-Touch Surfaces", Journal of Graphics, GPU, and Game Tools, vol. 14, No. 3, available at <http://www.libavg.com/raw-attachment/wiki/Multitouch/Multitouchguide_draft.pdf>,Nov. 2009, pp. 35-55.
Siddiqui, "Hinge Mechanism for Rotatable Component Attachment", U.S. Appl. No. 13/852,848, Mar. 28, 2013, 51 pages.
Staff, "Gametel Android controller turns tablets, phones into portable gaming devices", Retrieved from <http://www.mobiletor.com/2011/11/18/gametel-android-controller-turns-tablets-phones-into-portable-gaming-devices/#> on Nov. 20, 2012, Nov. 18, 2011, 5 pages.
Sumi Moto, "Touch & Write: Surface Computing With Touch and Pen Input", Retrieved from: <http://www.gottabemobile.com/2009/08/07/touch-write-surface-computing-with-touch-and-pen-input/> on Jun. 19, 2012, Aug. 7, 2009, 4 pages.
Sundstedt, "Gazing at Games: Using Eye Tracking to Control Virtual Characters", In ACM SIGGRAPH 2010 Courses, retrieved from <http://www.tobii.com/Global/Analysis/Training/EyeTrackAwards/veronica_sundstedt.pdf > on Jun. 1, 2012,Jul. 28, 2010, 85 pages.

(56) References Cited

OTHER PUBLICATIONS

Takamatsu, et al., "Flexible Fabric Keyboard with Conductive Polymer-Coated Fibers", In Proceedings of Sensors 2011, Oct. 28, 2011, 4 pages.
Thurrott, "Nokia Lumia "Black": Glance 2.0", Retrieved From:<http://winsupersite.com/windows-phone/nokia-lumia-black-glance-20> Jul. 8, 2014, Jan. 11, 2014, 3 Pages.
Thurrott, "Surface Pro 3: Continuous Kickstand", Retrieved From: <http://winsupersite.com/mobile-devices/surface-pro-3-continuous-kickstand> Jun. 11, 2014, May 21, 2014, 5 Pages.
Travis, "P-60: LCD Smear Elimination by Scanning Ray Angle into a Light Guide", Retrieved From: http://www2.eng.cam.ac.uk/~arlt1/P_60.pdf, SID Symposium Digest of Technical Papers vol. 35, Issue 1, pp. 474-477, May 2004,2004, 4 Pages.
Travis, et al., "Collimated Light from a Waveguide for a Display Backlight", Optics Express, 19714, vol. 17, No. 22, retrieved from <http://download.microsoft.com/download/D/2/E/D2E425F8-CF3C-4C71-A4A2-70F9D4081007/OpticsExpressbacklightpaper.pdf> on Oct. 15, 2009,Oct. 15, 2009, 6 pages.
Travis, et al., "Flat Projection for 3-D", In Proceedings of the IEEE, vol. 94 Issue: 3, Available at < http://ieeexplore.ieee.org/stamp/stamp.jsp?tp=&arnumber=1605201>,Mar. 13, 2006, pp. 539-549.
Travis, et al., "Optical Design of a Flat Panel Projection Wedge Display", 9th International Display Workshops, paper FMC6-3, Dec. 4-6, 2002, Hiroshima, Japan., Dec. 2002, 4 Pages.
Travis, et al., "P-127: Linearity in Flat Panel Wedge Projection", SID 03 Digest, retrieved from <http://www2.eng.cam.ac.uk/~arlt1/Linearity%20in%20flat%20panel%20wedge%20projection.pdf>,May 12, 2005, pp. 716-719.
Travis, et al., "The Design of Backlights for View-Sequential 3D", retrieved from <http://download.microsoft.com/download/D/2/E/D2E425F8-CF3C-4C71-A4A2-70F9D4081007/Backlightforviewsequentialautostereo.docx> on Nov. 1, 2010, 4 pages.
Valli, "Notes on Natural Interaction", retrieved from <http://www.idemployee.id.tue.nl/g.w.m.rauterberg/lecturenotes/valli-2004.pdf> on Jan. 5, 2012, Sep. 2005, 80 pages.
Valliath, "Design of Hologram for Brightness Enhancement in Color LCDs", Retrieved from <http://www.loreti.it/Download/PDF/LCD/44_05.pdf> on Sep. 17, 2012, May 1998, 5 pages.
Vaucelle, "Scopemate, a Robotic Microscope!", Architectradure, retrieved from <http://architectradure.blogspot.com/2011/10/at-uist-this-monday-scopemate-robotic.html> on Jun. 6, 2012,Oct. 17, 2011, 2 pages.
Whitwam, "How to Tweak Android's Lock Screen and Notifications", Retrieved From: <http://www.tested.com/tech/android/457766-tips-and-tricks-make-androids-lock-screen-and-notifications-even-better/?icid=pets%7Chat%7Ctestedlink%7C457766-how-to-tweak-androids-lock-screen-and-notifications> Jul. 3, 2014, Sep. 18, 2013, 4 Pages.
Williams, "A Fourth Generation of LCD Backlight Technology", Retrieved from <http://cds.linear.com/docs/Application%20Note/an65f.pdf>, Nov. 1995, 124 pages.
Xu, et al., "Hand Gesture Recognition and Virtual Game Control Based on 3D Accelerometer and EMG Sensors", IUI'09, Feb. 8-11, 2009, retrieved from <http://sclab.yonsei.ac.kr/courses/10TPR/10TPR.files/Hand%20Gesture%20Recognition%20and%20Virtual%20Game%20Control%20based%20on%203d%20accelerometer%20and%20EMG%20sensors.pdf> on Jan. 5, 2012,Feb. 8, 2009, 5 pages.
Xu, et al., "Vision-based Detection of Dynamic Gesture", ICTM'09, Dec. 5-6, 2009, retrieved from <http://ieeexplore.ieee.org/stamp/stamp.jsp?tp=&arnumber=5412956> on Jan. 5, 2012,Dec. 5, 2009, pp. 223-226.
Yagi, "The Concept of "AdapTV"", Series: The Challenge of "AdapTV", Broadcast Technology, No. 28, 2006, pp. 16-17.
Yan, et al., "Edge-Lighting Light Guide Plate Based on Micro-Prism for Liquid Crystal Display", Journal of Display Technology, vol. 5, No. 9, Available at <http://ieeexplore.ieee.org/ielx5/9425/5196834/05196835.pdf?tp=&arnumber=5196835&isnumber=5196834>,Sep. 2009, pp. 355-357.
Yu, et al., "A New Driving Scheme for Reflective Bistable Cholesteric Liquid Crystal Displays", Society for Information Display International Symposium Digest of Technical Papers, Retrieved from <http://www.ee.ust.hk/~eekwok/publications/1997/bcd_sid.pdf >,May 1997, 4 pages.
Zhang, "Design of Head Mounted Displays", Retrieved at <<http://www.optics.arizona.edu/optomech/student%20reports/2007/Design%20of%20mounteddisplays%20Zhang.pdf>>, Dec. 12, 2007, 6 pages.
Zhang, et al., "Model-Based Development of Dynamically Adaptive Software", In Proceedings of ICSE 2006, Available at <http://www.irisa.fr/lande/lande/icse-proceedings/icse/p371.pdf>,May 20, 2006, pp. 371-380.
Zhu, et al., "Keyboard before Head Tracking Depresses User Success in Remote Camera Control", In Proceedings of 12th IFIP TC 13 International Conference on Human-Computer Interaction, Part II, retrieved from <http://csiro.academia.edu/Departments/CSIRO_ICT_Centre/Papers?page=5> on Jun. 1, 2012,Aug. 24, 2009, 14 pages.
"Corrected Notice of Allowance", U.S. Appl. No. 13/494,651, Dec. 29, 2014, 2 pages.
"Corrected Notice of Allowance", U.S. Appl. No. 14/277,240, Jan. 8, 2015, 2 pages.
"Final Office Action", U.S. Appl. No. 13/470,951, Jan. 12, 2015, 20 pages.
"Final Office Action", U.S. Appl. No. 13/471,412, Dec. 15, 2014, 11 pages.
"Final Office Action", U.S. Appl. No. 13/492,232, Nov. 17, 2014, 13 pages.
"Final Office Action", U.S. Appl. No. 13/647,479, Dec. 12, 2014, 12 pages.
"Final Office Action", U.S. Appl. No. 14/063,912, Jan. 12, 2015, 12 pages.
"Final Office Action", U.S. Appl. No. 14/200,595, Nov. 19, 2014, 5 pages.
"Final Office Action", U.S. Appl. No. 14/225,276, Dec. 17, 2014, 6 pages.
"Foreign Office Action", CN Application No. 201320097079.5, Jul. 28, 2014, 4 pages.
"International Search Report and Written Opinion", Application No. PCT/US2014/013928, Oct. 22, 2014, 13 Pages.
"Non-Final Office Action", U.S. Appl. No. 13/471,030, Jan. 15, 2015, 7 pages.
"Non-Final Office Action", U.S. Appl. No. 13/525,614, Nov. 24, 2014, 19 pages.
"Non-Final Office Action", U.S. Appl. No. 13/653,184, Dec. 1, 2014, 7 pages.
"Restriction Requirement", U.S. Appl. No. 13/653,218, Nov. 7, 2014, 6 pages.
"Restriction Requirement", U.S. Appl. No. 14/147,252, Dec. 1, 2014, 6 pages.
"Supplemental Notice of Allowance", U.S. Appl. No. 13/471,405, Dec. 17, 2014, 5 pages.
"Final Office Action", U.S. Appl. No. 13/021,448, Jan. 2, 2015, 19 pages.
"Final Office Action", U.S. Appl. No. 13/468,882, Feb. 12, 2015, 9 pages.
"Final Office Action", U.S. Appl. No. 13/525,070, Jan. 29, 2015, 30 pages.
"Final Office Action", U.S. Appl. No. 13/527,263, Jan. 27, 2015, 7 pages.
"First Examination Report", NZ Application No. 628690, Nov. 27, 2014, 2 pages.
"Foreign Office Action", CN Application No. 201080037117.7, Aug. 20, 2013, 10 pages.
"Foreign Office Action", CN Application No. 201210023945.6, Dec. 3, 2013, 13 pages.

(56) References Cited

OTHER PUBLICATIONS

"Non-Final Office Action", U.S. Appl. No. 13/492,232, Feb. 24, 2015, 12 pages.
"Non-Final Office Action", U.S. Appl. No. 13/564,520, Jan. 26, 2015, 6 pages.
"Non-Final Office Action", U.S. Appl. No. 13/599,635, Feb. 12, 2015, 16 pages.
"Non-Final Office Action", U.S. Appl. No. 14/147,252, Feb. 23, 2015, 11 pages.
"Notice of Allowance", U.S. Appl. No. 13/595,700, Jan. 21, 2015, 4 pages.
"Notice of Allowance", U.S. Appl. No. 13/651,976, Jan. 21, 2015, 10 pages.
"Notice of Allowance", U.S. Appl. No. 14/200,595, Feb. 17, 2015, 2 pages.
"Notice of Allowance", U.S. Appl. No. 14/200,595, Feb. 25, 2015, 4 pages.
"Corrected Notice of Allowance", U.S. Appl. No. 13/651,232, Apr. 24, 2015, 2 pages.
"Corrected Notice of Allowance", U.S. Appl. No. 13/656,055, Apr. 13, 2015, 2 pages.
"Final Office Action", U.S. Appl. No. 13/371,725, Mar. 3, 2015, 30 pages.
"Final Office Action", U.S. Appl. No. 13/525,614, Apr. 29, 2015, 20 pages.
"Final Office Action", U.S. Appl. No. 13/780,228, Apr. 10, 2015, 19 pages.
"Final Office Action", U.S. Appl. No. 14/225,250, Mar. 13, 2015, 7 pages.
"Foreign Notice on Reexamination", CN Application No. 201320097066.8, Apr. 3, 2015, 7 Pages.
"Non-Final Office Action", U.S. Appl. No. 13/471,054, Mar. 13, 2015, 18 pages.
"Non-Final Office Action", U.S. Appl. No. 13/471,376, Mar. 27, 2015, 28 pages.
"Non-Final Office Action", U.S. Appl. No. 13/471,393, Mar. 26, 2015, 13 pages.
"Non-Final Office Action", U.S. Appl. No. 13/647,479, Apr. 28, 2015, 11 pages.
"Non-Final Office Action", U.S. Appl. No. 13/653,218, Mar. 4, 2015, 16 pages.
"Non-Final Office Action", U.S. Appl. No. 13/852,848, Mar. 26, 2015, 7 pages.
"Non-Final Office Action", U.S. Appl. No. 13/926,944, Apr. 23, 2015, 6 pages.
"Non-Final Office Action", U.S. Appl. No. 14/059,280, Mar. 3, 2015, 18 pages.
"Non-Final Office Action", U.S. Appl. No. 14/225,276, Apr. 23, 2015, 7 pages.
"Notice of Allowance", U.S. Appl. No. 13/468,949, Apr. 24, 2015, 9 pages.
"Notice of Allowance", U.S. Appl. No. 13/468,918, Apr. 8, 2015, 7 pages.
"Notice of Allowance", U.S. Appl. No. 13/468,949, Apr. 24, 2015, 8 pages.
"Notice of Allowance", U.S. Appl. No. 13/471,030, Apr. 6, 2015, 6 pages.
"Notice of Allowance", U.S. Appl. No. 13/471,282, Apr. 30, 2015, 8 pages.
"Notice of Allowance", U.S. Appl. No. 13/651,232, Mar. 30, 2015, 7 pages.
"Notice of Allowance", U.S. Appl. No. 13/653,184, Mar. 10, 2015, 6 pages.
"Notice of Allowance", U.S. Appl. No. 13/656,055, Mar. 4, 2015, 7 pages.
"Supplemental Notice of Allowance", U.S. Appl. No. 13/595,700, Apr. 10, 2015, 2 pages.
U.S. Appl. No. 13/468,882, filed May 10, 2012, 43 pages.
U.S. Appl. No. 13/471,393, filed May 14, 2012, 100 pages.
Schafer, "Using Interactive Maps for Navigation and Collaboration", CHI '01 Extended Abstracts on Human Factors in Computing Systems, Mar. 31, 2001, 2 pages.
communication to applicant.
"Corrected Notice of Allowance", U.S. Appl. No. 13/651,232, Jun. 10, 2015, 2 pages.
"Corrected Notice of Allowance", U.S. Appl. No. 13/651,232, Jul. 6, 2015, 2 pages.
"Corrected Notice of Allowance", U.S. Appl. No. 13/656,055, Jul. 1, 2015, 2 pages.
"Corrected Notice of Allowance", U.S. Appl. No. 14/200,595, Jun. 4, 2015, 3 pages.
"Final Office Action", U.S. Appl. No. 13/471,376, Jul. 28, 2015, 35 pages.
"Final Office Action", U.S. Appl. No. 13/492,232, Jul. 10, 2015, 11 pages.
"Final Office Action", U.S. Appl. No. 13/599,635, Jul. 30, 2015, 23 pages.
"Final Office Action", U.S. Appl. No. 13/852,848, Jul. 20, 2015, 9 pages.
"Final Office Action", U.S. Appl. No. 14/059,280, Jul. 22, 2015, 25 pages.
"Final Office Action", U.S. Appl. No. 14/147,252, Jun. 25, 2015, 11 pages.
"Foreign Office Action", CN Application No. 201310067335.0, Jun. 12, 2015, 15 Pages.
"Foreign Office Action", CN Application No. 201310067808.7, May 28, 2015, 14 Pages.
"Foreign Office Action", CN Application No. 201310225788.1, Jun. 23, 2015, 14 Pages.
"International Preliminary Report on Patentability", Application No. PCT/US2014/031531, Jun. 9, 2015, 7 pages.
"International Preliminary Report on Patentability", Application No. PCT/US2014/043546, Jun. 12, 2015, 7 pages.
"Non-Final Office Action", U.S. Appl. No. 13/471,336, Jun. 24, 2015, 15 pages.
"Non-Final Office Action", U.S. Appl. No. 13/471,412, Jun. 1, 2015, 31 pages.
"Non-Final Office Action", U.S. Appl. No. 13/525,070, May 18, 2015, 32 pages.
"Non-Final Office Action", U.S. Appl. No. 13/525,614, Jul. 31, 2015, 20 pages.
"Non-Final Office Action", U.S. Appl. No. 14/063,912, May 7, 2015, 12 pages.
"Non-Final Office Action", U.S. Appl. No. 14/727,001, Jul. 10, 2015, 7 pages.
"Notice of Allowance", U.S. Appl. No. 13/564,520, May 8, 2015, 4 pages.
"Notice of Allowance", U.S. Appl. No. 14/225,276, Jun. 22, 2015, 4 pages.
"Notice of Allowance", U.S. Appl. No. 14/457,881, Jul. 22, 2015, 7 pages.
"Restriction Requirement", U.S. Appl. No. 13/598,898, Jul. 17, 2015, 6 pages.
"Supplemental Notice of Allowance", U.S. Appl. No. 13/468,918, Jun. 4, 2015, 2 page.
"Supplemental Notice of Allowance", U.S. Appl. No. 13/468,949, Jun. 5, 2015, 2 pages.
"Supplemental Notice of Allowance", U.S. Appl. No. 13/595,700, May 4, 2015, 2 pages.
"Supplemental Notice of Allowance", U.S. Appl. No. 13/595,700, May 22, 2015, 2 pages.
"Supplemental Notice of Allowance", U.S. Appl. No. 13/653,184, Jun. 24, 2015, 2 pages.
"Supplemental Notice of Allowance", U.S. Appl. No. 13/656,055, May 15, 2015, 2 pages.
"Supplemental Notice of Allowance", U.S. Appl. No. 13/656,055, Jun. 10, 2015, 2 pages.
Cunningham,"Software Infrastructure for Natural Language Processing", In Proceedings of the fifth conference on Applied natural language processing, Mar. 31, 1997, pp. 237-244.
"Advisory Action", U.S. Appl. No. 13/471,376, Sep. 23, 2015, 7 pages.

(56) References Cited

OTHER PUBLICATIONS

"Advisory Action", U.S. Appl. No. 14/059,280, Sep. 25, 2015, 7 pages.
"Corrected Notice of Allowance", U.S. Appl. No. 13/021,448, Aug. 17, 2015, 2 pages.
"Corrected Notice of Allowance", U.S. Appl. No. 13/471,030, Aug. 10, 2015, 2 pages.
"Corrected Notice of Allowance", U.S. Appl. No. 13/564,520, Aug. 14, 2015, 2 pages.
"Corrected Notice of Allowance", U.S. Appl. No. 13/564,520, Sep. 17, 2015, 2 pages.
"Corrected Notice of Allowance", U.S. Appl. No. 14/225,276, Aug. 27, 2015, 2 pages.
"Corrected Notice of Allowance", U.S. Appl. No. 14/225,276, Sep. 29, 2015, 2 pages.
"Corrected Notice of Allowance", U.S. Appl. No. 14/457,881, Aug. 20, 2015, 2 pages.
"Corrected Notice of Allowance", U.S. Appl. No. 14/457,881, Oct. 2, 2015, 2 pages.
"Extended European Search Report", EP Application No. 12800433.0, Oct. 28, 2014, 10 pages.
"Extended European Search Report", EP Application No. 13859280.3, Sep. 7, 2015, 6 pages.
"Extended European Search Report", EP Application No. 13859406.4, Sep. 8, 2015, 6 pages.
"Final Office Action", U.S. Appl. No. 13/647,479, Sep. 17, 2015, 11 pages.
"Final Office Action", U.S. Appl. No. 13/926,944, Aug. 28, 2015, 8 pages.
"Final Office Action", U.S. Appl. No. 14/063,912, Sep. 3, 2015, 13 pages.
"Foreign Office Action", CN Application No. 201280029520.4, Jun. 30, 2015, 11 pages.
"Foreign Office Action", CN Application No. 201310067385.9, Aug. 6, 2015, 16 pages.
"Foreign Office Action", JP Application No. 2012-525722, Aug. 13, 2014, 17 pages.
"International Search Report and Written Opinion", Application No. PCT/US2014/066248, Mar. 12, 2015, 10 pages.
"Non-Final Office Action", U.S. Appl. No. 13/470,951, Oct. 1, 2015, 29 pages.
"Non-Final Office Action", U.S. Appl. No. 13/471,393, Sep. 30, 2015, 15 pages.
"Non-Final Office Action", U.S. Appl. No. 13/780,228, Sep. 18, 2015, 19 pages.
"Non-Final Office Action", U.S. Appl. No. 14/162,529, Sep. 18, 2015, 13 pages.
"Non-Final Office Action", U.S. Appl. No. 14/225,250, Aug. 19, 2015, 9 pages.
"Non-Final Office Action", U.S. Appl. No. 14/225,276, Aug. 19, 2015, 9 pages.
"Notice of Allowance", U.S. Appl. No. 13/021,448, Jul. 30, 2015, 11 pages.
"Notice of Allowance", U.S. Appl. No. 13/471,054, Sep. 25, 2015, 7 pages.
"Notice of Allowance", U.S. Appl. No. 13/525,070, Sep. 25, 2015, 4 pages.
"Notice of Allowance", U.S. Appl. No. 14/727,001, Oct. 2, 2015, 4 pages.
"Restriction Requirement", U.S. Appl. No. 13/891,109, Sep. 22, 2015, 6 pages.
"Supplemental Notice of Allowance", U.S. Appl. No. 13/468,918, Aug. 7, 2015, 4 pages.
"Supplemental Notice of Allowance", U.S. Appl. No. 13/468,949, Sep. 14, 2015, 2 pages.
"Decision on Reexamination", CN Application No. 201320097079.5, Sep. 7, 2015, 8 Pages.
"Extended European Search Report", Ep Application No. 13858620.1, Sep. 18, 2015, 6 pages.
"Extended European Search Report", EP Application No. 13858834.8, Oct. 29, 2015, 8 pages.
"Final Office Action", U.S. Appl. No. 13/653,218, Oct. 5, 2015, 16 pages.
"Final Office Action", U.S. Appl. No. 13/689,541, Nov. 2, 2015, 21 pages.
"Foreign Office Action", CN Application No. 201310065273.X, Oct. 28, 2015, 14 pages.
"Foreign Office Action", CN Application No. 201310067592.4, Oct. 23, 2015, 12 Pages.
"Foreign Office Action", CN Application No. 201310067622.1, Oct. 27, 2015, 14 pages.
"Foreign Office Action", CN Application No. 201310096345.7, Oct. 19, 2015, 16 Pages.
"Foreign Office Action", CN Application No. 201310316114.2, Sep. 29, 2015, 13 pages.
"Non-Final Office Action", U.S. Appl. No. 13/468,882, Nov. 13, 2015, 9 pages.
"Non-Final Office Action", U.S. Appl. No. 13/598,898, Oct. 23, 2015, 18 pages.
"Notice of Allowance", U.S. Appl. No. 13/471,376, Nov. 23, 2015, 9 pages.
"Notice of Allowance", U.S. Appl. No. 13/471,412, Nov. 20, 2015, 10 pages.
"Notice of Allowance", U.S. Appl. No. 13/852,848, Nov. 19, 2015, 4 pages.
"Notice of Allowance", U.S. Appl. No. 14/059,280, Nov. 23, 2015, 9 pages.
"Supplemental Notice of Allowance", U.S. Appl. No. 13/471,054, Nov. 19, 2015, 2 pages.
"Supplemental Notice of Allowance", U.S. Appl. No. 13/525,070, Oct. 19, 2015, 2 pages.
"Supplementary European Search Report", EP Application No. 13728568.0, Oct. 30, 2015, 7 pages.
"Corrected Notice of Allowance", U.S. Appl. No. 13/471,054, Jan. 11, 2016, 2 pages.
"Corrected Notice of Allowance", U.S. Appl. No. 13/471,412, Feb. 16, 2016, 2 pages.
"Corrected Notice of Allowance", U.S. Appl. No. 13/525,070, Jan. 13, 2016, 2 pages.
"Corrected Notice of Allowance", U.S. Appl. No. 13/527,263, Jan. 4, 2016, 2 pages.
"Corrected Notice of Allowance", U.S. Appl. No. 13/527,263, Jan. 11, 2016, 2 pages.
"Corrected Notice of Allowance", U.S. Appl. No. 13/852,848, Jan. 29, 2016, 2 pages.
"Corrected Notice of Allowance", U.S. Appl. No. 14/727,001, Jan. 25, 2016, 2 pages.
"Corrected Notice of Allowance", U.S. Appl. No. 14/727,001, Dec. 15, 2015, 2 pages.
"Extended European Search Report", EP Application No. 13857958.6, Dec. 18, 2015, 8 pages.
"Extended European Search Report", EP Application No. 13858283.8, Nov. 23, 2015, 10 pages.
"Extended European Search Report", EP Application No. 13858397.6, Nov. 30, 2015, 7 pages.
"Extended European Search Report", EP Application No. 13858674.8, Nov. 27, 2015, 6 pages.
"Extended European Search Report", EP Application No. 13860272.7, Dec. 14, 2015, 9 pages.
"Extended European Search Report", EP Application No. 13860836.9, Nov. 27, 2015, 9 pages.
"Extended European Search Report", EP Application No. 13861292.4, Nov. 23, 2015, 7 pages.
"Final Office Action", U.S. Appl. No. 13/471,336, Dec. 10, 2015, 17 pages.
"Final Office Action", U.S. Appl. No. 14/225,250, Jan. 29, 2016, 10 pages.
"Foreign Office Action", CN Application No. 201310067373.6, Dec. 23, 2015, 15 Pages.
"Foreign Office Action", CN Application No. 201310067429.8, Nov. 25, 2015, 12 Pages.

(56) References Cited

OTHER PUBLICATIONS

"Foreign Office Action", CN Application No. 201310067631.0, Dec. 10, 2015, 11 Pages.

"Foreign Office Action", CN Application No. 201310067641.4, Dec. 30, 2015, 12 Pages.

"Foreign Office Action", CN Application No. 201310067808.7, Jan. 7, 2016, 7 Pages.

"Non-Final Office Action", U.S. Appl. No. 13/492,232, Dec. 17, 2015, 11 pages.

"Non-Final Office Action", U.S. Appl. No. 13/891,109, Jan. 29, 2016, 8 pages.

"Notice of Allowance", U.S. Appl. No. 13/371,725, Jan. 29, 2016, 10 pages.

"Notice of Allowance", U.S. Appl. No. 13/527,263, Dec. 9, 2015, 6 pages.

"Notice of Allowance", U.S. Appl. No. 13/647,479, Jan. 14, 2016, 8 pages.

"Notice of Allowance", U.S. Appl. No. 14/727,001, Dec. 15, 2015, 2 pages.

"Restriction Requirement", U.S. Appl. No. 14/794,182, Dec. 22, 2015, 6 pages.

"Supplementary European Search Report", EP Application No. 13858403.2, Nov. 25, 2015, 7 pages.

"Corrected Notice of Allowance", U.S. Appl. No. 13/371,725, Mar. 29, 2016, 2 pages.

"Corrected Notice of Allowance", U.S. Appl. No. 13/471,412, Mar. 3, 2016, 2 pages.

"Corrected Notice of Allowance", U.S. Appl. No. 13/527,263, Mar. 7, 2016, 2 pages.

"Corrected Notice of Allowance", U.S. Appl. No. 13/852,848, Mar. 2, 2016, 2 pages.

"Extended European Search Report", EP Application No. 13728568.0, Mar. 14, 2016, 16 pages.

"Final Office Action", U.S. Appl. No. 13/471,393, Mar. 9, 2016, 17 pages.

"Final Office Action", U.S. Appl. No. 13/598,898, Apr. 1, 2016, 20 pages.

"Foreign Notice of Allowance", CN Application No. 201310065273.X, Mar. 31, 2016, 4 Pages.

"Foreign Notice of Allowance", CN Application No. 201320097079.5, Apr. 1, 2016, 4 Pages.

"Foreign Office Action", CN Application No. 201310067356.2, Feb. 4, 2016, 15 Pages.

"Foreign Office Action", CN Application No. 201310067603.9, Feb. 15, 2016, 12 Pages.

"Foreign Office Action", CN Application No. 201310225788.1, Feb. 29, 2016, 11 Pages.

"Non-Final Office Action", U.S. Appl. No. 14/162,529, Apr. 6, 2016, 17 pages.

"Non-Final Office Action", U.S. Appl. No. 14/994,737, Apr. 5, 2016, 6 pages.

"Notice of Allowance", U.S. Appl. No. 13/470,951, Mar. 24, 2016, 8 pages.

"Notice of Allowance", U.S. Appl. No. 14/517,048, Feb. 24, 2016, 8 pages.

"Restriction Requirement", U.S. Appl. No. 14/307,262, Mar. 21, 2016, 6 pages.

"Corrected Notice of Allowance", U.S. Appl. No. 13/371,725, May 5, 2016, 2 pages.

"Corrected Notice of Allowance", U.S. Appl. No. 13/527,263, Apr. 12, 2016, 2 pages.

"Corrected Notice of Allowance", U.S. Appl. No. 13/527,263, Apr. 25, 2016, 2 pages.

"Corrected Notice of Allowance", U.S. Appl. No. 14/517,048, Apr. 13, 2016, 2 pages.

"Extended European Search Report", EP Application No. 13858403.2, Mar. 16, 2016, 12 pages.

"Extended European Search Report", EP Application No. 13860271.9, May 4, 2016, 8 pages.

"Extended European Search Report", EP Application No. 13861059.7, Apr. 29, 2016, 8 pages.

"Final Office Action", U.S. Appl. No. 13/492,232, May 25, 2016, 12 pages.

"Final Office Action", U.S. Appl. No. 13/780,228, Mar. 23, 2016, 16 pages.

"Foreign Notice of Allowance", CN Application No. 201310067531.8, Jun. 7, 2016, 4 pages.

"Foreign Notice of Allowance", CN Application No. 201310067592.4, May 17, 2016, 4 pages.

"Foreign Notice of Allowance", CN Application No. 201310067808.7, May 4, 2016, 4 pages.

"Foreign Office Action", CN Application No. 201310067385.9, Apr. 14, 2016, 14 Pages.

"Foreign Office Action", CN Application No. 201310067627.4, May 3, 2016, 7 pages.

"Foreign Office Action", CN Application No. 201310096345.7, May 25, 2016, 16 Pages.

"Foreign Office Action", CN Application No. 201310316114.2, Apr. 18, 2016, 11 pages.

"Foreign Office Action", CN Application No. 201380025290.9, May 10, 2016, 15 pages.

"Non-Final Office Action", U.S. Appl. No. 13/653,218, Apr. 20, 2016, 17 pages.

"Non-Final Office Action", U.S. Appl. No. 13/689,541, Apr. 14, 2016, 23 pages.

"Non-Final Office Action", U.S. Appl. No. 14/307,262, Apr. 20, 2016, 10 pages.

"Non-Final Office Action", U.S. Appl. No. 14/794,182, Apr. 13, 2016, 15 pages.

"Notice of Allowance", U.S. Appl. No. 13/468,882, May 24, 2016, 5 pages.

"Notice of Allowance", U.S. Appl. No. 13/891,109, May 6, 2016, 7 pages.

"Corrected Notice of Allowance", U.S. Appl. No. 13/470,951, Jul. 8, 2016, 2 pages.

"Corrected Notice of Allowance", U.S. Appl. No. 13/891,109, Jun. 21, 2016, 2 pages.

"Foreign Office Action", CL Application No. 14-211.785, Apr. 26, 2016, 12 pages.

"Foreign Office Action", CN Application No. 201310067622.1, Jun. 21, 2016, 13 Pages.

"Foreign Office Action", EP Application No. 14703759.2, Jun. 16, 2016, 9 pages.

"Non-Final Office Action", U.S. Appl. No. 13/780,228, Jun. 17, 2016, 18 pages.

"Non-Final Office Action", U.S. Appl. No. 13/926,944, May 2, 2016, 10 pages.

"Non-Final Office Action", U.S. Appl. No. 14/225,250, Jul. 1, 2016, 9 pages.

"Notice of Allowance", U.S. Appl. No. 14/517,048, Jul. 7, 2016, 7 pages.

"Final Office Action", U.S. Appl. No. 14/162,529, Sep. 28, 2016, 19 pages.

"Final Office Action", U.S. Appl. No. 14/307,262, Sep. 29, 2016, 7 pages.

"Final Office Action", U.S. Appl. No. 14/794,182, Sep. 15, 2016, 25 pages.

"Final Office Action", U.S. Appl. No. 14/994,737, Aug. 26, 2016, 6 pages.

"Foreign Notice of Allowance", CN Application No. 201310067631.0, Aug. 5, 2016, 4 pages.

"Foreign Notice of Allowance", CN Application No. 201310316114.2, Aug. 2, 2016, 4 pages.

"Foreign Office Action", CN Application No. 201310067373.6, Aug. 18, 2016, 16 pages.

"Foreign Office Action", CN Application No. 201310067429.8, Jul. 20, 2016, 11 pages.

"Foreign Office Action", CN Application No. 201310067641.4, Jul. 27, 2016, 8 pages.

"Foreign Office Action", CN Application No. 201310225788.1, Sep. 1, 2016, 8 pages.

(56) References Cited

OTHER PUBLICATIONS

"Non-Final Office Action", U.S. Appl. No. 13/471,336, Aug. 30, 2016, 17 pages.
"Non-Final Office Action", U.S. Appl. No. 13/471,393, Oct. 5, 2016, 17 pages.
"Non-Final Office Action", U.S. Appl. No. 13/598,898, Aug. 26, 2016, 18 pages.
"Non-Final Office Action", U.S. Appl. No. 14/147,252, Oct. 12, 2016, 17 pages.
"Non-Final Office Action", U.S. Appl. No. 14/704,423, Sep. 26, 2016, 11 pages.
"Non-Final Office Action", U.S. Appl. No. 15/050,072, Sep. 23, 2016, 5 pages.
"Supplemental Notice of Allowance", U.S. Appl. No. 14/517,048, Aug. 10, 2016, 2 pages.
"Supplemental Notice of Allowance", U.S. Appl. No. 14/517,048, Aug. 19, 2016, 2 pages.
"Final Office Action", U.S. Appl. No. 13/926,944, Sep. 23, 2016, 4 pages.
"Foreign Notice of Allowance", CN Application No. 201310067627.4, Oct. 24, 2016, 4 pages.
"Foreign Office Action", CN Application No. 201310067356.2, Oct. 9, 2016, 13 pages.
"Foreign Office Action", CN Application No. 201310067385.9, Oct. 8, 2016, 6 pages.
"Foreign Office Action", CN Application No. 201310067523.3, Nov. 7, 2016, 12 pages.
"Foreign Office Action", CN Application No. 201310067603.9, Oct. 17, 2016, 6 pages.
"Foreign Office Action", CN Application No. 201310096345.7, Oct. 9, 2016, 15 pages.
"Foreign Office Action", CN Application No. 201380025290.9, Oct. 19, 2016, 8 pages.
"Foreign Office Action", CN Application No. 201480006798.9, Sep. 14, 2016, 13 pages.
"Foreign Office Action", EP Application No. 13858283.8, Nov. 2, 2016, 5 pages.
"Foreign Office Action", EP Application No. 13858674.8, Oct. 26, 2016, 5 pages.
"Foreign Office Action", EP Application No. 14745256.9, Oct. 6, 2016, 5 pages.
"Notice of Allowance", U.S. Appl. No. 14/307,262, Nov. 30, 2016, 5 pages.
"Notice of Allowance", U.S. Appl. No. 14/994,737, Nov. 30, 2016, 5 pages.
"Restriction Requirement", U.S. Appl. No. 13/653,218, Oct. 21, 2016, 6 pages.
"Corrected Notice of Allowance", U.S. Appl. No. 14/944,737, Jan. 18, 2017, 2 pages.
"Examiner's Answer to Appeal Brief", U.S. Appl. No. 13/492,232, Feb. 9, 2017, 5 pages.
"Final Office Action", U.S. Appl. No. 14/225,250, Dec. 27, 2016, 10 pages.
"Foreign Notice of Allowance", CN Application No. 201310067429.8, Dec. 13, 2016, 4 pages.
"Foreign Office Action", CN Application No. 201310067373.6, Dec. 27, 2016, 12 pages.
"Foreign Office Action", CN Application No. 201310067622.1, Nov. 23, 2016, 16 pages.
"Foreign Office Action", CN Application No. 201380045602.2, Dec. 14, 2016, 12 pages.
"Foreign Office Action", CN Application No. 201480036444.9, Nov. 11, 2016, 12 pages.
"Foreign Office Action", JP Application No. 2014-560073, Jan. 4, 2017, 7 pages.
"Foreign Office Action", JP Application No. 2014-560119, Jan. 4, 2017, 6 pages.
"Foreign Office Action", JP Application No. 2014-560120, Jan. 10, 2017, 5 pages.
"Foreign Office Action", JP Application No. 2014-560122, Dec. 6, 2016, 10 pages.
"Non-Final Office Action", U.S. Appl. No. 14/162,529, Jan. 12, 2017, 24 pages.
"Non-Final Office Action", U.S. Appl. No. 14/847,838, Dec. 16, 2016, 24 pages.
"Foreign Notice of Allowance", CN Application No. 201310096345.7, Feb. 4, 2017, 4 pages.
"Foreign Office Action", U.S. Appl. No. 13861292.4, Jan. 3, 2017, 4 pages.
"Foreign Office Action", CN Application No. 201310067641.4, Jan. 23, 2017, 7 pages.
"Foreign Office Action", EP Application No. 13756229.4, Jan. 9, 2017, 4 pages.
"Foreign Office Action", EP Application No. 13859661.4, Dec. 23, 2016, 4 pages.
"Foreign Office Action", JP Application No. 2014-560121, Dec. 20, 2016, 8 pages.
"Non-Final Office Action", U.S. Appl. No. 14/692,497, Feb. 22, 2017, 8 pages.

* cited by examiner

COMPUTING DEVICE AND AN APPARATUS HAVING SENSORS CONFIGURED FOR MEASURING SPATIAL INFORMATION INDICATIVE OF A POSITION OF THE COMPUTING DEVICES

RELATED APPLICATIONS

This application is a continuation of and claims priority under 35 U.S.C §120 to U.S. patent application Ser. No. 14/018,286, filed Sep. 4, 2013, titled "A Computing Device and an Apparatus Having Sensors Configured for Measuring Spatial Information Indicative of a Position of the Computing Devices" which is a continuation of and claims priority under 35 U.S.C §120 to U.S. patent application Ser. No. 13/651,272, filed Oct. 12, 2012, titled "Sensor Fusion Algorithm," which is a continuation of and claims priority under 35 U.S.C §120 to U.S. patent application Ser. No. 13/471,202, filed May 14, 2012, titled "Sensor Fusion Algorithm," which claims priority under 35 U.S.C. §119(e) to the following U.S. Provisional Patent Applications, the entire disclosures of each of these applications being incorporated by reference in their entirety:

U.S. Provisional Patent Application No. 61/606,321, filed Mar. 2, 2012, and titled "Screen Edge;"

U.S. Provisional Patent Application No. 61/606,301, filed Mar. 2, 2012, and titled "Input Device Functionality;"

U.S. Provisional Patent Application No. 61/606,313, filed Mar. 2, 2012, and titled "Functional Hinge;"

U.S. Provisional Patent Application No. 61/606,333, filed Mar. 2, 2012, and titled "Usage and Authentication;"

U.S. Provisional Patent Application No. 61/613,745, filed Mar. 21, 2012, and titled "Usage and Authentication;"

U.S. Provisional Patent Application No. 61/606,336, filed Mar. 2, 2012, and titled "Kickstand and Camera;" and U.S. Provisional Patent Application No. 61/607,451, filed Mar. 6, 2012, and titled "Spanaway Provisional."

BACKGROUND

Mobile computing devices have been developed to increase the functionality that is made available to users in a mobile setting. For example, a user may interact with a mobile phone, tablet computer, or other mobile computing device to check email, surf the web, compose texts, interact with applications, and so on. Some mobile computing devices may connect to and interact with various accessory devices to provide different input techniques, extend functionality, and so forth. One challenge that faces developers of mobile computing devices is managing behaviors and interaction with accessory devices. For instance, a host computing device may have limited control over how an accessory device behaves and thus actions of the accessory may sometimes interfere with operation of the host computing device. Moreover, the user experience may be adversely affected by accessory devices that do not respond in a manner that is consistent with the host computing device. Thus, integrated management of behaviors and interaction for accessory devices may be a challenging consideration for developers of mobile computing devices.

SUMMARY

Sensor fusion algorithm techniques are described. In one or more embodiments, behaviors of a host device and accessory devices are controlled based upon an orientation of the host device and accessory devices, relative to one another. A combined spatial position and/or orientation for the host device may be obtained based on raw measurements that are obtained from at least two different types of sensors. In addition, a spatial position and/or orientation for an accessory device is ascertained using one or more sensors of the accessory device. An orientation (or position) of the accessory device relative to the host computing device may then be computed based on the combined spatial position/orientation for the host computing device and the ascertained spatial position/orientation for the accessory device. The relative orientation that is computed may then be used in various ways to control behaviors of the host computing device and/or accessory device.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Traditionally, a host computing device may have limited control over how an associated accessory device behaves. Thus actions of the accessory may sometimes interfere with operation of the host computing device, which may detract from the user experience. Accordingly, integrated management of behaviors and interaction for accessory devices may be a consideration for developers of mobile computing devices.

Sensor fusion algorithm techniques are described. In one or more embodiments, behaviors of a host device and accessory devices are controlled based upon an orientation of the host device and accessory devices, relative to one another. A combined spatial position and/or orientation for the host device may be obtained based on raw measurements that are obtained from at least two different types of sensors. In addition, a spatial position and/or orientation for an accessory device is ascertained using one or more sensors of the accessory device. An orientation (or position) of the accessory device relative to the host computing device may then be computed based on the combined spatial position/orientation for the host computing device and the ascertained spatial position/orientation for the accessory device. The relative orientation that is computed may then be used in various ways to control behaviors of the host computing device and/or accessory device.

In the following discussion, an example environment and devices are first described that may employ the techniques described herein. Example procedures are then described which may be performed in the example environment and by the devices as well as in other environments and by other devices. Consequently, performance of the example procedures is not limited to the example environment/devices and the example environment/devices are not limited to performance of the example procedures.

Example Operating Environment

Figure 1:
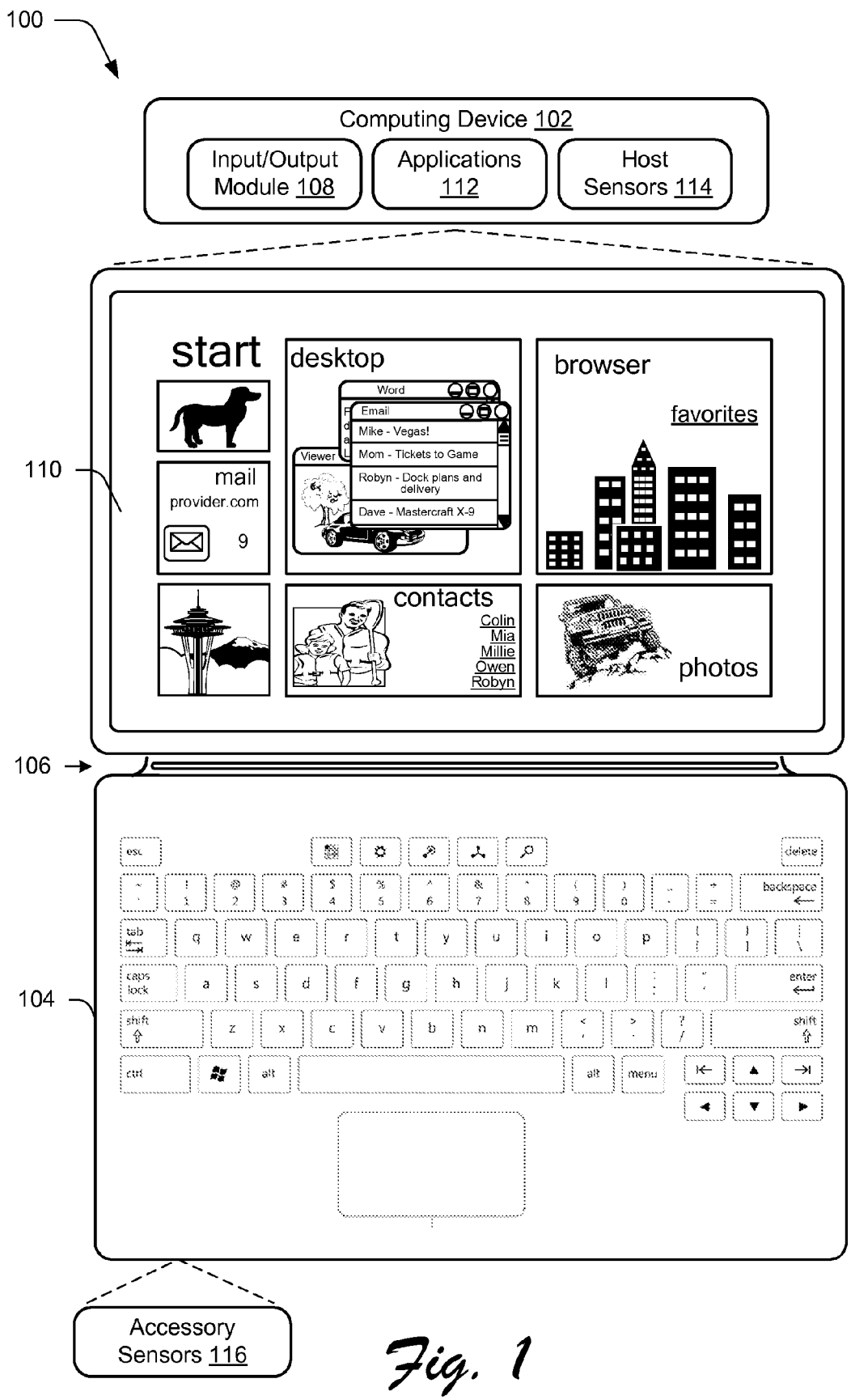
FIG. 1 is an illustration of an environment in an example implementation that is operable to employ the techniques described herein.

FIG. 1 is an illustration of an environment 100 in an example implementation that is operable to employ the techniques described herein. The illustrated environment 100 includes an example of a computing device 102 that is physically and communicatively coupled to an accessory device 104 via a flexible hinge 106. The computing device 102 may be configured in a variety of ways. For example, the computing device 102 may be configured for mobile use, such as a mobile phone, a tablet computer as illustrated, and so on. Thus, the computing device 102 may range from full resource devices with substantial memory and processor resources to a low-resource device with limited memory and/or processing resources. The computing device 102 may also relate to software that causes the computing device 102 to perform one or more operations.

The computing device 102, for instance, is illustrated as including an input/output module 108. The input/output module 108 is representative of functionality relating to processing of inputs and rendering outputs of the computing device 102. A variety of different inputs may be processed by the input/output module 108, such as inputs relating to functions that correspond to keys of the input device, keys of a virtual keyboard displayed by the display device 110 to identify gestures and cause operations to be performed that correspond to the gestures that may be recognized through the accessory device 104 and/or touchscreen functionality of the display device 110, and so forth. Thus, the input/output module 108 may support a variety of different input techniques by recognizing and leveraging a division between types of inputs including key presses, gestures, and so on.

In the illustrated example, the accessory device 104 is a device configured as a keyboard having a QWERTY arrangement of keys although other arrangements of keys are also contemplated. Further, other non-conventional configurations for an accessory device 104 are also contemplated, such as a game controller, configuration to mimic a musical instrument, a power adapter, and so forth. Thus, the accessory device 104 may assume a variety of different configurations to support a variety of different functionality. Different accessory devices may be connected to the computing device at different times. Moreover, functionally of a particular accessory device may also be adapted to assume different configurations and capabilities, such as through different selectable modes, software/firmware updates, modular add-on devices/components, and so forth. This may cause changes in the way keys or other controls for an accessory are laid-out and also change the way on which inputs from the accessory are handled by the host and applications. For example, an accessory device may be operable as keyboard and as a game controller by adaptively switching the kinds of keys/controls, displayed labels, and positions of controls to assume different configurations at different times.

As previously described, the accessory device 104 is physically and communicatively coupled to the computing device 102 in this example through use of a flexible hinge 106. The flexible hinge 106 represents one illustrative example of an interface that is suitable to connect and/or attach and accessory device to a host computing device 102. The flexible hinge 106 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one direction (e.g., vertically in the figure) yet restrict movement in other directions, such as lateral movement of the accessory device 104 in relation to the computing device 102. This may be used to support consistent alignment of the accessory device 104 in relation to the computing device 102, such as to align sensors used to change power states, application states, and so on.

The flexible hinge 106, for instance, may be formed using one or more layers of fabric and include conductors formed as flexible traces to communicatively couple the accessory device 104 to the computing device 102 and vice versa. This communication, for instance, may be used to communicate a result of a key press to the computing device 102, receive power from the computing device, perform authentication, provide supplemental power to the computing device 102, and so on. The flexible hinge 106 or other interface may be configured in a variety of ways to support multiple different accessory devices 104, further discussion of which may be found in relation to the following figure.

As further illustrated in FIG. 1 the computing device 102 may include various applications 112 that provide different functionality to the device. A variety of applications 112 typically associated with computing devices are contemplated including, but not limited to, an operating system, a productivity suite that integrates multiple office productivity modules, a web browser, games, a multi-media player, a word processor, a spreadsheet program, a photo manager, and so forth. The computing device 102 further includes multiple host sensors 114 that are configured to sense corresponding inputs responsive to manipulation of the computing device 102. Likewise, the accessory device 104 includes one or more accessory sensors 116 that are configured to sense corresponding inputs generated responsive to manipulation of the accessory device 104.

In accordance with techniques described herein, input obtained from the host sensors 114 and accessory sensors 116 may be processed and/or combined according to a suitable sensor fusion algorithm to resolve an orientation of the accessory device 104 and computing device 102 one to another. In general, input regarding position and/or orientation from multiple different types of sensors is processed in combination to compute the orientation. The computed orientation may then be used to control behaviors of the host and accessory and perform various corresponding operations. A variety of different types of sensors and algorithms suitable to resolve the orientation may be employed as discussed in greater detail in relation to the following figures.

Figure 2:
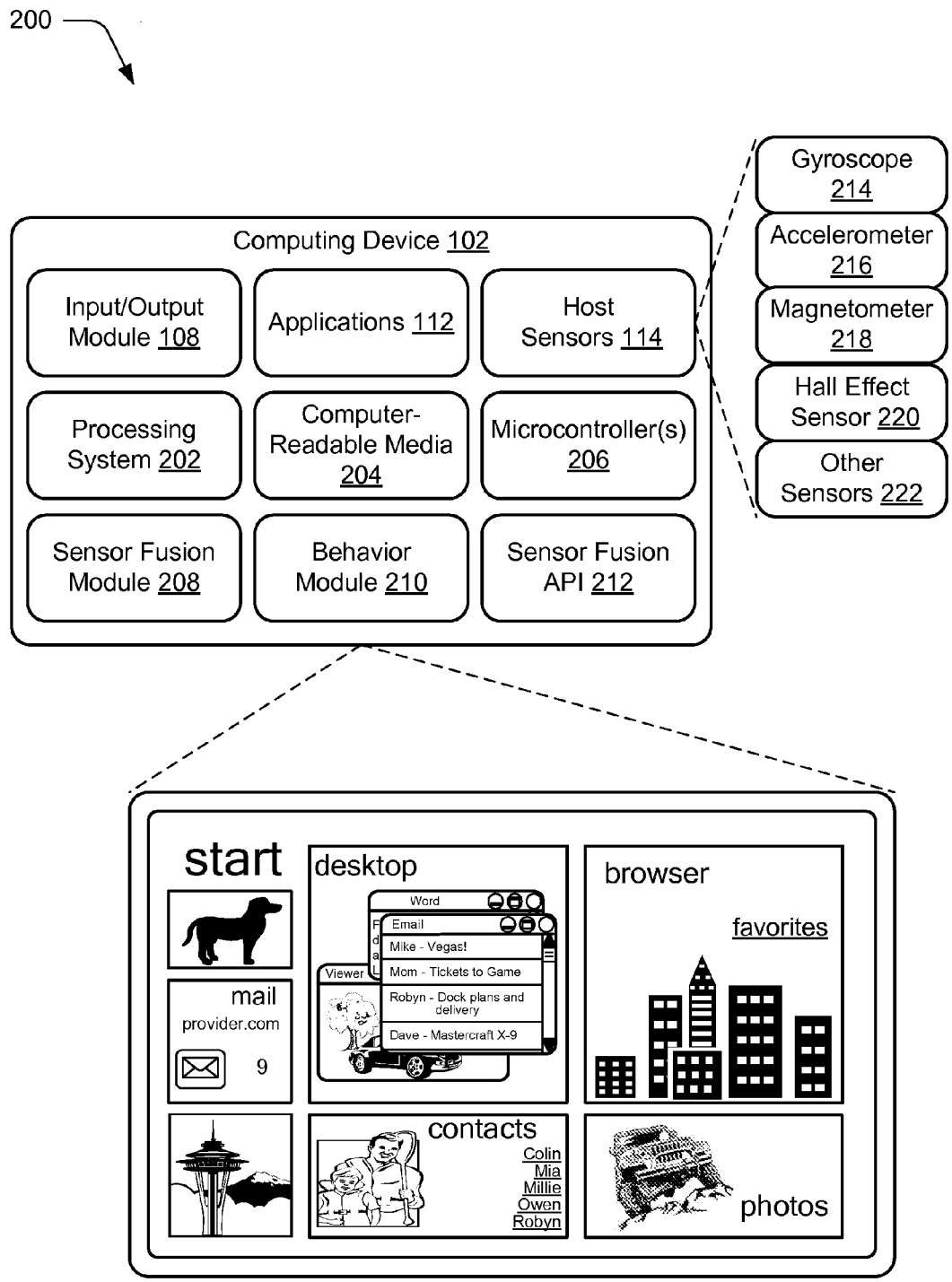
FIG. 2 depicts an example implementation of a computing device of FIG. 1 in greater detail.

To further illustrate, consider FIG. 2 which depicts generally at 200 an example computing device 102 of FIG. 1 in greater detail. In the depicted example, the computing device 102 is shown in a stand-alone configuration without an accessory device 104 being attached. In addition to the components discussed in relation to FIG. 1, the example computing device of FIG. 2 further includes a processing system 202 and computer-readable media 204 that are representative of various different types and combinations of processing components, media, memory, and storage components and/or devices that may be associated with a computing device and employed to provide a wide range of device functionality. In at least some embodiments, the processing system 202 and computer-readable media 204 represent processing power and memory/storage that may be employed for general purpose computing operations. More generally, the computing device 102 may be configured as any suitable computing system and/or device that employ various processing systems and computer-readable media, additional details and examples of which are discussed in relation to the example computing system of FIG. 13.

The computing device 102 may also implement selected device functionality through one or more microcontrollers 206. The microcontrollers 206 represent hardware devices/systems that are designed to perform a predefined set of designated tasks. The microcontrollers 206 may represent respective on-chip systems/circuits having self-contained resources such as processing components, I/O devices/peripherals, various types of memory (ROM, RAM, Flash, EEPROM), programmable logic, and so forth. Different microcontrollers may be configured to provide different embedded applications/functionality that are implemented at least partially in hardware and perform corresponding tasks. The microcontrollers 206 enable performance of some tasks outside of operation of a general purpose processing system and other applications/components of the computing device or accessory device. Generally, power consumption of the microcontrollers is low in comparison with operating a general purpose processing system for a device.

As further depicted, the computing device 102 may further include a sensor fusion module 208, a behavior module 210, and a sensor fusion application programming interface (API) 212 to implement aspects of sensor fusion algorithm techniques described herein. The sensor fusion module 208 generally represents functionality to apply a suitable sensor fusion algorithm as described above and below to derive an orientation that is based on input from multiple sensors. The sensor fusion module 208 may operate to collect inputs regarding positions/orientation/etc. supplied via the various sensors, process the inputs, and compute a corresponding orientation that describe the spatial relationship of the computing device 102 and an accessory device 104.

The behavior module 210 represents functionality to control and/or modify a variety of different behaviors associated with the computing device 102 and/or accessory devices 104 based on the computed orientation. This may include but is not limited to managing power states/consumption, selecting operational modes or device states, adjusting sensitivity of one or more sensors, controlling interaction between the host, accessory, and/or peripheral devices, modifying device functionality, enabling/disabling network connections, activating/deactivating applications, and/or setting application states, to name a few examples. These and other examples of behaviors that may be controlled based on a computed orientation are described in greater detail in relation to the example procedures discussed herein below.

The sensor fusion application programming interface (API) 212 represents functionality to expose information regarding the computer orientation for use by applications 112. For example, applications 112 may utilize the sensor fusion API to request orientation information on demand and/or subscribe to orientation updates from the sensor fusion module 208 and/or an associated notification system. The sensor fusion API may then interact with the sensor fusion module 208 on behalf of the application 112 to cause orientation information to be conveyed to the application 112. Applications 112 may use orientation information in various ways, example of which may be found in the discussion of an example procedure 1200 of FIG. 12 below.

As previously mentioned, various different types of sensors may be employed to implement the techniques described herein. A host computing device may include an array of sensors used to provide orientation information. By way of example and not limitation, the host sensors 114 for the example computing device 102 of FIG. 2 are depicted as including a gyroscope 214, an accelerometer 216, a magnetometer 218, and a Hall Effect sensor 220. Various other sensors 222 suitable to derive information regarding the position and/or orientation may also be employed.

Figure 3:
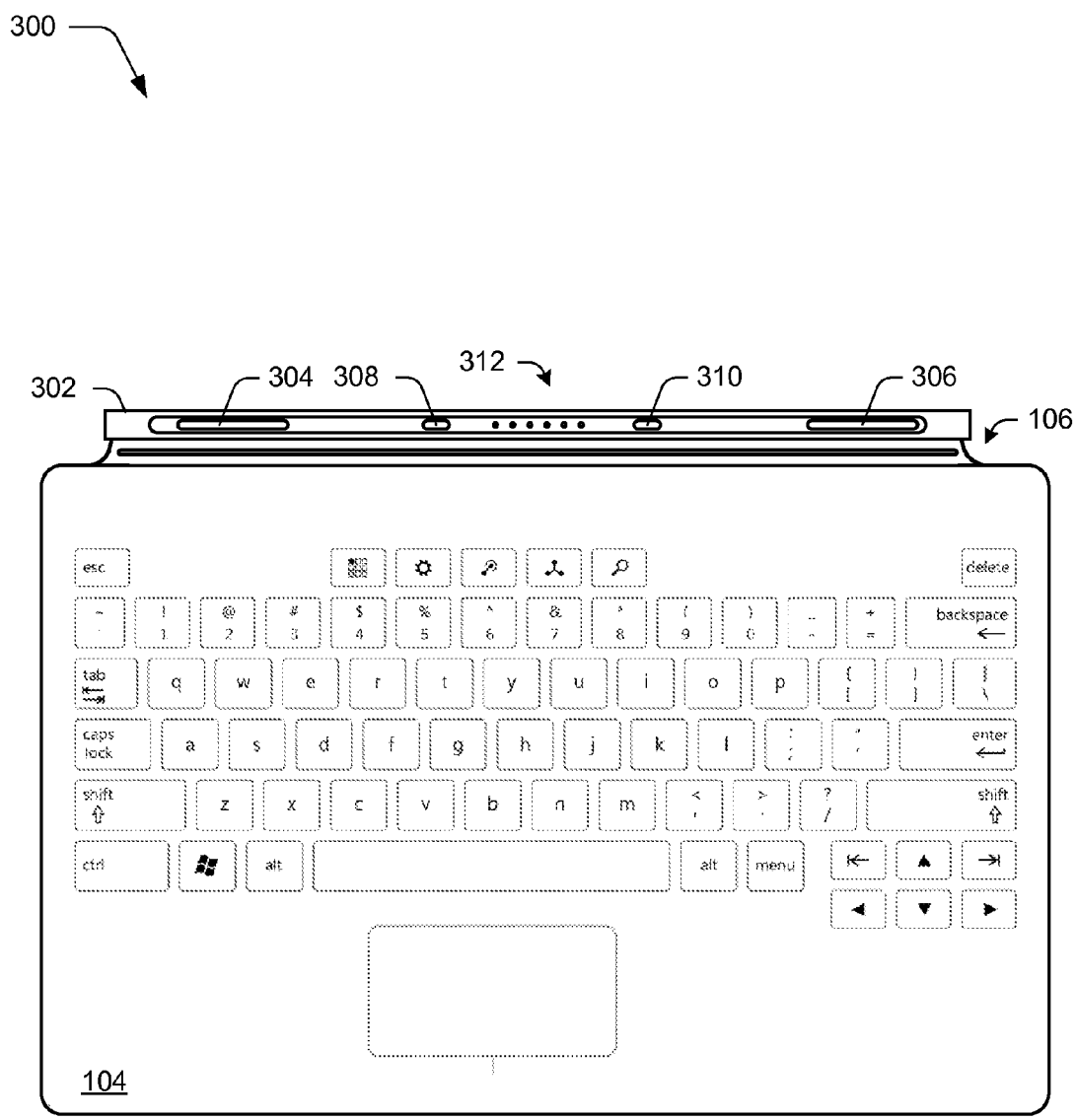
FIG. 3 depicts an example implementation of an accessory device of FIG. 1 as showing a flexible hinge in greater detail.

FIG. 3 depicts an example implementation 300 of the accessory device 104 of FIG. 1 as showing the flexible hinge 106 in greater detail. In this example, the accessory device 104 is depicted as being detached from the computing device. Here, a connection portion 302 of the input device is shown that is configured to provide a communicative and physical connection between the accessory device 104 and the computing device 102. In this example, the connection portion 302 has a height and cross section configured to be received in a channel in the housing of the computing device 102, although this arrangement may also be reversed without departing from the spirit and scope thereof. The connection portion 302 provides an interface through which attachment/connection of the accessory device 104 to the computing device may be detected. In at least some embodiments, this interface also enables communications for interaction and/or control of the accessory device 104 as described herein. For example, the computing device 102, sensor fusion module 208, and/or behavior module 210 may communicate with the accessory device through the interface to obtain input from various accessory sensors 116 and to direct behaviors of the accessory device.

The connection portion 302 is flexibly connected to a portion of the accessory device 104 that includes the keys through use of the flexible hinge 106. Thus, when the connection portion 302 is physically connected to the computing device the combination of the connection portion 302 and the flexible hinge 106 supports movement of the accessory device 104 in relation to the computing device 102 that is similar to a hinge of a book. Naturally, a variety of orientations may be supported some examples of which are described in the following section.

The connecting portion 302 is illustrated in this example as including magnetic coupling devices 304, 306, mechanical coupling protrusions 308, 310, and a plurality of communication contacts 312. The magnetic coupling devices 304, 306 are configured to magnetically couple to complementary magnetic coupling devices of the computing device 102 through use of one or more magnets. In this way, the accessory device 104 may be physically secured to the computing device 102 through use of magnetic attraction. The connecting portion 302 also includes mechanical coupling protrusions 308, 310 to form a mechanical physical connection between the accessory device 104 and the computing device 102. The communication contacts 212 are configured to contact corresponding communication contacts of the computing device 102 to form a communicative coupling between the devices to facilitate various kinds of communications.

Having discussed an example environment in which embodiments may operate, consider now some example device orientations in accordance with one or more embodiments.

Example Device Orientations

The following discussion presents some example device orientations. As detailed, different device orientations can be associated with different device power states, different application states, trigger different behaviors, and so forth. The example orientations as well as other orientations may be determined using sensor fusion algorithm techniques described above and below. A determined orientation may then be used to drive different behaviors for the host and/or the accessory.

Figure 4:
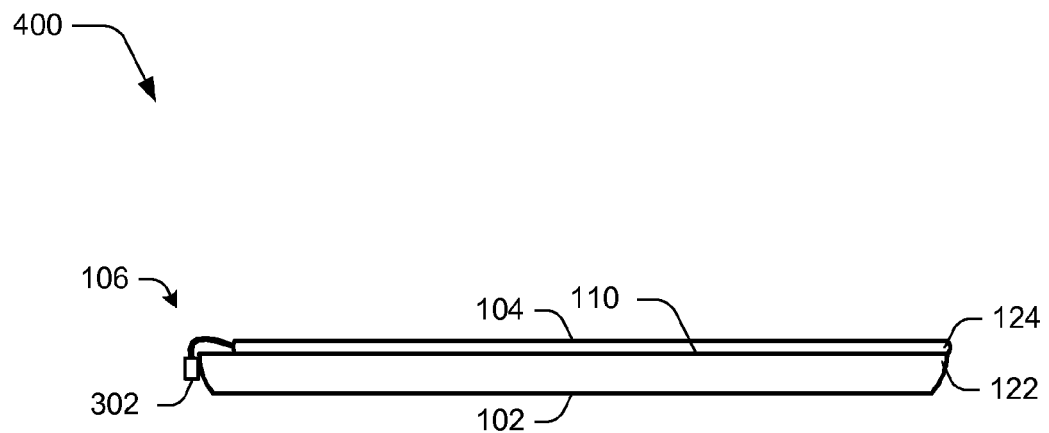
FIG. 4 depicts an example orientation of the accessory device in relation to the computing device in accordance with one or more embodiments.

FIG. 4 illustrates that the accessory device 104 may be rotated such that the accessory device 104 is placed against the display device 110 of the computing device 102 to assume an orientation 400. In the orientation 400, the accessory device 104 may act as a cover such that the accessory device 104 can protect the display device 110 from harm. In implementations, the orientation 400 can correspond to a closed position of the computing device 102.

Figure 5:
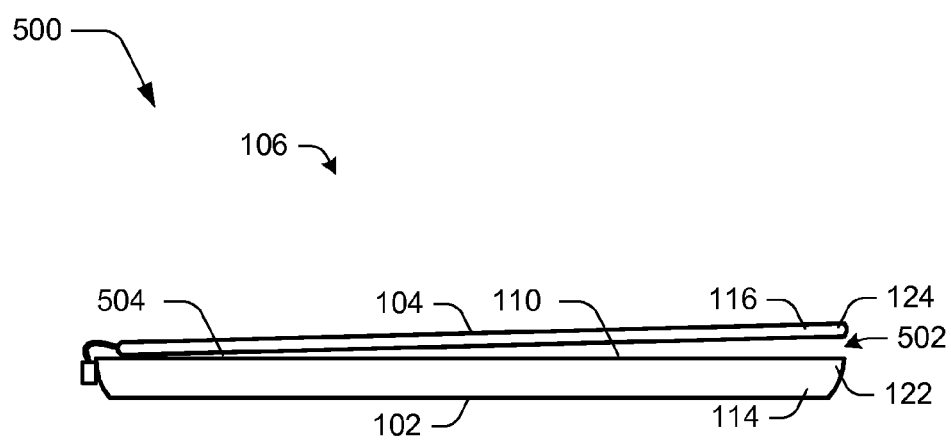
FIG. 5 depicts an example orientation of the accessory device in relation to the computing device in accordance with one or more embodiments.

FIG. 5 illustrates that the input device 104 has rotated away from the computing device 102 such that the computing device assumes an orientation 500. The orientation 400 includes a gap 502 that is introduced between the computing device 102 and the accessory device 104. In implementations, the orientation 500 can be caused unintentionally by a user, such as by inadvertent contact with the computing device 102 and/or the accessory device 104 that causes the computing device 102 to sag slightly away from the accessory device 104 such that the gap 502 is introduced.

Figure 6:
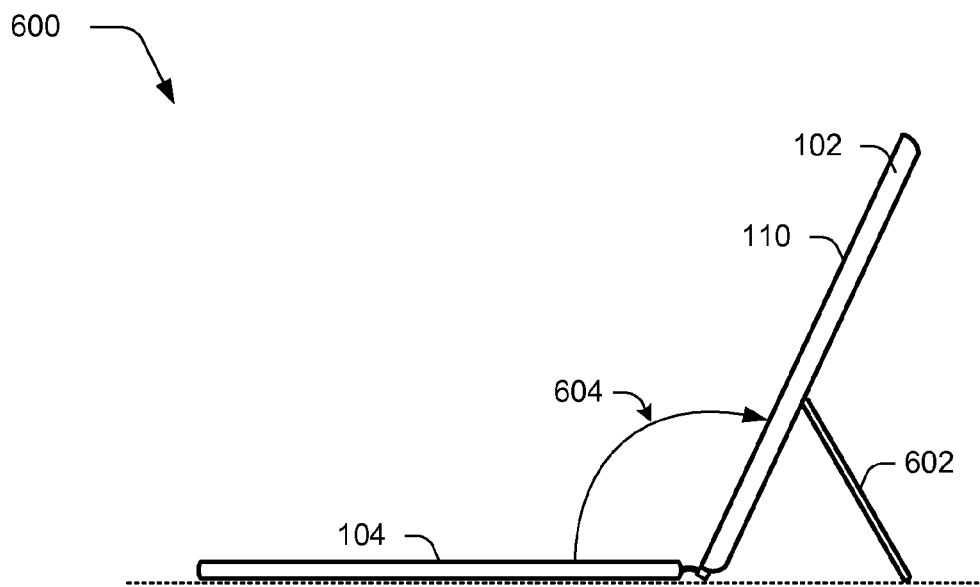
FIG. 6 depicts an example orientation of the accessory device in relation to the computing device in accordance with one or more embodiments.

FIG. 6 illustrates an example orientation 600 of the computing device 102. In the orientation 600, the accessory device 104 is laid flat against a surface and the computing device 102 is disposed at an angle to permit viewing of the display device 110, e.g., such as through use of a kickstand 602 disposed on a rear surface of the computing device 102. The orientation 600 can correspond to a typing arrangement whereby input can be received via the accessory device 104, such as using keys of a keyboard, a track pad, and so forth.

Figure 7:
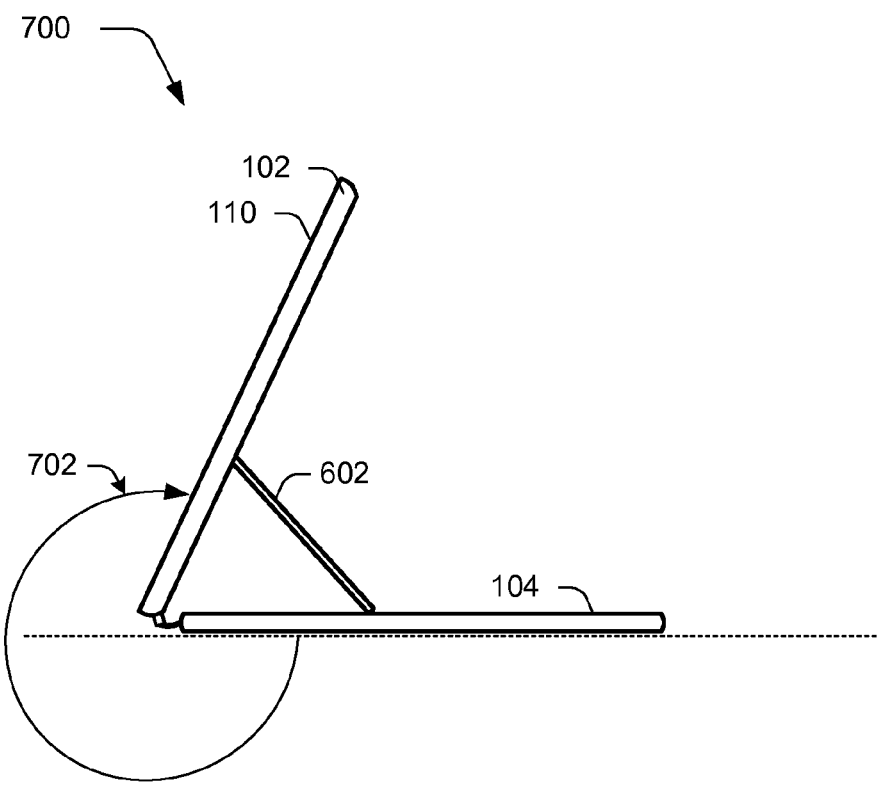
FIG. 7 depicts an example orientation of the accessory device in relation to the computing device in accordance with one or more embodiments.

FIG. 7 illustrates a further example orientation of the computing device 102, generally at 700. In the orientation 700, the computing device 102 is oriented such that the display device 110 faces away from the accessory device 104. In this example, the kickstand 602 can support the computing device 102, such as via contact with a back surface of the accessory device 104. Although not expressly illustrated here, a cover can be employed to cover and protect a front surface of the accessory device 104. In the depicted orientation, an angle 702 between the device and host is established. Various different angles corresponding to different positions/orientation may be established, as discussed above and below.

Figure 8:
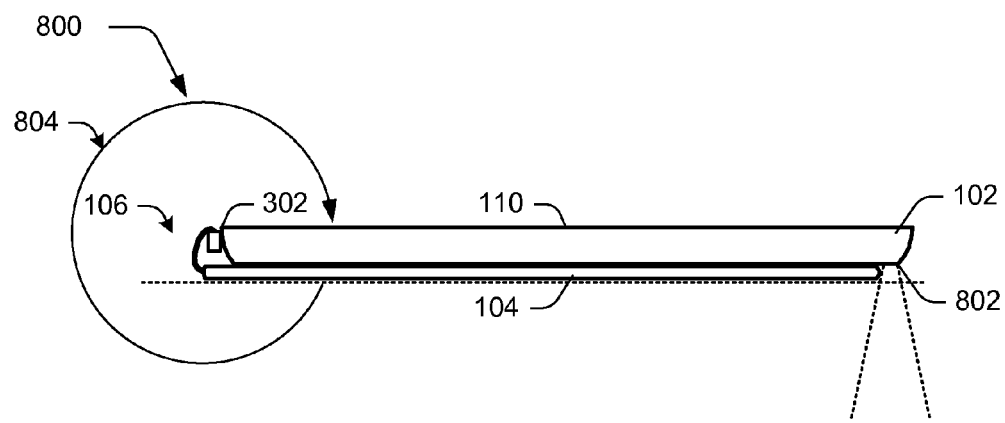
FIG. 8 depicts an example orientation of the accessory device in relation to the computing device in accordance with one or more embodiments.

FIG. 8 illustrates an example orientation 800, in which the accessory device 104 may also be rotated so as to be disposed against a back of the computing device 102, e.g., against a rear housing of the computing device 102 that is disposed opposite the display device 110 on the computing device 102. In this example, through orientation of the connection portion 202 to the computing device 102, the flexible hinge 106 is caused to "wrap around" the connection portion 202 to position the accessory device 104 at the rear of the computing device 102.

This wrapping causes a portion of a rear of the computing device 102 to remain exposed. This may be leveraged for a variety of functionality, such as to permit a camera 802 positioned on the rear of the computing device 102 to be used even though a significant portion of the rear of the computing device 102 is covered by the accessory device 104 in the example orientation 800. Further to the example illustrated in FIG. 8, the display device 110 of the computing device 102 may be determined to be oriented at an angle 804 relative to the accessory device 104. In general, the angle 804 may change as the accessory device 104 is manipulated into different positions. For example, the angle 804 as shown in FIG. 8 can be determined to be approximately 360 degrees. Other orientations may correspond to other angles, and angle ranges may be established and associated with defined modes or states that may trigger different behaviors. Thus, behaviors may be controlled based on the particular mode/state that correspond to the current angle between the host and accessory.

Figure 9:
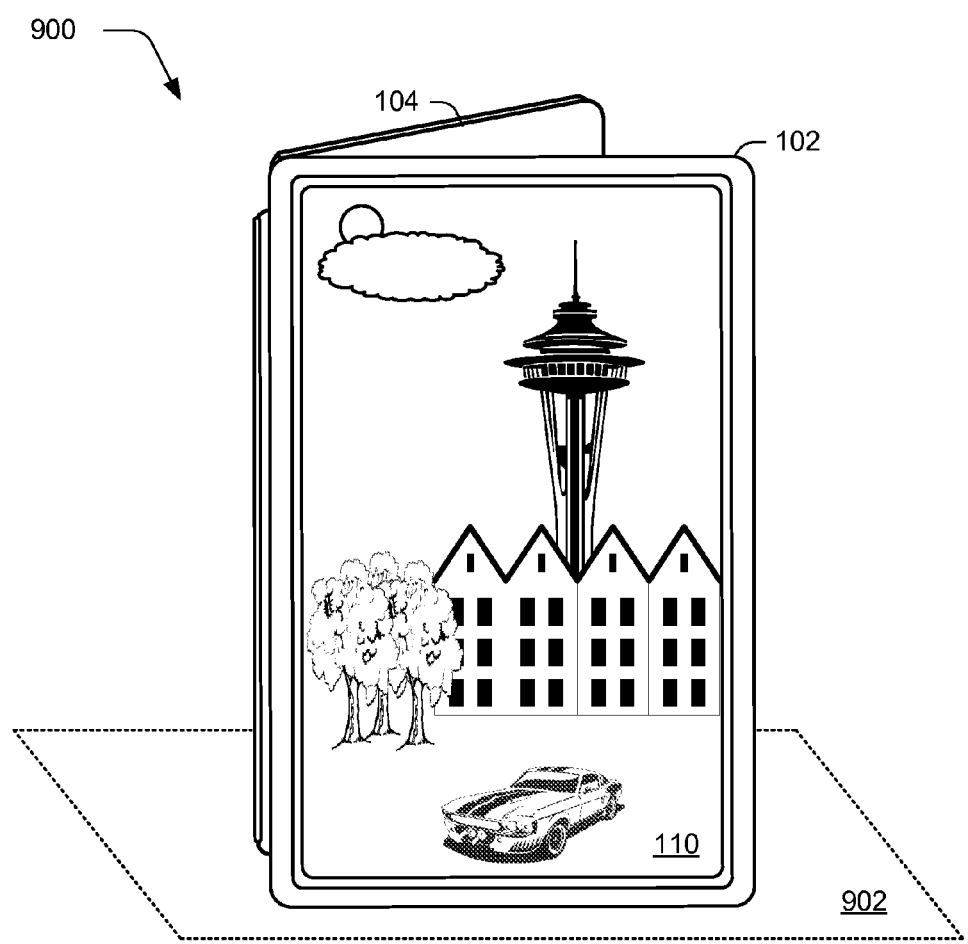
FIG. 9 depicts an example orientation of the accessory device in relation to the computing device in accordance with one or more embodiments.

FIG. 9 illustrates a further example orientation of the computing device 102, generally at 900. In the orientation 900, the computing device 102 is rotated sideways, e.g., in a portrait orientation relative to a surface 902 on which the computing device 102 is disposed. The display device 110 is visible, with the accessory device 104 rotated away from the display device 110. In at least some implementations, a width of the accessory device 104 can be narrower than a width of the computing device 102. Additionally or alternatively, the width of the accessory device 104 can be tapered such that the edge closest to the hinge 106 is wider than the outermost edge. This can enable the face of the display device 110 to recline back in the orientation 900, to provide for a suitable viewing angle.

Figure 10:
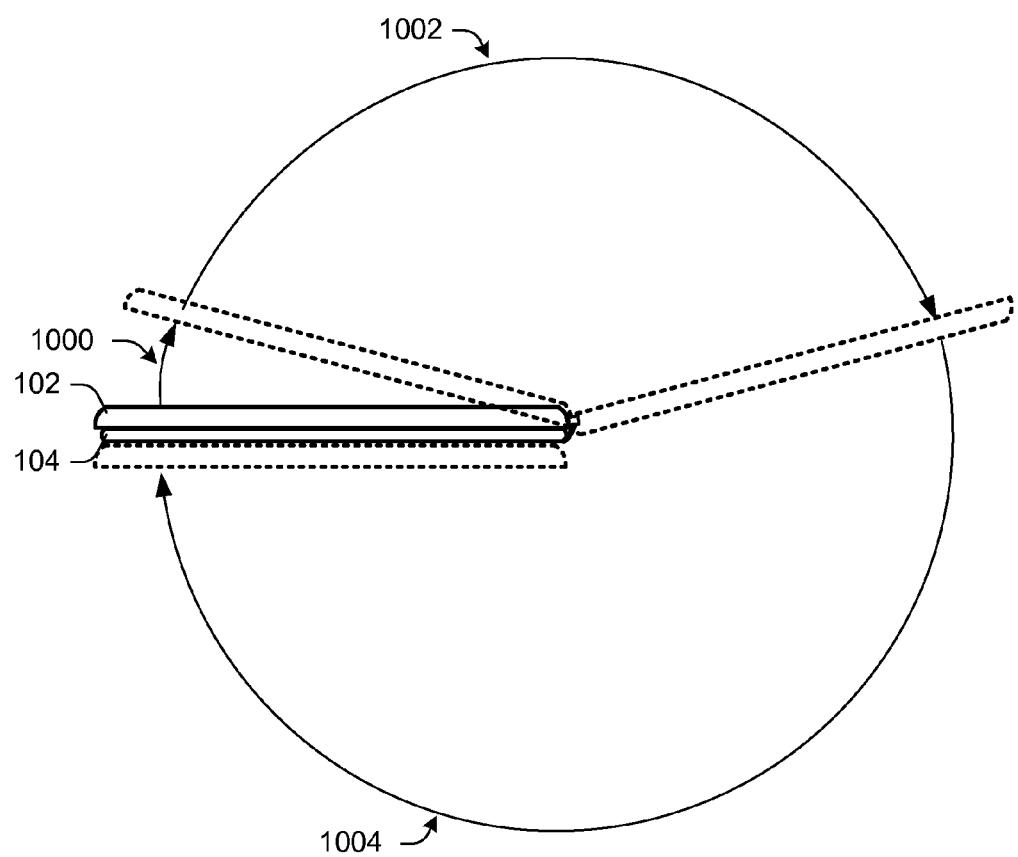
FIG. 10 depicts illustrates some example rotational orientations of the computing device in relation to the input device in accordance with one or more embodiments.

FIG. 10 illustrates that the computing device 102 may be rotated within a variety of different angle ranges with respect to the accessory device 104. As detailed herein, different angle ranges can be associated with different power states, different application states, and so on.

An angle range 1000 is illustrated, which corresponds to a closed position for the computing device 102. Thus, if the computing device 102 is positioned at an angle within the angle range 1000 relative to the accessory device 104, the computing device 102 can be determined to be in a closed position. A closed position can include an associated closed state where various functionalities/behaviors for the computing device 102 and accessory device 104 can be modified accordingly based on the closed state.

Further illustrated is an angle range 1002, which may correspond to a typing orientation for the computing device 102. Thus, if the computing device 102 is positioned at an angle within the angle range 1002 relative to the accessory device 104, the computing device 102 can be determined to be in a typing orientation. Within this orientation, the computing device 102 and/or the accessory device 104 can placed in a typing power state where functionalities/behaviors for the computing device 102 and accessory device 104 can be customized accordingly based on the typing state.

FIG. 10 further illustrates an angle range 1004, which corresponds to a viewing position for the computing device 102. Thus, if the computing device 102 is positioned at an angle within the angle range 1004 relative to the accessory device 104, the computing device 102 can be determined to be in a viewing orientation. In this orientation, functionalities/behaviors for the computing device 102 and accessory device 104 can be controlled accordingly based on the viewing state.

The orientations, angle ranges, power states, and so forth discussed above are presented for purposes of illustration only. It is contemplated that a wide variety of different orientations, device states, and angle ranges may be implemented within the spirit and scope of the claimed embodiments.

Having discussed some example device orientations, consider now some example procedures in accordance with one or more embodiments.

Example Procedures

The following discussion describes sensor fusion algorithm techniques that may be implemented utilizing the previously described systems and devices. Aspects of each of the procedures may be implemented in hardware, firmware, software, or a combination thereof. The procedures are shown as a set of blocks that specify operations performed by one or more devices and are not necessarily limited to the orders shown for performing the operations by the respective blocks. In portions of the following discussion, reference may be made to the example operating environment 100 of FIG. 1, the example devices of FIGS. 2-3, and the example orientation shown in FIGS. 4-10, respectively.

Figure 11:
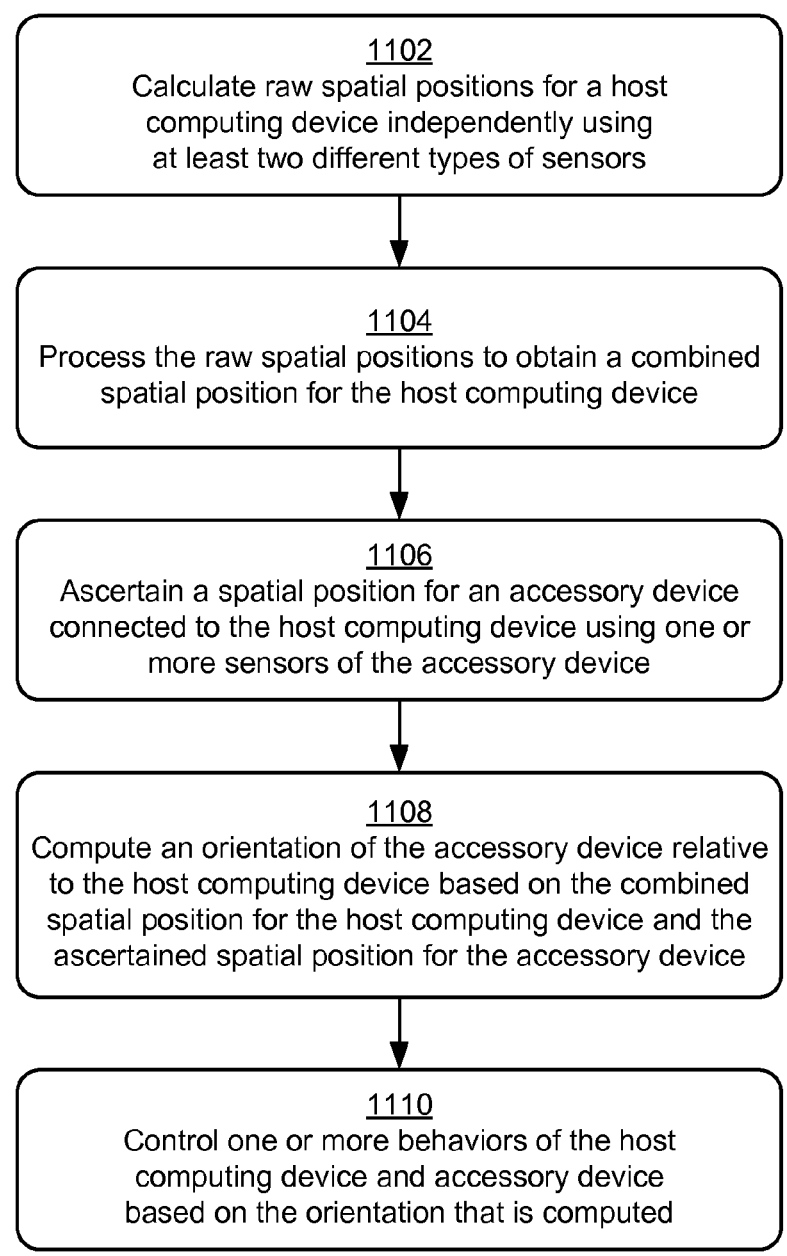
FIG. 11 is a flow diagram that describes an example procedure in accordance with one or more embodiments.

FIG. 11 depicts an example procedure 1100 in which an orientation of an accessory relative to a host is computed. In at least some embodiments, the procedure may be performed by a suitably configured computing device, such as the example computing device 102 of FIG. 2 that includes or otherwise make use of a sensor fusion module 208 and/or behavior module 210.

Raw spatial positions for a host computing device are calculated independently using at least two different types of sensors (block 1102). The raw spatial positions are processed to obtain a combined spatial position for the host computing device (block 1104).

For example, the sensor fusion module 208 may be configured to implement a designated sensor fusion algorithm. Generally, the sensor fusion algorithm is configured to aggregate information from an array of different kinds of host sensors 114 employed by a computing device 102. The aggregation of multiple different sensing techniques and types of sensors may provide improved resolution of positions and may smooth errors that may be introduced by individual techniques and sensors. In at least some embodiments, the sensor fusion algorithm is configured to calculate at least two independent computations of the raw spatial position of the computing device 102 using different respective sensors. Multiple independent computations of the raw position may then be used to produce a combined spatial position. Each of the independent computations may employ one or more of the various types of host sensors 114 described above and below. At least some of the sensors used for different independent computations are of different types. Thus, the sensor fusion algorithm obtains input from a variety of different host sensors 114 and combines this information to resolve the position of the computing device 102.

In one approach, the computing device 102 includes a gyroscope 214 that may be used to obtain one of the independent computations of the raw position. Generally, a gyroscope uses principles of angular momentum to calculate orientation and rotation. The gyroscope 214 can be used to recognize movement within three-dimensional space and may enable determination of position with respect to a reference object/point, such as the earth. Using input obtained from the gyroscope 214, the sensor fusion module 208 may operate to compute a raw spatial position for the computing device. The raw spatial position may be expressed as coordinates in a three dimensional coordinate system defined with x, y, and z axes relative to the reference object/point (e.g., the earth).

In particular, the angular velocity input obtained from the gyroscope can be processed to determine angular positioning of the computing device. Initially, the input from the gyroscope may be filtered to remove a low pass constant offset of the gyroscope. Such a low pass constant offset may be created if the gyroscope is stuck in a non-zero position and is removed to prevent inaccuracy in the computation. The algorithm may integrate over multiple axes of the gyroscope (e.g., x, y, and z axes) to obtain a transform that describes a raw spatial position for the computing device. This processing may involve integrating angular velocity input from the gyroscope through a Runge-Kutta integration algorithm (or other suitable algorithm) to obtain corresponding impulse data. The impulse data may be expressed as quaternions for the different axes, which when multiplied together produce a quaternion that describes a transformation between the computing device 102 and the earth (or other selected reference object/point) with respect to their respective axes/coordinate systems. This provides one independent version of the raw spatial position for the computing device 102.

Another independent computation of the raw spatial position may be obtained using an accelerometer 216 and a magnetometer 218 in combination. Here, the accelerometer 216 is configured as a three axes accelerometer that may be employed to derive two of the degrees of freedom of the device (e.g., position with respect to the x-axis and y-axis). In the low pass, the vector of acceleration is approximately 1 g down pointing to the center of the earth. The components of acceleration measured via the accelerometer 216 may be obtained as distributed across each of the three axes. The components of acceleration can in turn be used to compute angles of the accelerometer/device axes with respect to the low pass vector that points to the center of the earth. This provides two of the three degrees of freedom with respect to tilt or orientation of the device. In particular, the accelerometer processing just described is used to resolve the tilt/orientation of the x-axis and y-axis of the computing device 102.

Now, the magnetometer 218 may be employed to resolve the remaining degree of freedom with respect to tilt/orientation of the device. The magnetometer 218 may be initialized/configured to act like a compass. In this approach, the magnetometer 218 can be used to compute a vector that is parallel to the ground (e.g., the earth's surface). This vector points to magnetic north and can be used to determine rotation of the device with respect to the z-axis. Now, the tilt/orientation of the x-axis and y-axis from the accelerometer and the rotation of the device with respect to the z-axis from the magnetometer 218 may be used to construct another quaternion that describes a transformation between the computing device 102 and the earth (or other selected reference object/point) with respect to their respective axes/coordinate systems. This provides another independent way in which a raw spatial position for the computing device 102 may be obtained. Other examples using different sensors and combination of sensors are contemplated. For example, a global positioning satellite (GPS) radio may be used to provide some positioning data that may be used alone or in combination with other kinds of sensor data to compute the position/orientation of the computing device 102.

Accordingly, at least two different results for the raw spatial position are computed using the foregoing example techniques or other suitable techniques. The sensor fusion algorithm may be further configured to combine multiple independent computations of raw spatial position in various ways. The combining generally involves interpolating between two or more raw spatial positions to reduce or eliminate inaccuracies and/or smooth the results. The interpolation produces a combined spatial position for the computing device that is based on two or more independently obtained raw spatial positions.

By way of example and not limitation, results obtained using a gyroscope may be more precise in the short term relative to other sensors and position determination techniques. However, small integration errors associated with the gyroscope computations may build up over time creating an increasingly larger offset that may result in inaccurate results in the long term. Thus, interpolating the gyroscope results with other independently obtained results can effectively adjust for expected integration errors in the gyroscope results. In one approach, a normalized linear interpolation is employed that may be biased towards the gyroscope results since these results are initially more precise and subject to less noise. Other independent results, such as the results from the accelerometer/magnetometer, may be included in the interpolation to keep the gyroscope results in check and slowly adjust the bias for the combined result away from the gyroscope results and towards the other results over time. This produces a mathematically smooth transformation as the combined result.

A spatial position for an accessory device connected to the host computing device is ascertained using one or more sensors of the accessory device (block 1106). The spatial position for the accessory device 104 may be computed in any suitable way, including but not limited to the techniques described in relation to the computing device 102. Accessory sensors 116 for different accessories may include any of the various types of sensors described herein. Accordingly, different corresponding techniques may be used to ascertain spatial position of the accessory based on appropriate input from one or more accessory sensors 116. Different techniques may also be employed for different accessories based on the types of sensors that are included with the accessory. In general, the sensor fusion module 206 may be configured to obtain input from different sensors of the accessory over a suitable interface with the accessory and compute a corresponding spatial position based on the input.

In one particular example, the sensor fusion module 206 may compute a spatial position using an accelerometer 216 associated with the accessory device 104. In this approach, the accelerometer 216 may be employed to resolve the tilt/orientation with respect to the x-axis and y-axis of the accessory device 104. This may occur in a manner that is comparable to the computation of the same kind of information for the computing device 102 using an associated accelerometer as described above.

In some arrangements, the accessory device 104 may be configured to connect to the computing device 102 using a connection portion 302 that is connectable to an interface of the computing device via a known location. For instance, in the hinge example previously described, at least some information regarding the position of the accessory device may be established based upon the known location and nature of the connection to the host device. Thus, it may be sufficient to use the two degrees of freedom (e.g., x-axis and y-axis position/pitch and roll) for the accessory device 104 in such cases to resolve the position of the accessory relative to the host. It should be noted though that rotation with respect the z-axis may also be computed for the accessory device 104 in some embodiments, using a magnetometer 218 as discussed previously or using other sensors and techniques. This may be employed in configurations in which an accessory may still be manipulated in three dimensions even when connected to a host device, such as by way of a ball and socket type connection.

An orientation of the accessory device relative to the host computing device is computed based on the combined spatial position for the host computing device and the ascertained spatial position for the accessory device (block 1108). The computed orientation may correspond to any of the different orientations discussed in relation to FIGS. 4-10 as wells as other possible orientations. Here, a comparison can be made between the combined spatial position for the computing device 102 and the ascertained spatial position of the accessory device 104 to derive information regarding the orientation of the device one to another. In particular, the combined spatial position indicates a transformation between how axes in a coordinate system for the computing device 102 are oriented relative to axes associated with a reference coordinate system for the earth or other reference. Similarly, the ascertained spatial position of the accessory device 104 indicates a transformation between how axes in a coordinate system for the accessory device are oriented relative to axes of the reference coordinate system. Accordingly, these two positions may be used to compute a transformation of the accessory device 104 relative to the computing device 102 that is independent of the reference coordinate system.

By way of example, in some cases, the orientation may be defined as an angle of the accessory device 104 with respect the computing device 102 as represented in FIG. 10. As also discussed previously, different angles may be associated with different interaction states, such as the closed state, typing state, and viewing state examples given above. The orientation may alternatively be expressed in another suitable manner, such as using x, y, z coordinates.

Optionally, the computed orientation may be verified using a Hall Effect sensor 220 of the computing device 102. The Hall Effect sensor 220 may be configured to utilize magnetic force to detect proximity between the computing device 102 and the accessory device 104. For example, the Hall Effect sensor 220 may measure proximity based upon one or more magnets that are included with the computing device 102 and/or the accessory device 104. When the computing device 102 is rotated to a closed position, the Hall Effect sensor 220 may be configured to align with and detect a magnet of the accessory device 104. When the computing device 102 is positioned away from the accessory device 104 in an open position, the Hall Effect sensor 220 may be unable to detect the magnet or the detected magnetic force may change as the computing device 102 is rotated at different angles relative to the accessory device 104. The Hall Effect sensor 220 provides another way in which the orientation may be determined. Thus, the Hall Effect sensor 220 may be used as an additional check on whether the orientation computed using other sensors is accurate. This additional check may be made before causing and/or controlling some kinds of behaviors, such as powering down the devices or switching off different components based on orientation.

One or more behaviors of the host computing device and accessory device are controlled based on the orientation that is computed (block 1110). Various behaviors and responsive actions may be driven based on a computed orientation of an accessory with respect to the host. The behavior module 210 may be configured to obtain orientation results from the sensor fusion module 208 and control various behaviors accordingly.

Controlling the behaviors may include at least power management operations for the computing device 102 and/or host device. Generally, power management operations are configured to control power consumption and prolong battery life. For example, the behavior module 210 may cause changes in power modes/states to occur based on particular orientations. This may include toggling the devices and/or selected components on/off according to a determined orientation. For example, in a closed state both the host and accessory may be powered down or placed into a sleep mode. In another example, the accessory may be powered down when the orientation corresponds to a viewing state. The accessory device 104 may also automatically wake-up in particular orientation, such as when a typing state is detected. A variety of other power management examples are also contemplated that may occur in response to a computed orientation.

In another example, controlling the behaviors may include selectively adjusting and/or enabling/disabling different sensors for the device according to the orientation. By way of example, rotation of the accessory fully around to cover the backside of the host may be indicative of a game play state. In this arrangement, it may be likely that an accelerometer 216 may be used for gameplay whereas use of touch functionality for keyboard/typing input from the accessory may be unlikely. According, in this arrangement sensitivity of an accelerometer 216 may be increased/turned-on and touch sensitivity may be decreased or disabled. In a typing state, the opposite may be true and the accelerometer 216 may be disabled or adjusted to less sensitivity and the touch sensitivity may be increased or re-enabled. Thus, sensitivity of sensors may be adjusted and particular sensors may be turned on/off based on orientation. It should be noted that sensors that are controlled may include sensors involved in computation of the orientation as well as other sensors of the host or accessory.

In yet another example, functionality that is activated for the accessory and/or host may be modified based on the orientation. For example, an accessory may be configured to act as game controller when wrapped around to the backside and transform to provide keyboard type inputs when in a typing orientation. In a further example, reading gestures to scroll or turn pages via the accessory may be enabled by input across the accessory device in a viewing orientation and may be disabled for other states/orientation. These kinds of changes in the functionality provided by an accessory may occur by selectively exposing, enabling, configuring or otherwise activating different controls, functions, and gestures according to different orientations.

Comparable changes to activate gestures, touch keys, and other functionality of the host computing device based on the orientation may also occur. For example, gestures for manipulation of media content on the display 110 may be active in some orientations (e.g., viewing state or gaming state) and deactivated in other scenarios. Some additional examples of modifications that may be made to functionality that is activated/available for the computing device based on orientation include selectively enabling/disabling network connections and/or controlling interactions of the host with accessory devices and/or peripheral devices (e.g., printers, streaming media devices, storage devices) based upon the computed orientation.

Additionally, behaviors of applications 112 may also be controlled based on a computed orientation. For example, the behavior module 210 may be configured to selectively activate or deactivate different applications 112 based on the orientation. This may include toggling between applications operating in foreground and background processes, launching and closing particular applications, minimizing/maximizing, and so forth. Applications 112 may also retrieve and/or subscribe to receive updates of computed orientation that the applications may make use of in various ways, some details of which are provided in relation to the following figure. Accordingly, a wide variety of behaviors may be controlled based on a computed orientation, of which the particular behaviors enumerated above are but as few illustrative examples.

Figure 12:
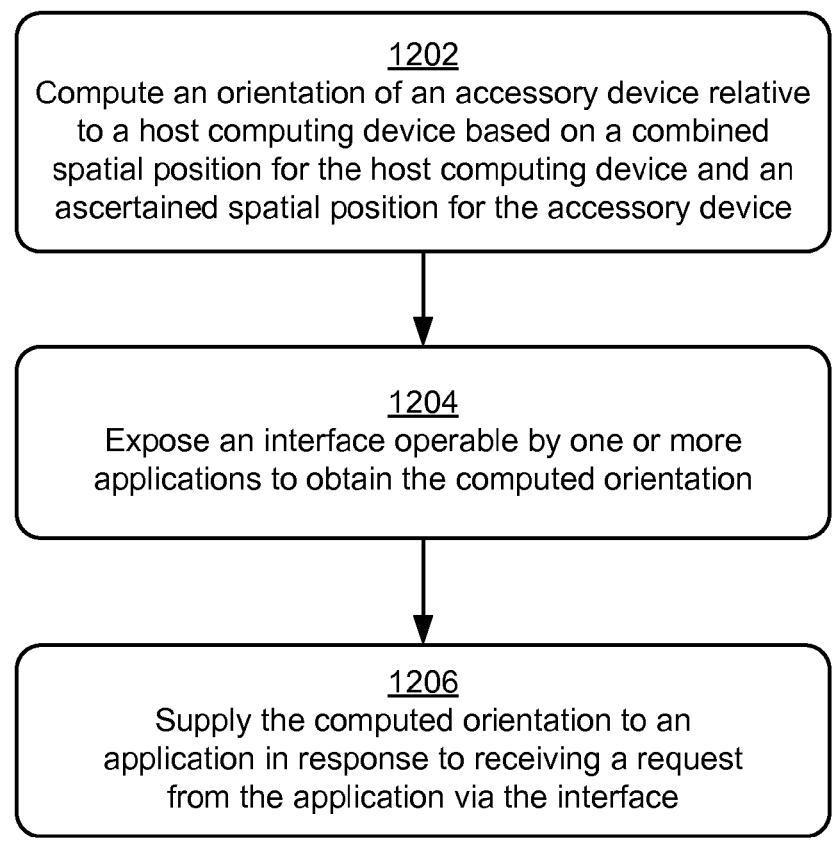
FIG. 12 is a flow diagram that describes an example procedure in accordance with one or more embodiments.

FIG. 12 depicts an example procedure 1200 in which a computed orientation is exposed for use by applications. In at least some embodiments, the procedure may be performed by a suitably configured computing device, such as the example computing device 102 of FIG. 2 that includes or otherwise make use of a sensor fusion application programming interface (API) 212.

An orientation of an accessory device relative to a host computing device is computed based on a combined spatial position for the host computing device and an ascertained spatial position for the accessory device (block 1202). This may occur in accordance with a designated sensor fusion algorithm as discussed in relation to the example procedure 1100 of FIG. 11 above.

An interface is exposed that is operable by one or more applications to obtain the computed orientation (block 1204). The computed orientation is supplied to an application in response to receiving a request from the application via the interface (block 1206). In particular, a computing device 102 may include a sensor fusion application programming interface (API) 212 that is operable to supply computed orientation information to applications 112. In one approach, the sensor fusion API may provide orientation information on demand responsive to individual requests. In addition or alternatively, the sensor fusion API may be configured to facilitate registration of applications 112 to subscribe to receive orientation updates. In response to a request to subscribe, the API may register an application with the sensor fusion module 208 and/or an associated notification system configured to supply notification messages to registered applications when orientation changes occur. The applications 112 may then receive notification messages sent via the notification system that describe updates to the orientation.

The sensor fusion API may supply the orientation and/or related information to application in various formats. For example, the orientation may be in the form of a transform of the accessory device 104 relative to the computing device 102 as computed in the manner described above. In this case, an application may process the supplied orientation information to obtain information in an appropriate format for the application, such as an orientation angle or a defined orientation state corresponding to the computed orientation. In addition or alternatively, the sensor fusion module 208 may operate to compute an orientation state on behalf of applications. Thus, information supplied via the sensor fusion API may include a state name or identifier that may be directly usable by the applications.

Applications 112 may make use of orientation information supplied through the API in various ways. For instance, an application 112 may selectively modify a user interface and/or functionality of the user interface for the application based on the orientation. This may include activating different controls, menus, gestures, and/or input modes for different respective orientations. For example, a navigation menu that appears in one orientation (typing/keyboard input orientation) may disappear in a viewing orientation. Further, an application 112 may be configured to include various modes and switch between the modes based on orientation. For example, a messaging application may switch from a text input mode to a video mode in accordance with the computed orientation. In another example, the application may modify the manner in which particular inputs are interpreted in different orientations. For instance, a button press in a typing orientation may be used for alphanumeric entry whereas the same button may be used for content control functions in a viewing orientation. Other buttons, keys, and other controls may also be selectively enabled or disabled as the orientation changes. A variety of other examples are also contemplated.

Having considered the foregoing example procedures, consider now a discussion of example systems and devices that may be employed to implement aspects of techniques in one or more embodiments.

Example System and Device

Figure 13:
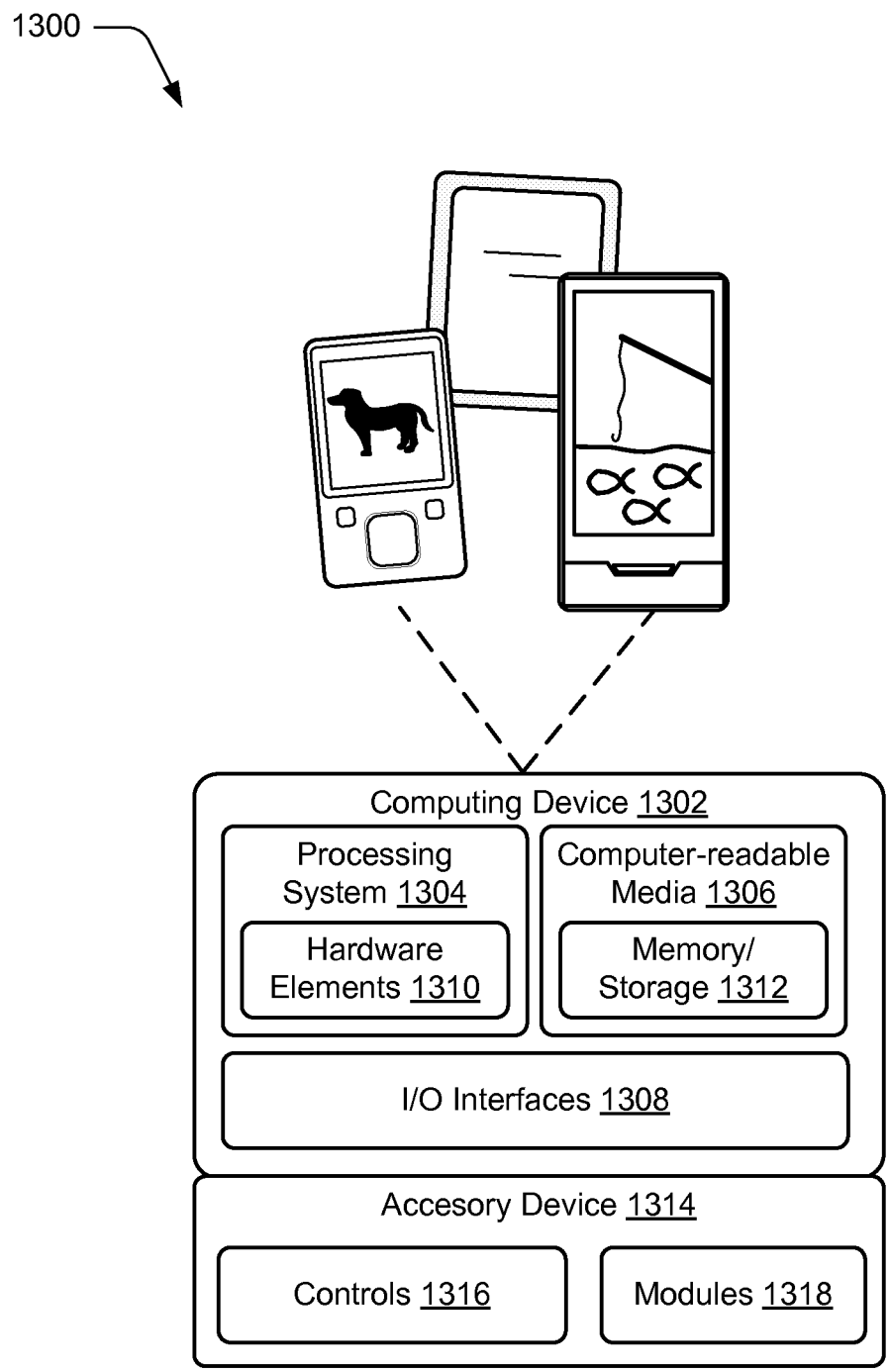
FIG. 13 illustrates an example system including various components of an example device that can be implemented as any type of computing device as described with reference to FIGS. 1-12 to implement embodiments of the techniques described herein.

FIG. 13 illustrates an example system generally at 1300 that includes an example computing device 1302 that is representative of one or more computing systems and/or devices that may implement the various techniques described herein. The computing device 1302 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 1302 as illustrated includes a processing system 1304, one or more computer-readable media 1306, and one or more I/O interface 1308 that are communicatively coupled, one to another. Although not shown, the computing device 1302 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1304 is representative of functionality to perform one or more operations using hardware. Accordingly, the processing system 1304 is illustrated as including hardware element 1310 that may be configured as processors, functional blocks, and so forth. This may include implementation in hardware as an application specific integrated circuit or other logic device formed using one or more semiconductors. The hardware elements 1310 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 1306 is illustrated as including memory/storage 1312. The memory/storage 1312 represents memory/storage capacity associated with one or more computer-readable media. The memory/storage component 1312 may include volatile media (such as random access memory (RAM)) and/or nonvolatile media (such as read only memory (ROM), Flash memory, optical disks, magnetic disks, and so forth). The memory/storage component 1312 may include fixed media (e.g., RAM, ROM, a fixed hard drive, and so on) as well as removable media (e.g., Flash memory, a removable hard drive, an optical disc, and so forth). The computer-readable media 1306 may be configured in a variety of other ways as further described below.

Input/output interface(s) 1308 are representative of functionality to allow a user to enter commands and information to computing device 1302, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1302 may be configured in a variety of ways to support user interaction.

The computing device 1302 is further illustrated as being communicatively and physically coupled to an accessory device 1314 that is physically and communicatively removable from the computing device 1302. In this way, a variety of different accessory devices may be coupled to the computing device 1302 having a wide variety of configurations to support a wide variety of functionality. In this example, the accessory device 1314 includes one or more controls 1316, which may be configured as press-sensitive keys, mechanically switched keys, buttons, and so forth.

The accessory device 1314 is further illustrated as including one or more modules 1318 that may be configured to support a variety of functionality. The one or more modules 1318, for instance, may be configured to process analog and/or digital signals received from the controls 1316 to determine whether an input was intended, determine whether an input is indicative of resting pressure, support authentication of the accessory device 1314 for operation with the computing device 1302, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 1302. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1302, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1310 and computer-readable media 1306 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, microcontroller devices, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1310. The computing device 1302 may be configured to implement particular instructions and/or functions corresponding to the software and/or hardware modules. Accordingly, implementation of a module that is executable by the computing device 1302 as software may be achieved at least partially in hardware, e.g., through use of computer-readable storage media and/or hardware elements 1310 of the processing system 1304. The instructions and/or functions may be executable/operable by one or more articles of manufacture (for example, one or more computing devices 1302 and/or processing systems 1304) to implement techniques, modules, and examples described herein.

Conclusion

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A method implemented by a computing device comprising:
    measuring, via one or more sensors, first spatial information indicative of a position of the computing device;
    receiving, via an interface of the computing device, second spatial information indicative of a position of an accessory device in communication with the computing device; and
    causing, by a controller in communication with the one or more sensors and the interface, modification of behaviors of the computing device based on the first spatial information and the second spatial information.

2. A method as recited in claim 1, wherein the one or more sensors comprise at least one of a gyroscope, an accelerometer, a magnetometer, or a hall effect sensor.

3. A method as recited in claim 2, wherein the one or more sensors comprise an array of multiple sensors used to provide multiple raw measurements that are combined to compute the first spatial information indicative of the position of the computing device.

4. A method as recited in claim 1, further comprising using a sensor fusion module to compute a relative orientation from the first spatial information and the second spatial information that describes a spatial relationship between the computing device and the accessory device.

5. A method as recited in claim 4, wherein the sensor fusion module is implemented via the controller.

6. A method as recited in claim 5, further comprising exposing information regarding the relative orientation for use by applications of the computing device via a sensor fusion application programming interface (API).

7. A method as recited in claim 1, further comprising directing by the controller a behavior module to perform operations to control one or more behaviors of the computing device based at least in part upon an orientation of the computing device relative to the accessory device.

8. A method as recited in claim 1, wherein the interface is configured to provide a communicative and physical connection between the accessory device and the computing device.

9. A method implemented by a first device comprising:
  receiving by an interface first spatial information indicative of a position of a first device and second spatial information indicative of a position of a second device; and
  controlling by a controller of the first device behaviors of the first device based on the first spatial data and the second spatial data.

10. A method as recited in claim 9, wherein the interface is configured to obtain the first spatial information and the second spatial information from multiple sensors associated with the first device and the second device.

11. A method as recited in claim 9, wherein the interface is configured as a flexible hinge that provides a communicative and physical connection between the first device and the second device.

12. A method as recited in claim 9, wherein the controller is further configured to control behaviors of the second device based on the first spatial information and the second spatial information.

13. A method as recited in claim 9, wherein controlling of the behaviors by the controller includes one or more of:
  managing power states;
  selecting operational modes or device states;
  adjusting sensitivity of one or more sensors associated the first device and the second device;
  controlling interaction between the first device and the second device;
  modifying device functionality;
  enabling and disabling network connections;
  activating and deactivating applications; or
  setting application states.

14. The method as recited in claim 9, further comprising computing by the controller a relative orientation of the first device relative to the second device based upon the first spatial information and the second spatial information.

15. A computing system comprising:
  a first device and a second device coupled via an interface of the computing system configured to enable interaction and communication between the first device and the second device;
  a controller implemented at least partially by hardware of the computing system configured to:
    obtain via the communication interface first spatial information indicative of a position of the first device and second spatial information indicative of a position of the second device; and
    aggregate the first spatial information and the second spatial information to:
      compute a relative orientation of the first device relative to the second device; and
      modify behaviors of the first device based on the relative orientation.

16. A computing system as recited in claim 15, further comprising an application programming interface (API) operable to expose information regarding the relative orientation that is computed for use by applications associated with the first device and the second device.

17. A computing system as recited in claim 15, wherein:
  the first spatial information and the second spatial information include multiple measurements of position obtained from sensors associated with the first device and the second device; and
  computation of the relative orientation by the controller comprises applying a sensor fusion algorithm to derive the relative orientation by combining the multiple measurements of position.

18. A computing system as recited in claim 15, wherein modification of the behaviors by the controller comprises at least one of:
  managing power states of the first device based on the relative orientation; o controlling interaction between the first device and the second device based the relative orientation;
  enabling or disabling network connections based on the relative orientation; or
  activating or deactivating applications based on the relative orientation.

19. A computing system as recited in claim 15, wherein the communication interface is configured to support wireless communication between the first device and the second device.

20. A computing system as recited in claim 15, further comprising an array of multiple sensors associated with the first device and the second device configured to collect the first spatial information and the second spatial information.

* * * * *